(12) United States Patent
Kurokawa et al.

(10) Patent No.: US 9,362,268 B2
(45) Date of Patent: Jun. 7, 2016

(54) SEMICONDUCTOR INTEGRATED CIRCUIT DEVICE WITH TRANSISTOR AND NON-TRANSISTOR REGIONS

(75) Inventors: Atsushi Kurokawa, Kanagawa (JP); Shinya Osakabe, Kanagawa (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 13/547,651

(22) Filed: Jul. 12, 2012

(65) Prior Publication Data

US 2013/0026541 A1 Jan. 31, 2013

(30) Foreign Application Priority Data

Jul. 25, 2011 (JP) ................. 2011-161733

(51) Int. Cl.
| | |
|---|---|
| *H01L 29/66* | (2006.01) |
| *H01L 27/06* | (2006.01) |
| *H01L 21/8252* | (2006.01) |
| *H01L 23/522* | (2006.01) |
| *H01L 27/082* | (2006.01) |
| *H01L 27/085* | (2006.01) |

(52) U.S. Cl.
CPC ........ *H01L 27/0629* (2013.01); *H01L 21/8252* (2013.01); *H01L 23/5223* (2013.01); *H01L 27/0605* (2013.01); *H01L 27/085* (2013.01); *H01L 27/0823* (2013.01); *H01L 2924/0002* (2013.01)

(58) Field of Classification Search
CPC . H01L 27/06; H01L 27/0605; H01L 27/0629; H01L 27/0635; H01L 2924/19041; H01L 23/642; H01L 23/5223; H01L 27/085
USPC ......................................... 257/195
See application file for complete search history.

(56) References Cited

U.S. PATENT DOCUMENTS

| | | | | | |
|---|---|---|---|---|---|
| 4,528,061 | A | * | 7/1985 | Miyazawa | .............. C30B 27/02 117/17 |
| 4,577,213 | A | * | 3/1986 | Bauhahn | ............. H01L 23/4822 257/277 |
| H000368 | H | * | 11/1987 | Yoder | ................. H01L 21/2654 148/DIG. 23 |
| 4,785,202 | A | * | 11/1988 | Toyoda | ........................ 326/101 |
| 4,876,211 | A | * | 10/1989 | Kanber | ................... H01L 29/93 257/595 |
| 5,162,258 | A | * | 11/1992 | Lemnios | ............... H01L 27/118 257/296 |
| 5,378,939 | A | * | 1/1995 | Marsland | ............... H03H 7/325 257/E27.012 |
| 5,405,797 | A | * | 4/1995 | Brugger | .............. H01L 27/0605 257/E21.697 |
| 5,552,335 | A | * | 9/1996 | Mahon et al. | ................... 438/50 |
| 5,898,200 | A | * | 4/1999 | Sugiyama | ......... H01L 21/76895 257/330 |

(Continued)

FOREIGN PATENT DOCUMENTS

| | | |
|---|---|---|
| JP | 05-235045 A | 9/1993 |
| JP | 11-150426 A | 6/1999 |
| JP | 2006-15914 A | 6/2005 |

*Primary Examiner* — Jay C Kim
(74) *Attorney, Agent, or Firm* — Mattingly & Malur, PC

(57) ABSTRACT

In a high-frequency circuit, it is necessary to provide galvanic blocking between active elements such as transistors and between an active element and an external terminal, and thus MIM capacitors or the like are used frequently. A MIM capacitor coupled to an external terminal is easily affected by static electricity from outside and causes a problem of electro-static breakdown or the like. In a MIM capacitor formed over a semi-insulating compound semiconductor substrate, a first electrode thereof is coupled to an external pad and to the semi-insulating compound semiconductor substrate, and a second electrode thereof is coupled to the semi-insulating compound semiconductor substrate.

11 Claims, 38 Drawing Sheets

(56) References Cited

U.S. PATENT DOCUMENTS

| | | | |
|---|---|---|---|
| 6,403,991 B1* | 6/2002 | Kurokawa | H01L 21/8252 257/197 |
| 6,420,775 B1* | 7/2002 | Asai | H01L 29/32 257/609 |
| 6,455,880 B1* | 9/2002 | Ono et al. | 257/275 |
| 6,461,927 B1* | 10/2002 | Mochizuki | H01L 21/8252 257/E21.697 |
| 6,696,711 B2* | 2/2004 | Mochizuki | H01L 21/8252 257/197 |
| 6,774,448 B1* | 8/2004 | Lindemann | H01L 27/1463 257/438 |
| 6,896,729 B2* | 5/2005 | Liu | C30B 11/00 117/223 |
| 7,312,482 B2* | 12/2007 | Nakajima et al. | 257/159 |
| 7,498,616 B2* | 3/2009 | Asano | H01L 27/0605 257/187 |
| 7,701,032 B2* | 4/2010 | Asano | H01L 27/0605 257/280 |
| 7,968,362 B2* | 6/2011 | Takahashi | B82Y 20/00 118/630 |
| 8,030,691 B2* | 10/2011 | Kawasaki | 257/277 |
| 8,587,094 B2* | 11/2013 | Kawasaki | H01L 21/8252 257/482 |
| 2006/0076585 A1* | 4/2006 | Kato | H01L 27/0605 257/280 |
| 2006/0158257 A1* | 7/2006 | Fujimoto | H03F 1/30 330/299 |
| 2006/0273396 A1* | 12/2006 | Anda | H01L 21/7605 257/350 |
| 2007/0278523 A1* | 12/2007 | Lin | H01L 21/8252 257/194 |
| 2013/0277680 A1* | 10/2013 | Green | H01L 29/402 257/76 |

* cited by examiner

SEMICONDUCTOR INTEGRATED CIRCUIT DEVICE WITH TRANSISTOR AND NON-TRANSISTOR REGIONS

CROSS-REFERENCE TO RELATED APPLICATION

The disclosure of Japanese Patent Application No. 2011-161733 filed on Jul. 25, 2011 including the specification, drawings and abstract is incorporated herein by reference in its entirety.

BACKGROUND

The present invention relates to a technique which is applied effectively to a prevention technique of electrostatic breakdown in semiconductor integrated circuit devices (or semiconductor devices).

Japanese Patent Laid-Open No. 2006-156914 (Patent document 1) discloses a HEMT (High Electron Mobility Transistor) in which a gate electrode and the like are formed over the surface of a portion which is formed into a high resistance region by doping of iron or the like into a III-V group compound semiconductor stacked structure such as AlGaN.

Japanese Patent Laid-Open No. 1993-235045 (Patent document 2) discloses the following technique. That is, the dielectric strength voltage of a semi-insulating region which is formed by doping boron or hydrogen into an n-type GaAs layer through ion implantation tends to be lower than the dielectric strength voltage of the n-type GaAs layer itself. Hence, a silicon-oxide based insulating film lies between this semi-insulating region and a gate electrode of a field effect transistor thereover.

Japanese Patent Laid-open No. 1999-150426 (Patent document 3) discloses a technique of coupling one electrode of an MIM (Metal-Insulator-Metal) capacitor, which is coupled to an external terminal of a microwave IC (Integrated Circuit) and has a low electrostatic breakdown resistance, to a source or drain of a transistor via a route having a low resistance for DC current and a high impedance for high-frequency.

SUMMARY

In a high-frequency circuit, it is necessary to block galvanically between active elements such as transistors and between an active element and an external terminal, and thus MIM capacitors or the like are used frequently. Among these MIM capacitors, one coupled to the external terminal is easily affected by static electricity from outside, which easily causes a problem of electro-static breakdown or the like. Note that the external terminal here includes not only an external terminal in a final product but also a temporary external terminal during a manufacturing process. This is because it is also necessary to consider electrostatic breakdown during an assembly process.

The present invention has been achieved for solving these problems.

An object of the present invention is to provide a semiconductor integrated circuit device having a high reliability.

The above and other objects and novel features of the present invention will become clear from the description of the present specification and the accompanying drawings.

The following will briefly explain the outline of a representative invention among the inventions disclosed in the present application.

That is, one invention in the present application is a semiconductor integrated circuit device formed over a semi-insulating compound semiconductor substrate, in which a first electrode of an MIM capacitor electrically coupled to an external pad is electrically coupled to the semi-insulating compound semiconductor substrate, and on the other side, a second electrode of the MIM capacitor is electrically coupled to the semi-insulating compound semiconductor substrate.

The following will briefly explain an effect obtained by a representative invention among the inventions disclosed in the present application.

That is, in a semiconductor integrated circuit device formed over a semi-insulating compound semiconductor substrate, a first electrode of an MIM capacitor electrically coupled to an external pad is electrically coupled to the semi-insulating compound semiconductor substrate, and, on the other side, a second electrode of the MIM capacitor is electrically coupled to the semi-insulating compound semiconductor substrate, and thereby it is possible to disperse undesirable electric charges from outside quickly into the substrate.

DETAILED DESCRIPTION

Outline of Embodiments

Figure 1:
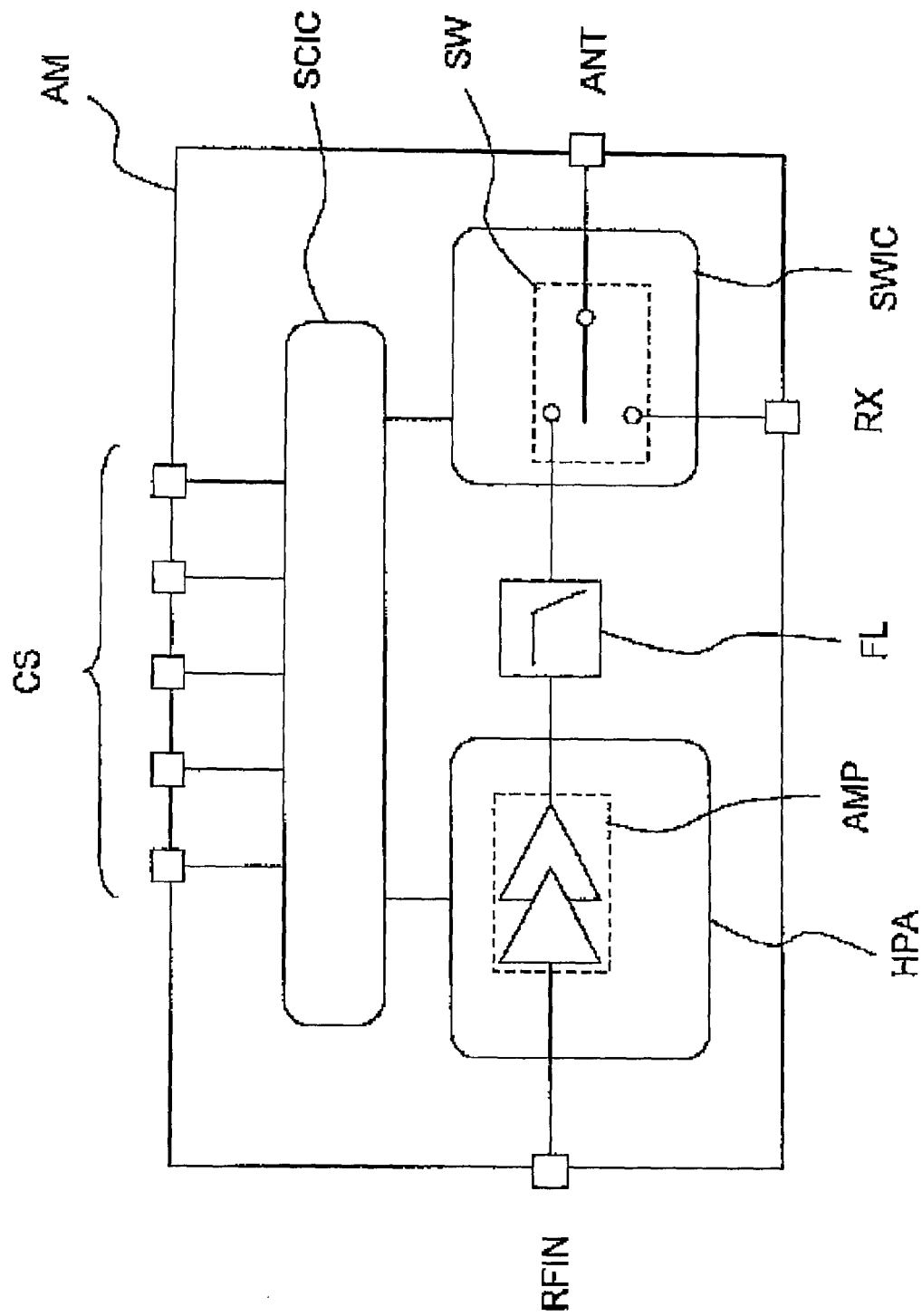
FIG. 1 is a schematic circuit diagram for explaining the outline of a high-frequency antenna module which is one of the application targets of the present application.

First, the following explains briefly the outline of a typical embodiment of the inventions disclosed in the present application.

1. A semiconductor integrated circuit device including the following: (a) a semi-insulating compound semiconductor substrate having a first major surface; (b) a transistor region and a non-transistor region provided over the first major surface of the semi-insulating compound semiconductor substrate; (c) a first conductive epitaxial compound semiconductor film provided over the first major surface of the semi-insulating compound semiconductor substrate within the transistor region; (d) a first insulating film provided over the semi-insulating compound semiconductor substrate within the non-transistor region; (e) an external electrode pad provided in an upper layer of the first insulating film within the non-transistor region; (f) a first metal substrate contact portion electrically coupled to the external electrode pad and the semi-insulating compound semiconductor substrate within the non-transistor region; and (g) an MIM capacitor provided in the non-transistor region and having a first capacitor electrode and a second capacitor electrode, in which (1) the first capacitor electrode is electrically coupled to the external electrode pad within the non-transistor region, and (2) the second capacitor electrode is electrically coupled to the semi-insulating compound semiconductor substrate within the non-transistor region.

2. The semiconductor integrated circuit device of above item 1 further including the following: (h) a semi-insulating surface layer provided within the non-transistor region over the first major surface of the semi-insulating compound semiconductor substrate in a layer lower than the first insulating film, and having a resistivity lower than the semi-insulating compound semiconductor substrate.

3. In the semiconductor integrated circuit device of above item 2, the first metal substrate contact portion or the second capacitor electrode is electrically coupled to the semi-insulating compound semiconductor substrate via the semi-insulating surface layer.

4. In the semiconductor integrated circuit device of above item 2, the first metal substrate contact portion or the second capacitor electrode is electrically coupled to the semi-insulating compound semiconductor substrate via a second conductive epitaxial compound semiconductor film provided over the first major surface of the semi-insulating compound semiconductor substrate.

5. In the semiconductor integrated circuit device of above item 1, the first metal substrate contact portion or the second capacitor electrode is electrically coupled to the semi-insulating compound semiconductor substrate without intermediation of a semi-conductive film or a conductive film.

6. In the semiconductor integrated circuit device of any one of above item 1 to item 5, the second capacitor electrode is provided in an upper layer of the first insulating film.

7. In the semiconductor integrated circuit device of any one of above item 1 to item 6, the first metal substrate contact portion is provided directly under the external electrode pad.

8. In the semiconductor integrated circuit device of any one of above item 1 to item 7, the second capacitor electrode is a lower electrode of the MIM capacitor.

9. In the semiconductor integrated circuit device of any one of above item 1 to item 7, the first capacitor electrode is a lower electrode of the MIM capacitor.

10. In the semiconductor integrated circuit device of any one of above item 1 to item 9, the second capacitor electrode is electrically coupled to a collector terminal or a base terminal of an HBT.

11. In the semiconductor integrated circuit device of any one of above item 1 to item 9, the second capacitor electrode is electrically coupled to a source or drain terminal of a HEMT.

12. In the semiconductor integrated circuit device of anyone of above item 2 to item 11, each of the semi-insulating compound semiconductor substrate and the semi-insulating surface layer mainly includes a GaAs-based member.

13. A semiconductor integrated circuit device including the following: (a) a semi-insulating compound semiconductor substrate having a first major surface; (b) a transistor region and a non-transistor region provided over the first major surface of the semi-insulating compound semiconductor substrate; (c) first conductive compound semiconductor layer provided over the first major surface of the semi-insulating compound semiconductor substrate within the transistor region; (d) a first insulating film provided over the semi-insulating compound semiconductor substrate within the non-transistor region; (e) an external electrode pad provided in an upper layer of the first insulating film within the non-transistor region; (f) a first metal substrate contact portion electrically coupled to the external electrode pad and the semi-insulating compound semiconductor substrate within the non-transistor region; and (g) an MIM capacitor provided in the non-transistor region and having a first capacitor electrode and a second capacitor electrode, in which (1) the first capacitor electrode is electrically coupled to the external electrode pad within the non-transistor region, and (2) the second capacitor electrode is electrically coupled to the semi-insulating compound semiconductor substrate within the non-transistor region.

14. The semiconductor integrated circuit device of above item 13 further including the following: (h) a semi-insulating surface layer provided within the non-transistor region over the first major surface of the semi-insulating compound semiconductor substrate in a layer lower than the first insulating film, and having a resistivity lower than the semi-insulating compound semiconductor substrate.

15. In the semiconductor integrated circuit device of above item 14, the first metal substrate contact portion or the second capacitor electrode is electrically coupled to the semi-insulating compound semiconductor substrate via the semi-insulating surface layer.

16. In the semiconductor integrated circuit device of above item 14, the first metal substrate contact portion or the second capacitor electrode is electrically coupled to the semi-insulating compound semiconductor substrate via a second conductive compound semiconductor film provided over the first major surface of the semi-insulating compound semiconductor substrate.

17. In the semiconductor integrated circuit device of above item 13, the first metal substrate contact portion or the second capacitor electrode is electrically coupled to the semi-insulating compound semiconductor substrate without intermediation of a semi-conductive film or a conductive film.

18. In the semiconductor integrated circuit device of any one of above item 13 to item 17, the second capacitor electrode is provided in an upper layer of the first insulating film.

19. In the semiconductor integrated circuit device of anyone of above item 13 to item 18, the first metal substrate contact portion is provided directly under the external electrode pad.

20. In the semiconductor integrated circuit device of any one of above item 13 to item 19, the second capacitor electrode is a lower electrode of the MIM capacitor.

21. In the semiconductor integrated circuit device of any one of above item 13 to item 19, the first capacitor electrode is a lower electrode of the MIM capacitor.

22. In the semiconductor integrated circuit device of any one of above item 13 to item 21, the second capacitor electrode is electrically coupled to a collector terminal or a base terminal of an HBT.

23. In the semiconductor integrated circuit device of any one of above item 13 to item 21, the second capacitor electrode is electrically coupled to a source or drain terminal of a HEMT.

24. In the semiconductor integrated circuit device of any one of above item 14 to item 23, each of the semi-insulating compound semiconductor substrate and the semi-insulating surface layer mainly includes a GaAs-based member.

[Explanation of the description form and the basic terms and usage thereof in the present application] 1. In the present application, while the description of an embodiment is sometimes divided into plural sections as needed for convenience, these sections are not independent or different from one another but respective parts of one example, and one is details for a part of another one, a variation example for a part of or the whole of another one, or the like, except for the case that this is specified clearly not to be true in particular. Further, repetition of the same part will be omitted in principle. Further, each element in an embodiment is not indispensable except the case that this is specified clearly not to be true in particular, the case that the number of the elements is limited to the number theoretically, and the case that this is not true clearly from a context.

Further, in the present application, the expression of "semiconductor device" or "semiconductor integrated circuit device" mainly means a device in which active elements such as various kinds of transistor and diode and the like are integrated together with passive elements such as a resistor, capacitor, and the like around the active elements on a semiconductor chip or the like (semi-insulating GaAs-based substrate, semi-insulating InP-based substrate, and single crystal silicon substrate, for example). Further, an element packaging a semiconductor chip and a passive element or plural chips (including an encapsulated chip), and also an element packaging passive elements in a lump as needed, such as a SIP (System-in-Package), an MCM (Multi-Chip Module) and the like, are included in "semiconductor device" or "semiconductor integrated circuit device".

Here, as a representative one of the various kinds of transistor, it is possible to illustrate a MISFET (Metal Insulator Semiconductor Field Effect Transistor) represented by a MOSFET (Metal Oxide Semiconductor Field Effect Transistor) for a silicon-based device. In this case, as a representative one of integrated circuit configurations, it is possible to illustrate a CMIS (Complementary Metal Insulator Semiconductor) type integrated circuit represented by a CMOS (Complementary Metal Oxide Semiconductor) type integrated circuit which combines an N-channel type MISFET and a P-channel type MISFET.

Meanwhile, the transistors explained in the present application are an HBT (Hetero-junction Bipolar Transistor) and a HEMT (High Electron Mobility Transistor) or a MODFET (Modulation-Doped Field Effect Transistor) which is a kind of a MESFET (Metal-Semiconductor Field Effect Transistor).

2. Similarly in the description of an embodiment and the like, for material, composition, and the like, even the expression of "X configured with A" does not exclude one having an element except A as a major element, except for the case that this is clearly specified not to be true in particular and the case that this is not true clearly from a context. For example, for the composition, the above expression means "X containing A as a major component", or the like. For example, even in the expression of "silicon member" or the like, the member is not limited to pure silicon, and obviously also includes a multi-element alloy containing a SiGe alloy or another silicon as a major component, and a member containing another additive and the like. Similarly, even the expression of "silicon-oxide", "silicon-oxide based insulating film" and the like obviously includes not only comparatively-pure un-doped silicon dioxide, but also a thermal oxidation film and a CVD oxidation film such as films of FSG (Fluorosilicate Glass), TEOS-based silicon-oxide, SiOC (Silicon Oxicarbide), carbon-doped silicon-oxide, OSG (Organosilicate Glass), PSG (Phosphorus Silicate Glass, and BPSG (Brorophosphosilicate Glass), a coating-based silicon-oxide film such as films of SOG (Spin On Glass) and NCS (Nano-Clustering Silica), a silica-based Low-k insulating film in which vacant holes are introduced into a member similar to the above films (porous-based insulating film), a composite film which combines another silicon-based insulating film including the above film as a major element, and the like.

Further, as well as the silicon-oxide based insulating film, a silicon nitride based insulating film is employed as a silicon-based insulating film normally used in the semiconductor field. Materials included in this series are SiN, SiCN, SiNH, SiCNH, and the like. Here, the expression of "silicon nitride" includes both of SiN and SiNH except for the case that this is specified clearly not to be true in particular. Similarly, the expression of "SiCN" includes both of SiCN and SiCNH except for the case that this is specified clearly not to be true in particular.

Note that, while SiC and SiN have properties similar to each other, SiON is more frequently to be classified as a silicon-oxide based insulating film.

The silicon nitride film is frequently used as an etching stop film, that is, a CESL (Contact Etch-stop Layer) in a SAC (Self-Aligned Contact) technique and also used as a stress providing film in an SMT (Stress Memorization Technique).

In the present application, there is a case in which tungsten silicide (WSi) or the like is used as an electrode material. Such silcide is assumed to include not only silicide corresponding to stoichiometry but also non-stoichiometric silicide. Further, while the tungsten silicide will be mainly explained specifically in the following, obviously the other silicide such as titanium silicide, nickel silicide, cobalt silicide, and platinum silicide can be applied as needed.

In this case, the expression of "nickel silicide", for example, while normally indicating nickel mono-silicide, includes not only comparatively pure nickel mono-silicide but also an alloy, a mixed crystal, and the like, each of which has a major component of nickel mono-silicide. Further, the silicide is not limited to the nickel silicide but may be cobalt silicide, titanium silicide, tungsten silicide or the like, which have been actually used conventionally. Further, for a metal film for siliciding, it is possible to use, other than a Ni (nickel) film, a nickel alloy film such as a Ni—Pt alloy film (alloy film of Ni and Pt), a Ni—V alloy film (alloy film of Ni and V), a Ni—Pd alloy film (alloy film of Ni and Pd), a Ni—Yb alloy film (alloy film of Ni and Yb), and a Ni—Er alloy film (alloy film of Ni and Er), for example. Note that such silicide having a major metal element of nickel is collectively called "nickel-based silicide" or the like 3. Similarly, while preferable illustration will be provided for a shape, a position, an attribute, and the like, obviously these are not strictly limited to the illustration, except for the case that this is specified clearly not to be true in particular and the case that this is not true clearly from a context.

4. Further, when a specific numerical value and numerical amount is described, the numerical value may be larger than the specific numerical value or smaller than the specific numerical value, except for the case that this is specified clearly not to be true in particular, the case that the numerical value is limited to the specific number theoretically, and the case that this is not true clearly from a context.

5. The expression of "wafer", while normally indicating a single crystal wafer, a semi-insulating GaAs-based wafer, or a semi-insulating InP-based wafer, over which a semiconductor integrated circuit device (also, semiconductor device and electronic device) is formed, obviously includes a composite wafer of an insulating substrate, a semiconductor layer, and the like such as an epitaxial wafer, an SOI substrate, and an LCD glass substrate.

6. In the present application, "electrically coupled" includes not only ohmic coupling but also coupling via a PN junction and Schottky coupling. Further, the description includes coupling via a semi-insulating thin film for coupling to a semi-insulating substrate. However, the description does not include coupling via a semi-insulating thin film or a semi-insulating substrate for coupling to a substrate except a semi-insulating substrate.

[Details of an embodiment] An embodiment will be explained further in detail. In each of the drawings, the same or a similar portion is indicated by the same or a similar symbol or reference numeral, and explanation will not be repeated in principle.

Further, in the accompanying drawings, when complication is invited adversely or when discrimination from a vacant gap is clear, hatching or the like is sometimes omitted even from a cross section. In this respect, when it is clear from explanation or the like, an outline of a background is sometimes omitted even from a closed hole in a planar view. Moreover, hatching is sometimes provided even to a portion which is not a cross section, for clearly showing that the portion is not a vacant gap.

Note that prior patent applications disclosing an MIM capacitor and an HBT (Hetero-junction Bipolar Transistor) include Japanese Patent Laid Open No. 2004-296567 (or corresponding US Patent Publication No. 7214558), Japanese Patent Laid-Open No. 2006-147911 (or corresponding US Patent Application Publication No. 2006-108665), Japanese Patent Laid-Open No. 2007-103977, Japanese Patent Laud-Open No. 2008-227116 (or corresponding US Patent Publication No. 7723753, and the like.

1. Outline explanation of a high-frequency antenna module which is one of the major application targets for the present application (mainly FIG. 1) While the following embodiment will be specifically explained here for an example of a mobile phone antenna module (high-frequency module, front-end module, or power module), for example, obviously the following embodiment can be applied broadly to a circuit treating a high frequency higher than approximately 100 MHz. In the mobile phone and the like, normally a high-frequency band in a range approximately from 800 MHz to 2,200 MHz is mainly utilized.

FIG. 1 is a schematic circuit diagram for explaining an outline of a high-frequency antenna module which is one of the major application targets for the present application. According to this circuit diagram, the outline of the high-frequency antenna module which is one of the main application targets for the present application will be explained.

As shown in FIG. 1, the antenna module (AM) is an MCM including plural chips, and configured with a compound semiconductor based antenna switch chip (SWIC) and high-frequency power amplifier chip (HPA), for example, a silicon based control chip (SCIC), for example, and the like. The control chip (SCIC) is controlled by plural control signals (CS) from outside, and thereby controls the antenna switch chip (SWIC) and the high-frequency power amplifier chip (HPA). For example, an input signal from an antenna terminal (ANT) is transmitted to a receiving system output terminal (RX) via an antenna switch (SW). Meanwhile, a transmission high-frequency signal supplied from a high-frequency input terminal (RFIN), which is amplified by an amplifier circuit (AMP) and then from which high-frequency noise is removed by a low pass filter (FL), is transmitted to the antenna terminal (ANT) via the antenna switch (SW).

2. Outline explanation of the antenna switch configuring the high-frequency antenna module (mainly FIG. 2 and FIG. 3) The antenna switch chip (SWIC) configuring the antenna module (AM) explained in section 1 will be explained further.

Figure 2:
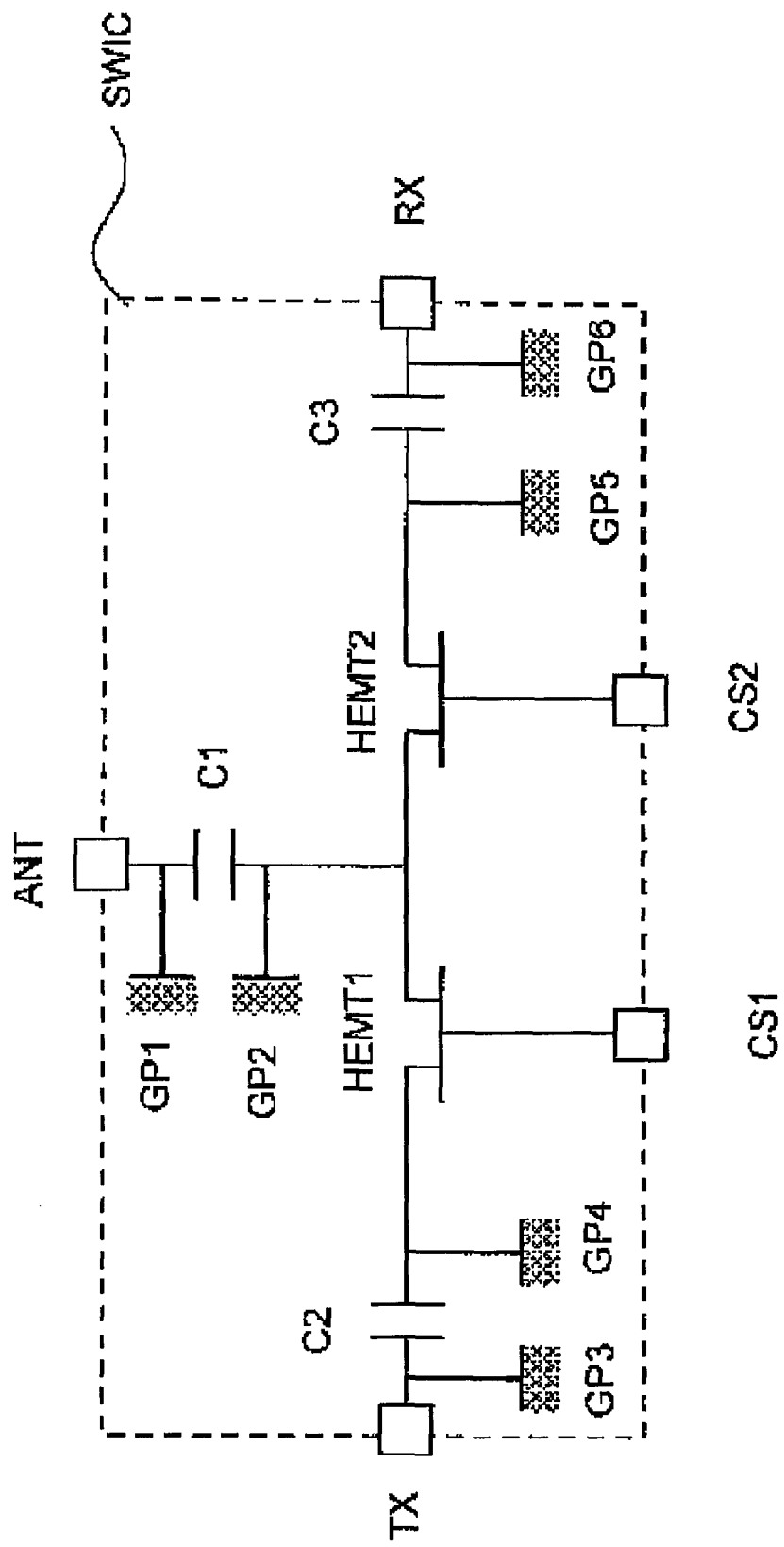
FIG. 2 is a circuit diagram of an antenna switch in FIG. 1.
Figure 3:
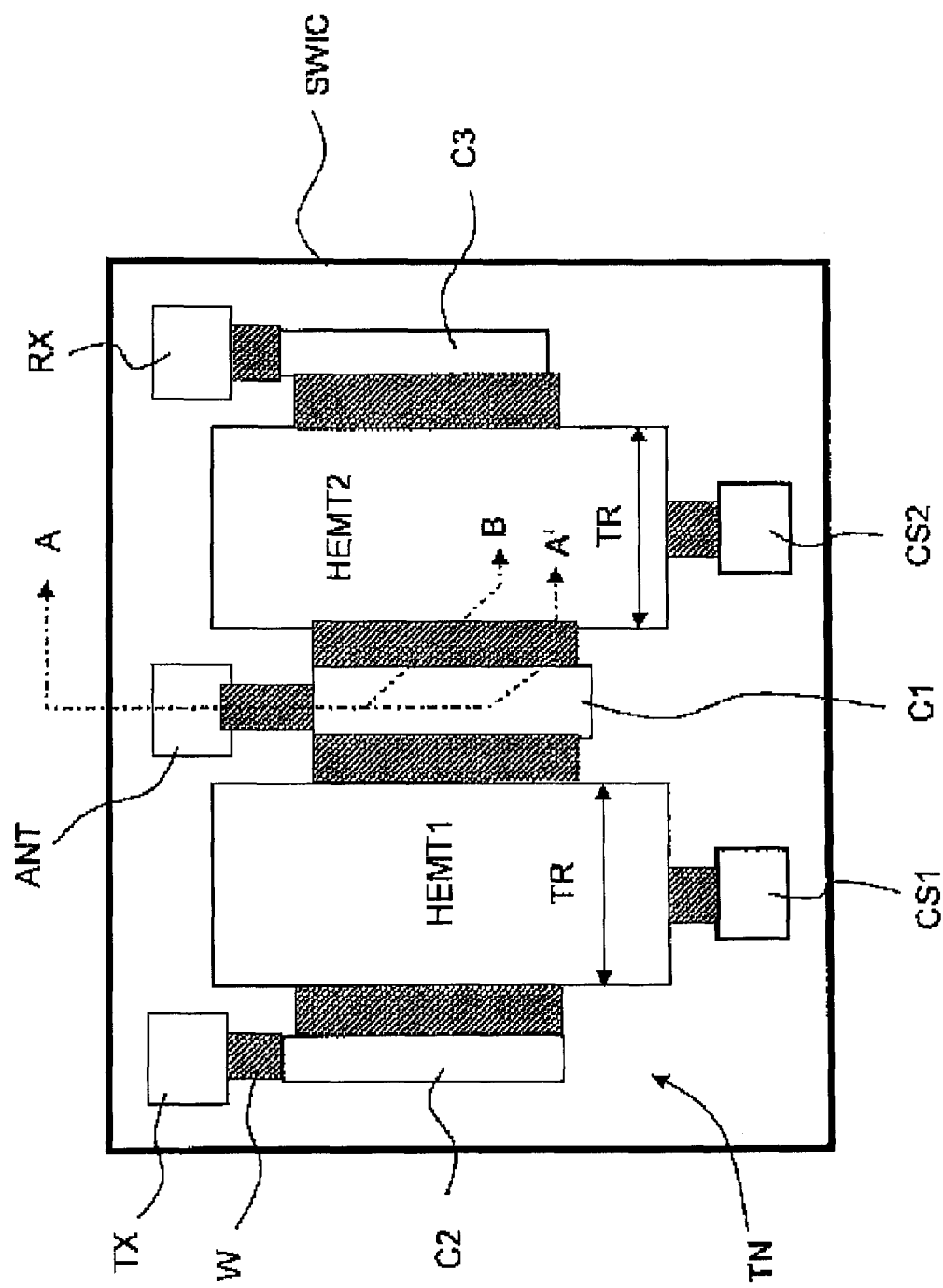
FIG. 3 is a schematic top view of a semiconductor chip for the antenna switch in FIG. 2.

FIG. 2 is a circuit diagram of the antenna switch of FIG. 1. FIG. 3 is a schematic top view of the semiconductor chip for antenna switch of FIG. 2. Note that these circuit diagrams and the like are shown being simplified by the omission of a portion unnecessary for explanation (same in section 3). According to these drawings, the outline of the antenna switch configuring the high-frequency antenna module will be explained.

As shown in FIG. 2, the antenna switch chip (SWIC) is configured with FET switches such as HEMT elements (HEMT1, HEMT2), for example, and DC blocking capacitors such as MIM capacitors (C1, C2, and C3), and both electrodes in the blocking capacitors (C1, C2, and C3) are coupled to pseudo ground portions to be explained later (GP1, GP2, GP3, GP4, GP5, and GP6).

The FET switches (HEMT1 and HEMT2) are controlled by control terminals (CS1 and CS2) from the control chip (SCIC), and the receiving signal (high-frequency signal) from the antenna terminal (ANT) passes through the DC blocking capacitor (C1) and is transmitted to the receiving system output terminal (RX) via the ON-state FET switch (HEMT2) and the DC blocking capacitor (C3). Meanwhile, the transmission high-frequency signal supplied from the high-frequency input terminal (RFIN) passes through the DC blocking capacitor (C2) and is transmitted to the antenna terminal (ANT) via the ON-state FET switch (HEMT1) and the DC blocking capacitor (C1).

Next, according to FIG. 3, an example of an upper surface structure in the antenna switch chip (SWIC) will be explained. As shown in FIG. 3, external pads (ANT, TX, RX, CS1, and CS2) are disposed in the peripheral portion of the antenna switch chip (SWIC), and the HEMT elements (HEMT1 and HEMT2) are disposed in the center portion. The DC blocking capacitors (C1, C2, and C3) are disposed between the external pads (ANT, TX, RX, CS1, and CS2) and the HEMT elements (HEMT1 and HEMT2). These terminals and elements and the like are coupled to each other by metal wirings (W) or the like in each layer. Here, a region where the HEMT elements (HEMT1 and HEMT2) are disposed is a transistor region TR and the other region is a non-transistor region TN.

3. Outline explanation of the high-frequency power amplifier configuring the high-frequency antenna module (mainly FIG. 4 and FIG. 5) The high-frequency power amplifier chip (HPA) configuring the antenna module (AM) explained in section 1 will be explained further. While a three-stage amplifier circuit or the like is frequently used normally for a high-frequency power amplifier chip for the mobile phone, here, a two-stage amplifier circuit will be explained for avoiding complexity.

Figure 4:
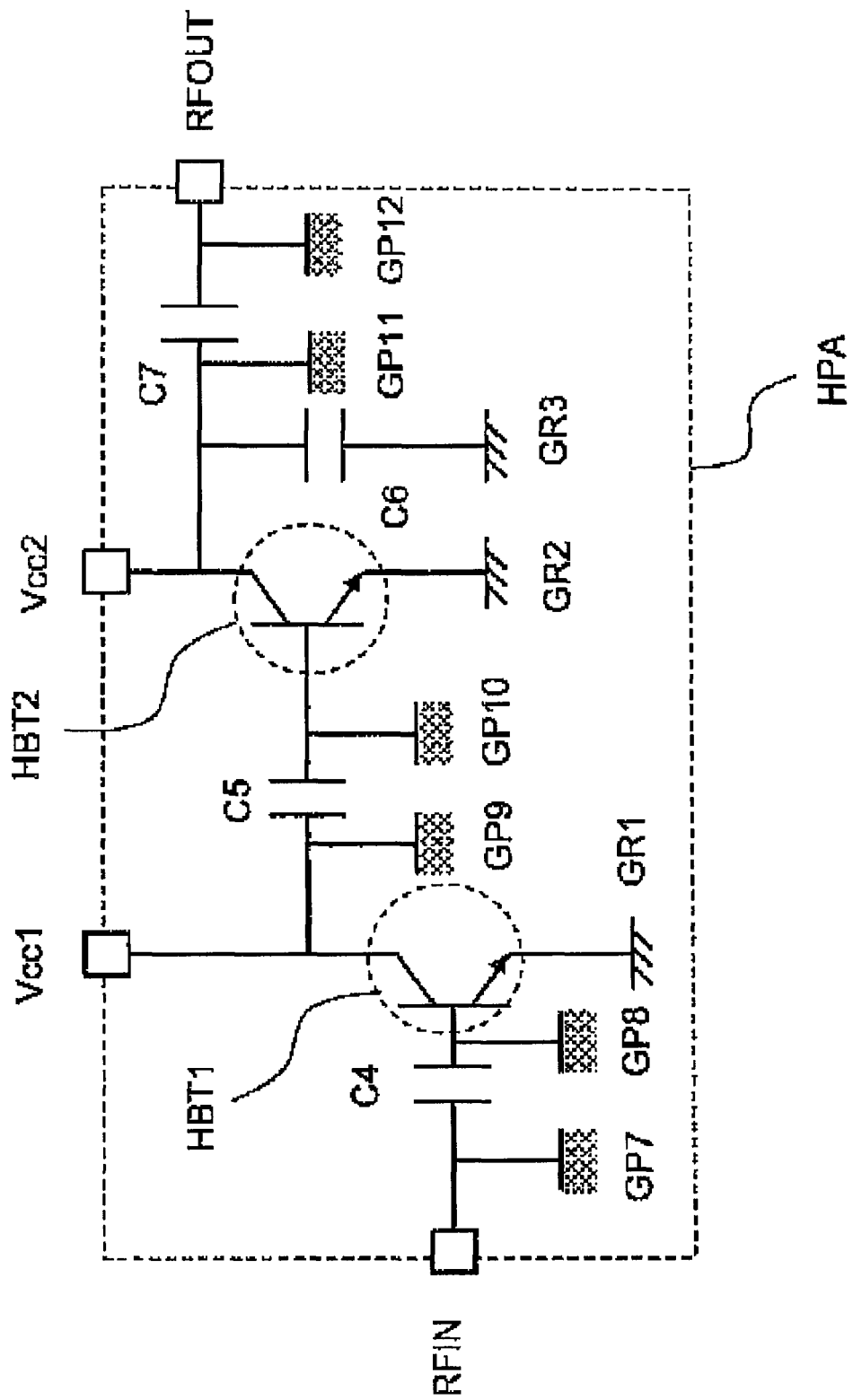
FIG. 4 is a circuit diagram of a high-frequency power amplifier in FIG. 1.
Figure 5:
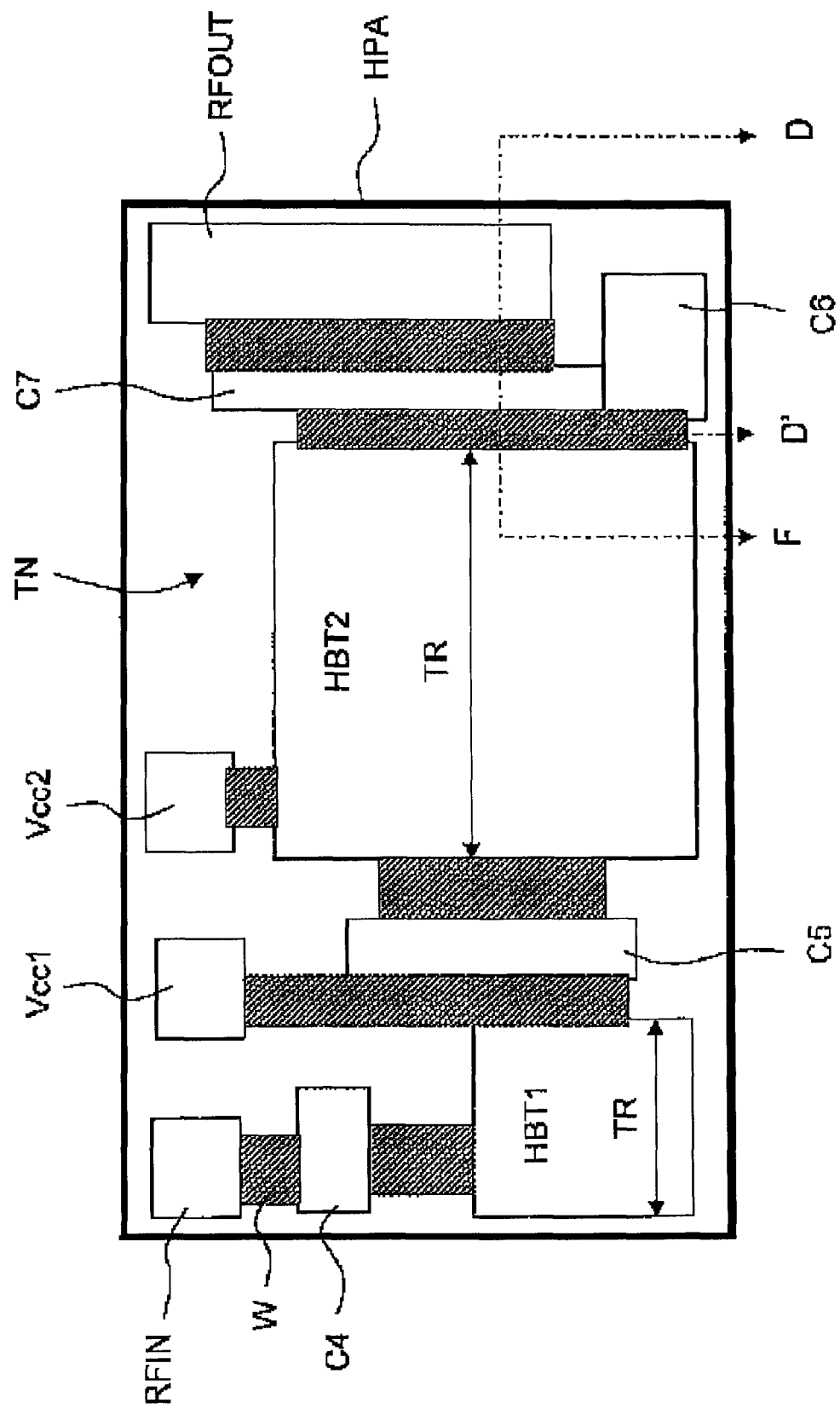
FIG. 5 is a schematic top view of a semiconductor chip for the high-frequency power amplifier in FIG. 4.

FIG. 4 is a circuit diagram of the high-frequency power amplifier of FIG. 1. FIG. 5 is a schematic top view of the semiconductor chip for the high-frequency power amplifier of FIG. 4. The outline of the high-frequency power amplifier configuring the high-frequency antenna module will be explained according to these drawings.

As shown in FIG. 4, the high-frequency power amplifier chip (HPA) is configured with amplifier transistors such as HBT elements (HBT1 and HBT2), for example, MIM capacitors (C4, C5, C6, and C7) and the like, and, among the MIM capacitors (C4, C5, C6, and C7), three capacitors are DC blocking capacitors (C4, C5, and C7) and a remaining capacitor is a de-coupling capacitor (C6). Both electrodes of each of the DC blocking capacitors (C4, C5, and C7) are coupled to pseudo ground portions (GP7, GP8, GP9, GP10, GP11, and GP12) as will be explained later. Meanwhile, emitters of the HBT elements (HBT1 and HBT2) and the de-coupling capacitor (C6) are coupled to real ground portions (GR1, GR2, and GR3), that is, normal ground portions, respectively.

The drive of this amplifier is performed by a power source supplied from power source terminals (Vcc1 and Vcc2). The transmission high-frequency signal supplied from the high-frequency input terminal (RFIN) passes through the DC blocking capacitor (C4), and is amplified first by the HBT element (HBT1) and transmitted to the second stage via the DC blocking capacitor (C5). In the second stage, the transmission high-frequency signal is amplified by the HBT element (HBT2) and transmitted to the high-frequency output terminal (RFOUT) via the DC blocking capacitor (C7).

Next, according to FIG. 5, an example will be explained for an upper surface structure for the high-frequency power amplifier chip (HPA). As shown in FIG. 5, external pads (RFIN, Vcc1, Vcc2, and RFOUT) are disposed in the peripheral portion of the high-frequency power amplifier chip (HPA) and the HBT elements (HBT1 and HBT2) are disposed in the center portion. The DC blocking capacitors (C4, C5, and C7) and the de-coupling capacitor (C6) are disposed between these external pads (RFIN, Vcc1, Vcc2, and RFOUT) and HBT elements (HBT1 and HBT2), and these terminals and elements and the like are coupled to each other by metal wirings (W) in each layer, or the like. The metal wirings (W) and the like in respective layers or the like are a lower-layer metal wiring film 7, an intermediate metal wiring film 8, an upper-layer metal wiring film 9 (e.g., FIG. 6) and the like.

Here, a region where the HBT elements (HBT1 and HBT2) are disposed is a transistor region TR and the other region is a non-transistor region TN.

4. Explanation of an example (example using a three-layer MIM capacitor) for a structure of the non-transistor region (surface epitaxial layer conversion isolation method) in the semiconductor integrated circuit device of an embodiment in the present application, and discussion and additional explanation about the present embodiment, the following variation examples, and the like (mainly FIG. 6) While, in the present application, a three-layer metal wiring process will be mainly explained specifically as an example, the number of the metal wiring layers may be two or four or more as needed. Further, while, in the following, the MIM capacitor (C1 or C7) will be mainly explained specifically as an example of the DC blocking capacitor for avoiding complexity, the explanation is directly applied to the other MIM capacitors, that is, the DC blocking capacitors (C2, C3, C4, and C5).

Figure 6:
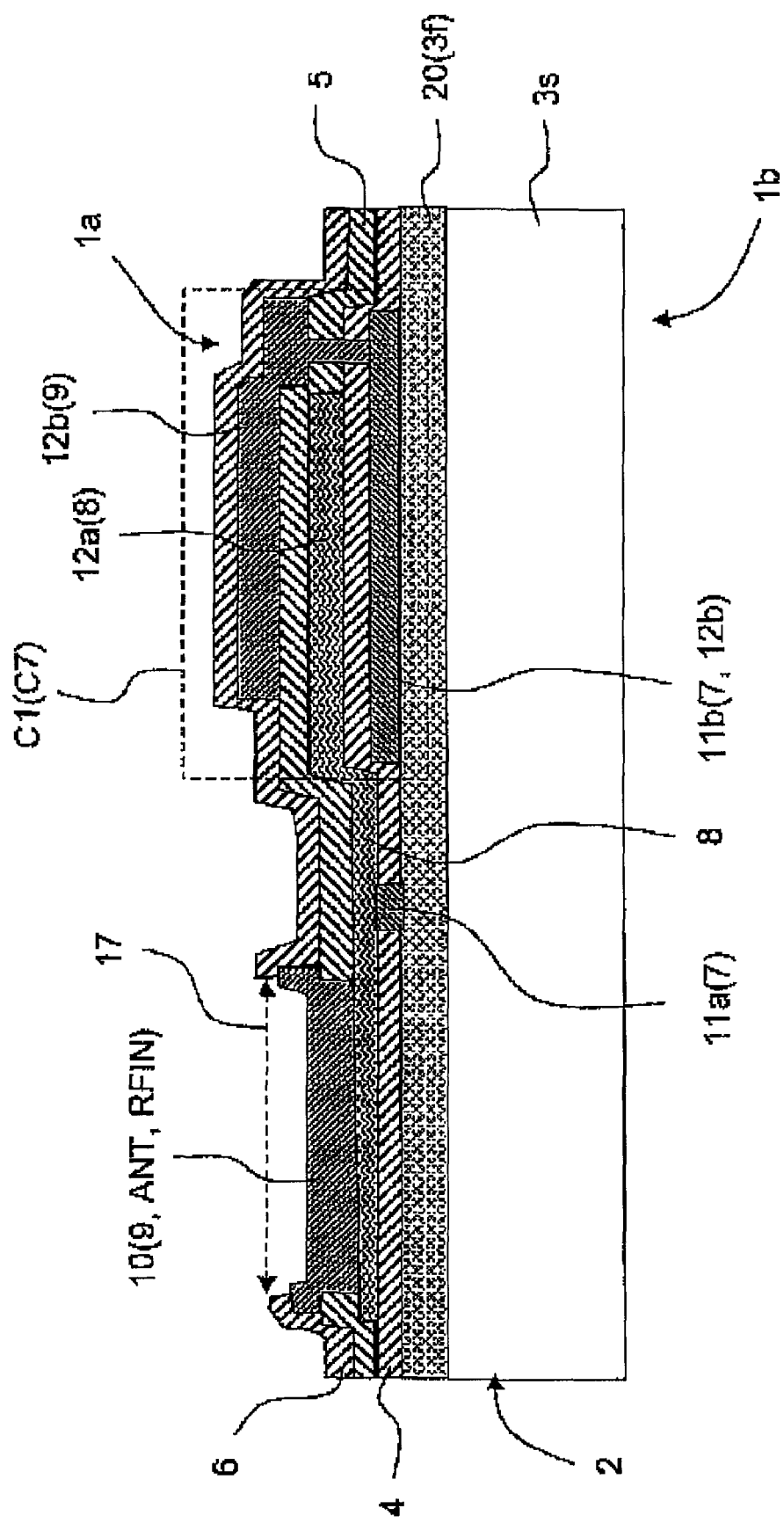
FIG. 6 is a device cross-sectional view for explaining an example (example using a three-layer MIM capacitor) for a structure of a non-transistor region (surface epitaxial layer conversion isolation method) in a semiconductor integrated circuit device of an embodiment in the present application.

FIG. 6 is a device cross-sectional view (A-A' cross section in FIG. 3 and D-D' cross section in FIG. 5) for explaining an example (example using a three-layer MIM capacitor) for a structure of the non-transistor region (surface epitaxial layer conversion isolation method) in the semiconductor integrated circuit device of an embodiment in the present application. According to this drawing, an example (example using a three-layer MIM capacitor) will be explained for a structure of the non-transistor region (surface epitaxial layer conversion isolation method) in the semiconductor integrated circuit device of an embodiment in the present application.

First, an example will be explained for a cross-sectional structure of the non-transistor region TN which can be applied commonly to integrated circuit devices such as shown in FIG. 2 and FIG. 4 (part of a semiconductor chip 2 corresponding to the antenna switch chip SWIC or the high-frequency power amplifier chip HPA). As shown in FIG. 6, an element isolation region 20 is formed by a semi-insulating surface layer 3f (thickness is approximately 345 nm, for example) over the surface, approximately the whole surface, of a semi-insulating GaAs substrate 3s (semi-insulating compound semiconductor substrate) having a thickness of approximately 100 micrometers (approximately 50 micrometers to 300 micrometers), for example, on the side of a surface 1a (surface opposite to a rear surface 1b, that is, a device surface or a first major surface). While this semi-insulating surface layer 3f shows semi-insulating property the same as the semi-insulating GaAs substrate 3s, the resistivity thereof is approximately one order lower than the resistivity of the semi-insulating GaAs substrate 3s (approximately $1 \times 10^8$ Ωcm, for example).

A first metal substrate contact portion 11a and a second metal substrate contact portion 11b which is also used for a second capacitor electrode 12b of the MIM capacitor C1 (C7) (lower electrode of the three-layer capacitor), are provided to be configured with a lower-layer metal wiring film 7, for example, over the semi-insulating surface layer 3f, and the lower-layer metal wiring film 7 (thickness is approximately 300 nm, for example) is configured with each layer of AuGe, Ni, Au, and the like, for example, from the lower layer.

In an upper layer of this lower-layer metal wiring film 7, for example, a substrate surface insulating film 4 (first insulating film) such as a silicon nitride film (thickness is approximately 100 nm, for example) formed by plasma CVD (Chemical Vapor Deposition) or the like is provided, and, in an upper layer thereof, an intermediate metal wiring film is provided and a first capacitor electrode 12a (intermediate electrode of the three-layer capacitor) of the MIM capacitor C1 (C7) is provided to be configured with this intermediate metal wiring film 8. This intermediate metal wiring film 8 (thickness is approximately 500 nm, for example) is configured with each layer of Ti, Au, Ti, and the like, for example, from the lower layer.

In an upper layer of the intermediate metal wiring film 8, an interlayer insulating film 5 such as a silicon nitride film (thickness is approximately 100 nm, for example) is formed by the plasma CVD or the like. In an upper layer of the interlayer insulating film 5, an external pad 10 and a second capacitor electrode 12b (upper electrode of the three-layer capacitor) for another electrode of the MIM capacitor C1 (C7) are provided to be configured with an upper-layer metal wiring film 9, and the upper-layer metal wiring film 9 (thickness is approximately 1,000 nm, for example) is configured with each layer of Ti, Au, Ti, and the like, for example, from the lower layer.

In an upper layer of this upper-layer metal wiring film 9, a final passivation insulating film 6 such as a silicon nitride film (thickness is approximately 300 nm, for example) by the plasma CVD or the like is formed and a pad opening 17 is formed in the final passivation insulating film 6 over the external pad 10.

Here, the intermediate metal wiring film 8 couples the external pad 10 and the first capacitor electrode 12a, and the second capacitor electrode 12b is coupled to a predetermined terminal of a transistor (HBT element or HEMT element) (base or collector for the HBT element and source or drain for the HEMT element, for example) by the lower-layer metal wiring film 7, the intermediate metal wiring film 8 or the upper-layer metal wiring film 9, for example.

As explained above and in FIG. 2 and FIG. 4, both terminals of the MIM-type DC blocking capacitor C1 (C7) are grounded in a pseudo manner separately to the semi-insulating surface layer 3f, and thereby undesirable charges (introduced external charges and charges induced thereby) are quickly dispersed within the semi-insulating compound semiconductor substrate 3s having a comparatively large capacity via the first metal substrate contact portion 11a, the second metal substrate contact portion 11b, and a "junction" of the semi-insulating surface layer 3f. Accordingly, it is possible to avoid a problem that charges caused by surge voltage are deposited at both terminals of the MIM-type DC blocking capacitor C1 (7) to break the insulating film, and the like.

That is, in other words, the semi-insulating surface layer 3f and the semi-insulating compound semiconductor substrate 3s act as a charge accumulator which shows a weak conductivity, for a DC noise or a low-frequency noise such as the surge voltage, and the semi-insulating surface layer 3f and the semi-insulating compound semiconductor substrate 3s act almost as an insulating substrate, for a transmission high-frequency signal or a receiving high-frequency signal. Note that, although showing a "weak conductivity", each of the semi-insulating surface layer 3f and the semi-insulating compound semiconductor substrate 3s has a comparatively high resistance and the plural terminals are not caused to have usually-called conduction states therebetween in DC or in a low frequency via these members.

Here, while the existence of the semi-insulating surface layer 3f is not always indispensable, this provides approximately the same effect as the effect of reducing the resistivity in the surface region of the semi-insulating compound semiconductor substrate 3s (ground resistance reduction effect). Further, as described later, the semi-insulating surface layer 3f can freely form the element isolation region 20 and the active region separately (surface epitaxial layer conversion isolation method) by selective ion implantation, and has an advantage of securing surface flatness as well as facilitating manufacturing.

5. Explanation of each specific example (example using a two-layer MIM capacitor) for a structure of the transistor region (example using a HEMT) and the non-transistor region (surface epitaxial layer conversion isolation method) and for variation examples thereof (substrate-direct method and surface epitaxial layer conversion isolation & $N^+$-foundation method) in the semiconductor integrated circuit device of an embodiment in the present application (mainly FIG. 7 to FIG. 9) In this section, while the structure of the non-transistor region TN different from that of FIG. 6 will be explained, the transistor region TR to be explained in the following can be directly applied to FIG. 6. Note that almost all the portions (same for the materials) are the same as those of FIG. 6 and portions different from those of FIG. 6 will be mainly explained (same for the following each section).

Figure 7:
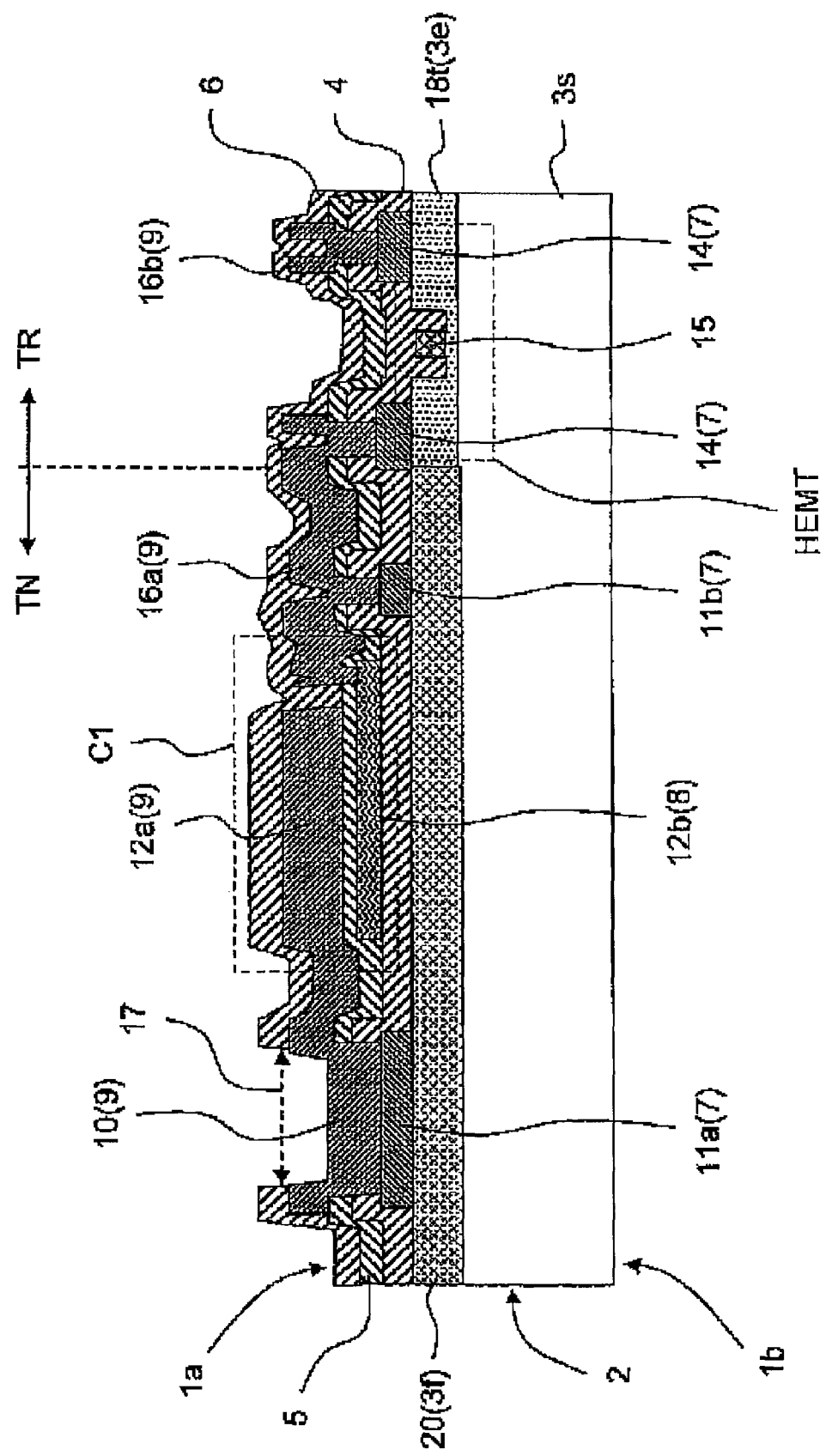
FIG. 7 is a device cross-sectional view for explaining a specific example (example using a two-layer MIM capacitor) for a structure of a transistor region (example using a HEMT) and a non-transistor region (surface epitaxial layer conversion isolation method) in a semiconductor integrated circuit device of an embodiment in the present application.
Figure 8:
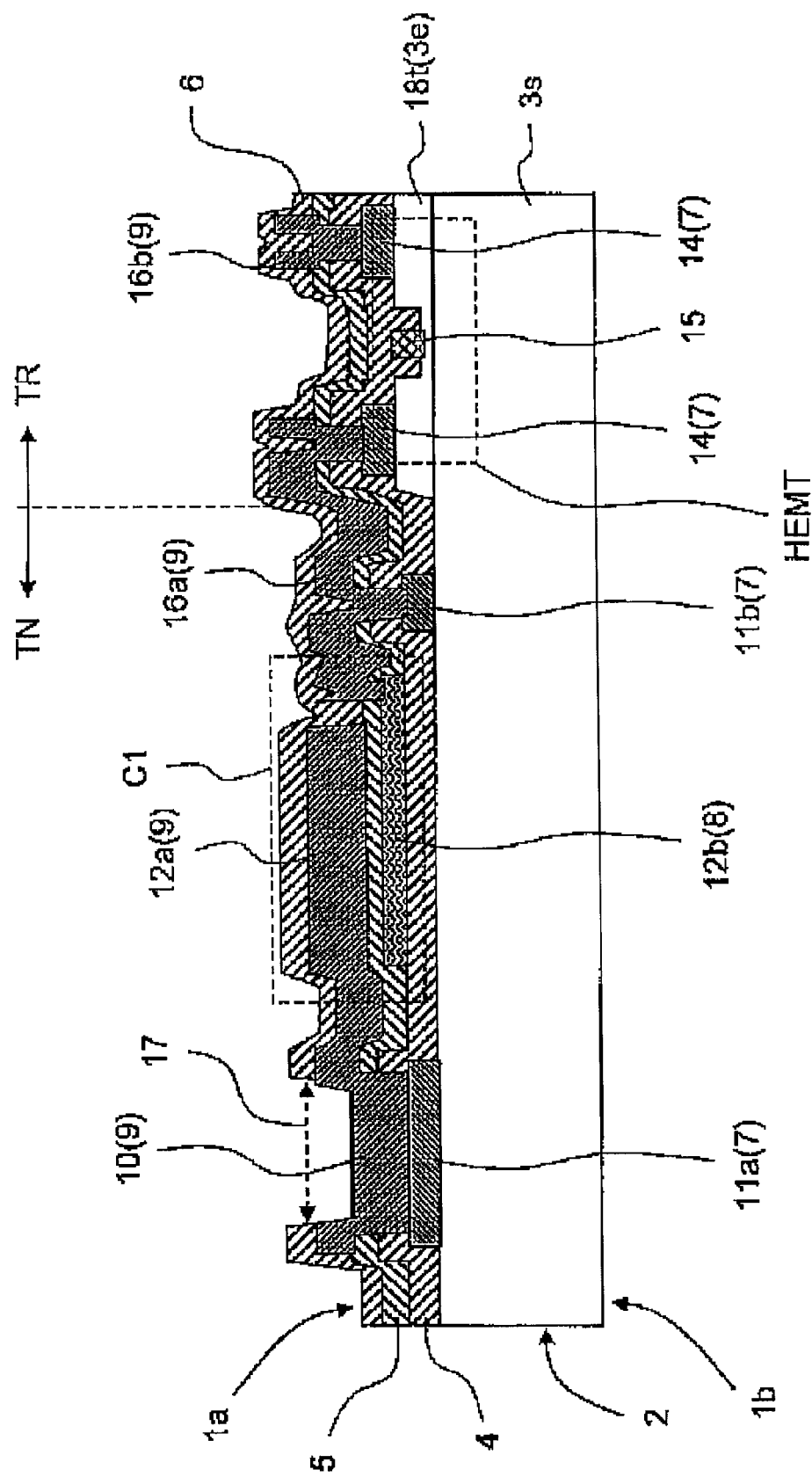
FIG. 8 is a device cross-sectional view for explaining a specific example (example using a two-layer MIM capacitor) of an variation example (substrate-direct method) for a structure of a transistor region (example using a HEMT) and a non-transistor region in a semiconductor integrated circuit device of an embodiment in the present application.
Figure 9:
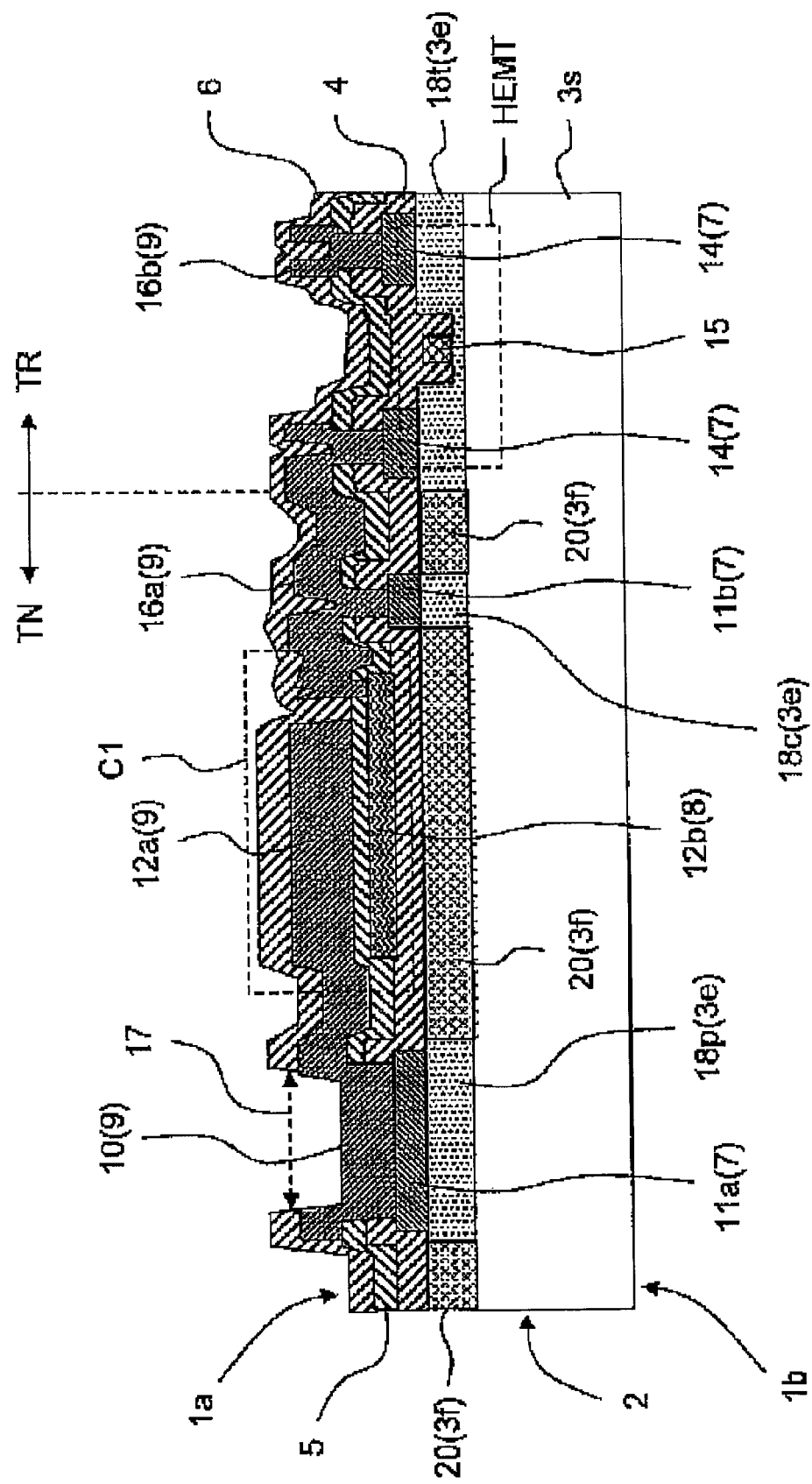
FIG. 9 is a device cross-sectional view for explaining a specific example (example using a two-layer MIM capacitor) of a variation example (surface epitaxial layer conversion isolation and $N^+$-foundation method) for a structure of a transistor region (example using a HEMT) and a non-transistor region in a semiconductor integrated circuit device of an embodiment in the present application.

FIG. 7 is a device cross-sectional view (A-B cross section in FIG. 3) for explaining a specific example (example using a two-layer MIM capacitor) for a structure of the transistor region (example using a HEMT) and the non-transistor region (surface epitaxial layer conversion isolation method) in the semiconductor integrated circuit device of an embodiment in the present application. FIG. 8 is a device cross-sectional view (A-B cross section in FIG. 3) for explaining a specific example (example using a two-layer MIM capacitor) of a variation example (substrate-direct method) for a structure of the transistor region (example using a HEMT) and the non-transistor region in the semiconductor integrated circuit device of an embodiment in the present application. FIG. 9 is a device cross-sectional view (A-B cross section in FIG. 3) for explaining an specific example (example using a two-layer MIM capacitor) of a variation example (surface epitaxial layer conversion isolation & $N^+$-foundation method) for a structure of the transistor region (example using HEMT) and the non-transistor region in the semiconductor integrated circuit device of an embodiment in the present application. According to these drawings, each specific example (example using a two-layer MIM capacitor) will be explained for a structure of the transistor region (example using a HEMT) and the non-transistor region (surface epitaxial layer conversion isolation method), and for the variation examples thereof (substrate-direct method and surface epitaxial layer conversion isolation & $N^+$-foundation method) in the semiconductor integrated circuit device of an embodiment in the present application.

(1) Surface epitaxial layer conversion isolation method (mainly FIG. 7): As shown in FIG. 7, this example corresponds to the A-B cross section of FIG. 3, and the semi-insulating surface layer 3f is formed over approximately the whole surface of the non-transistor region TN on the device surface 1a side of the semi-insulating compound semiconductor substrate 3s, basically the same as in FIG. 6. A first different point from FIG. 6 is that, in FIG. 7, the first metal substrate contact portion 11a is provided over approximately the whole portion directly under the external pad 10, and that the electrode of the capacitor C1 has a two-layer structure and the second metal substrate contact portion 11b is provided independently from the second capacitor electrode 12b (lower electrode) of the MIM capacitor (C1). A second point is that, in FIG. 7, the layer of the external pad 10, that is, the upper-layer metal wiring film 9 is used as it is for the first capacitor electrode 12a (upper electrode) of the MIM capacitor (C1).

Next, according to FIG. 7, the transistor region TR will be explained. In the region of the HEMT2 in FIG. 3, normally the plural HEMTs are disposed in parallel so as to support high power operation. FIG. 7 shows a cross section of one HEMT among the plural HEMTs in the transistor region TR. As shown in FIG. 7, an active region 18t of the transistor region (RT) configured with a conductive epitaxial compound semiconductor film 3e (first conductive epitaxial compound semiconductor film), and the like, for example, is provided over the surface of the semi-insulating compound semiconductor substrate 3s on the device surface 1a side, and a gate electrode 15 (Schottky gate) of the HEMT element (HEMT) is provided in a mesa-etched low level portion in the center. This gate electrode 15 (thickness is approximately 400 nm, for example) is configured with each layer of Ti, Pt, Au, and the like, for example, from the lower layer. On the other side, a pair of source-drain electrodes 14 of the HEMT element (HEMT) is provided to be configured with the lower-layer metal wiring film 7, for example, in a mesa-etched high level portion. These source-drain electrodes 14 are configured with the upper-layer metal wiring film 9, for example, one electrode is coupled to the second capacitor electrode 12b (lower electrode) of the MIM capacitor (C1) with a source-drain lead wiring 16a configured with the upper-layer metal wiring film 9, for example, and the other electrode is coupled to another capacitor, that is, the MIM capacitor (C3) or the like, for example, with a source-drain lead wiring 16b configured with the upper-layer metal wiring film 9, for example.

As shown here, the terminals of the MIM capacitor (C1) are coupled to the semi-insulating surface layer 3f at respective different positions, and thereby it is possible to reduce undesired charges flowing into the transistor region TR. This is the same for the following subsections (2) and (3).

(2) Substrate-direct method (mainly FIG. 8): While the example of FIG. 8 is a variation example of the example of FIG. 7, a different point is that the semi-insulating surface layer 3f having a low resistivity is not formed in the non-transistor region (TN). Therefore, the whole active region 18t of the transistor region TR is formed by mesa etching from the conductive epitaxial compound semiconductor film 3e (first conductive epitaxial compound semiconductor film) or the like, for example. Further, resultantly, the substrate surface insulating film 4 (first insulating film), the first metal substrate contact portion 11a, the second metal substrate contact portion 11b, and the like are provided directly on the surface of the semi-insulating compound semiconductor substrate 3s on the device surface 1a side.

While the resistivity of the semi-insulating compound semiconductor substrate 3s is approximately one order higher than the resistivity of the semi-insulating surface layer 3f, the semi-insulating compound semiconductor substrate 3s has a far larger volume and has the effect of accepting a sufficiently large number of undesirable charges, even without the low resistivity semi-insulating surface layer 3f.

(3) Surface epitaxial layer conversion isolation & $N^+$-foundation method (mainly FIG. 9): While the example of FIG. 9 is also a variation example of the example in FIG. 7, a different point is that, while approximately the whole of the non-transistor region (TN) is covered by the semi-insulating surface layer 3f, the lower portions and the peripheral portions thereof of the first metal substrate contact portion 11a, the second metal substrate contact portion 11b, and the like, for example, are caused to have the original conductive epitaxial compound semiconductor film 3e (second conductive epitaxial compound semiconductor film) as it is. Thereby, the first metal substrate contact portion 11a and the second metal substrate contact portion 11b have an active region under the pad 18p (second conductive epitaxial compound semiconductor film) and an active region under the independent metal contact portion 18c (second conductive epitaxial compound semiconductor film), respectively.

The action of such a structure is approximately the same as in the case of FIG. 7, and each of the first metal substrate contact portion 11a and the second metal substrate contact portion 11b has a comparatively preferable contact state (ohmic contact, or the like, for example) with the foundation. In addition, each of the active regions 18p and 18c (second conductive epitaxial compound semiconductor films) becomes a comparatively preferable current path, and the pseudo ground effect for the semi-insulating compound semiconductor substrate 3s could become comparatively preferable (that is, ground resistance becomes low).

Figure 19:
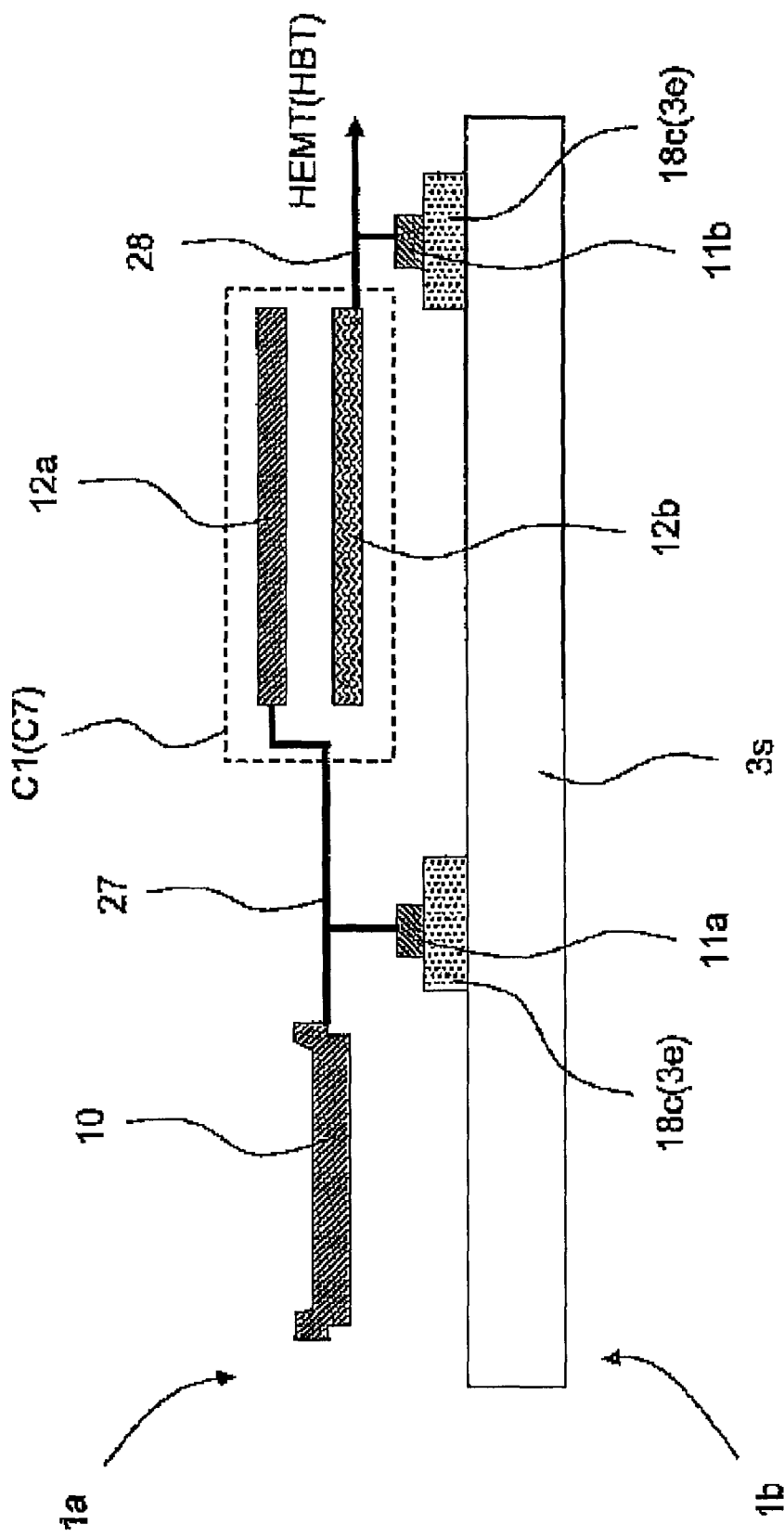
FIG. 19 is a schematic device cross-sectional view (pad and capacitor-upper-electrode coupling & independent mesa-type active region contact form in a substrate-direct & mesa-type active region formation method) for explaining various variation examples for a configuration of a non-transistor region in a semiconductor integrated circuit device of an embodiment in the present application.
Figure 20:
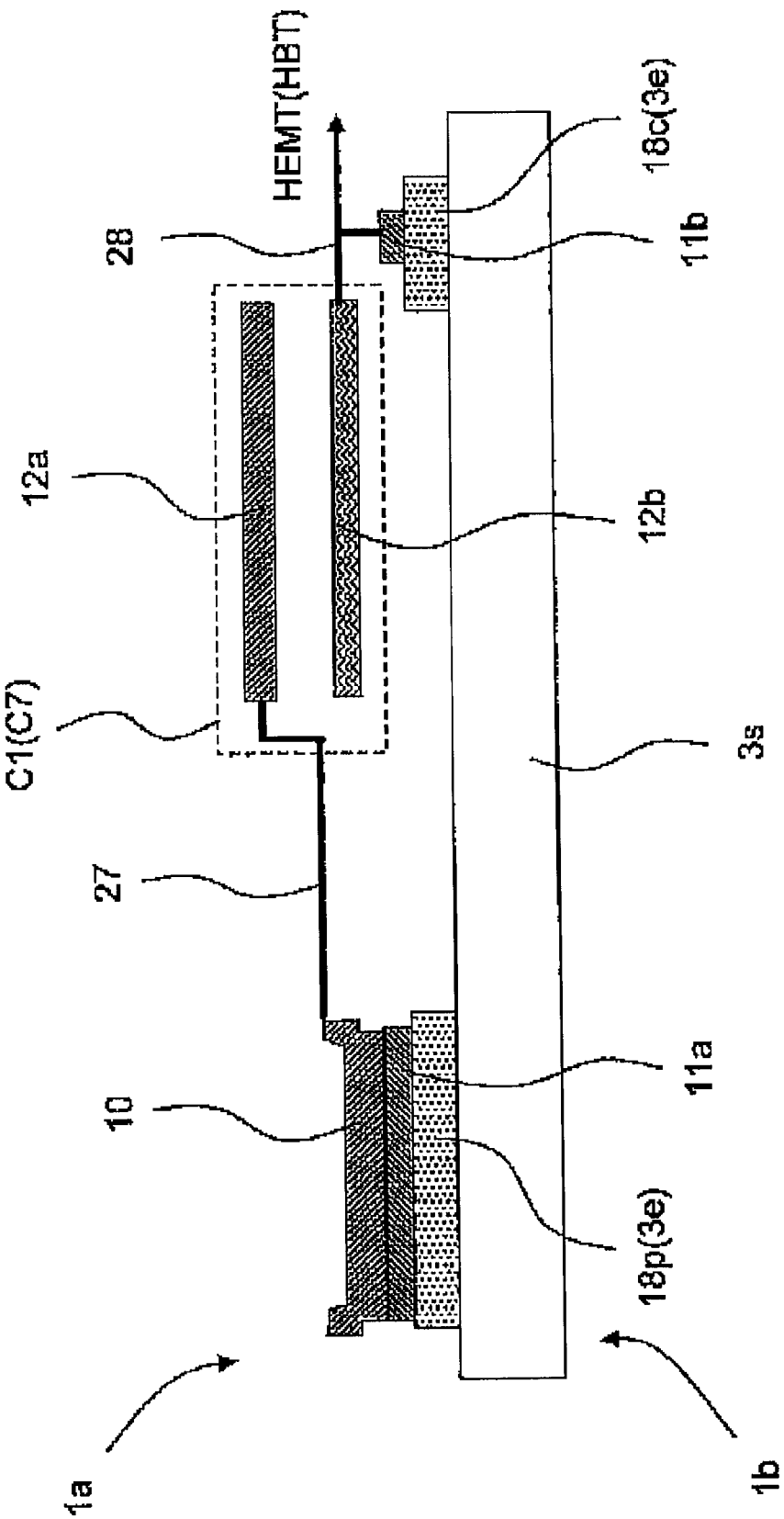
FIG. 20 is a schematic device cross-sectional view (pad and capacitor-upper-electrode coupling over-a-mesa-type-active-region mixed contact form in a substrate-direct & mesa-type active region formation method) for explaining various variation examples for a configuration of a non-transistor region in a semiconductor integrated circuit device of an embodiment in the present application.

Note that, in the case of FIG. 9, the active regions 18p and 18c (second epitaxial compound semiconductor films) can be provided also as mesa regions (refer to FIG. 19 and FIG. 20).

6. Explanation of a structure (surface epitaxial layer conversion isolation method) of the transistor region (example using an HBT) and the non-transistor region (example using a three-layer MIM capacitor) in the semiconductor integrated circuit device of an embodiment in the present application (mainly FIG. 10 and FIG. 38) While, in this section, a structure different from that of FIG. 6 to FIG. 9 will be explained for the non-transistor region TN, the structure of the transistor region TR explained in the following can be directly applied to FIG. 6 to FIG. 9. That is, the transistor region TR may be replaced by the HEMT element (HEMT) in the following structure of FIG. 10, and the transistor region TR may be replaced by the HBT element (HBT) in the structure of FIG. 6 to FIG. 9 (addition in the case of FIG. 6).

Note that the materials and the like are the same as those of FIG. 6 to FIG. 9 in principle and only different portions will be explained.

Figure 10:
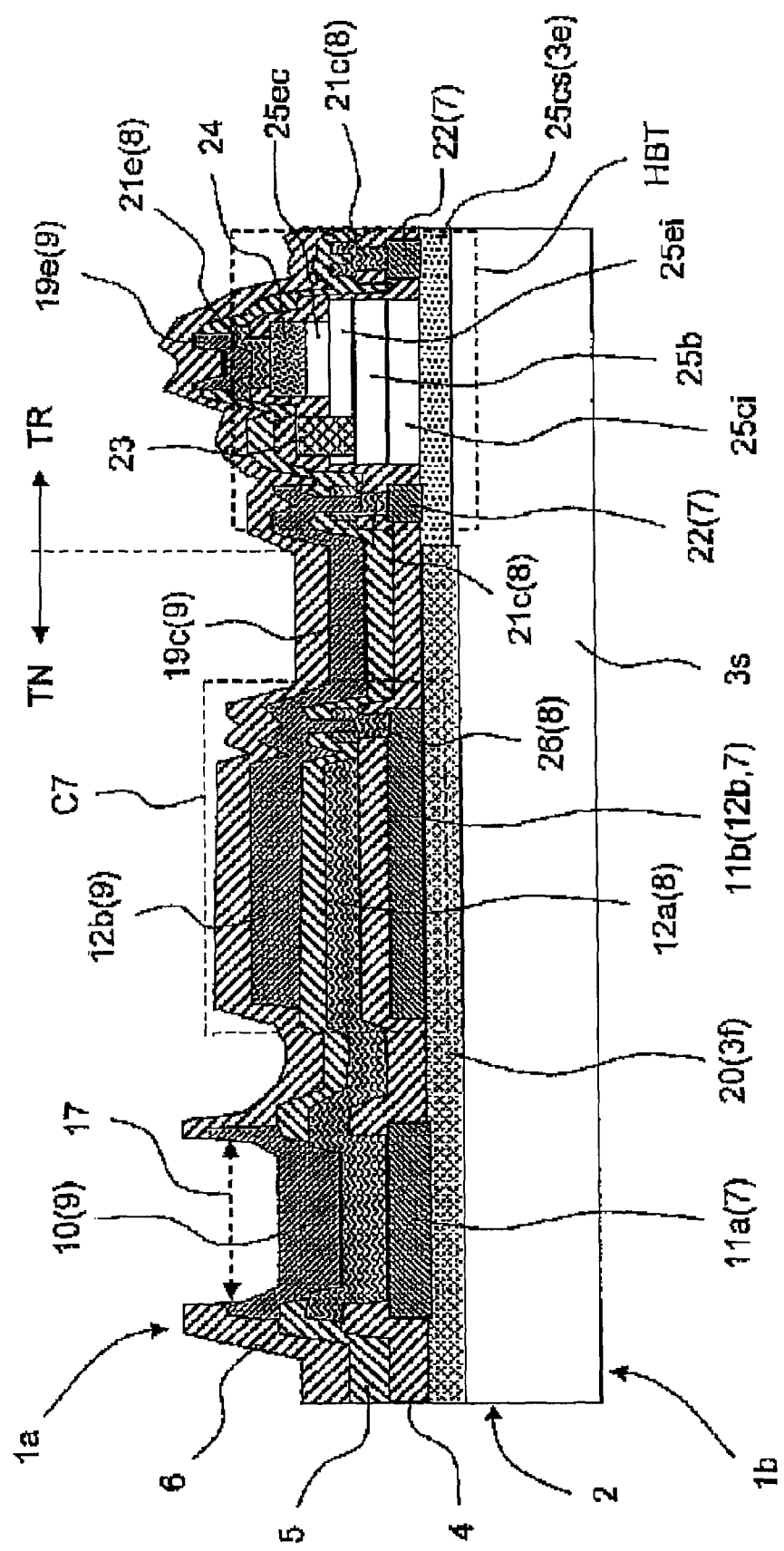
FIG. 10 is a device cross-sectional view for explaining a structure (surface epitaxial layer conversion isolation method) of a transistor region (example using an HBT) and a non-transistor region (example using a three-layer MIM capacitor) in a semiconductor integrated circuit device of an embodiment in the present application.
Figure 38:
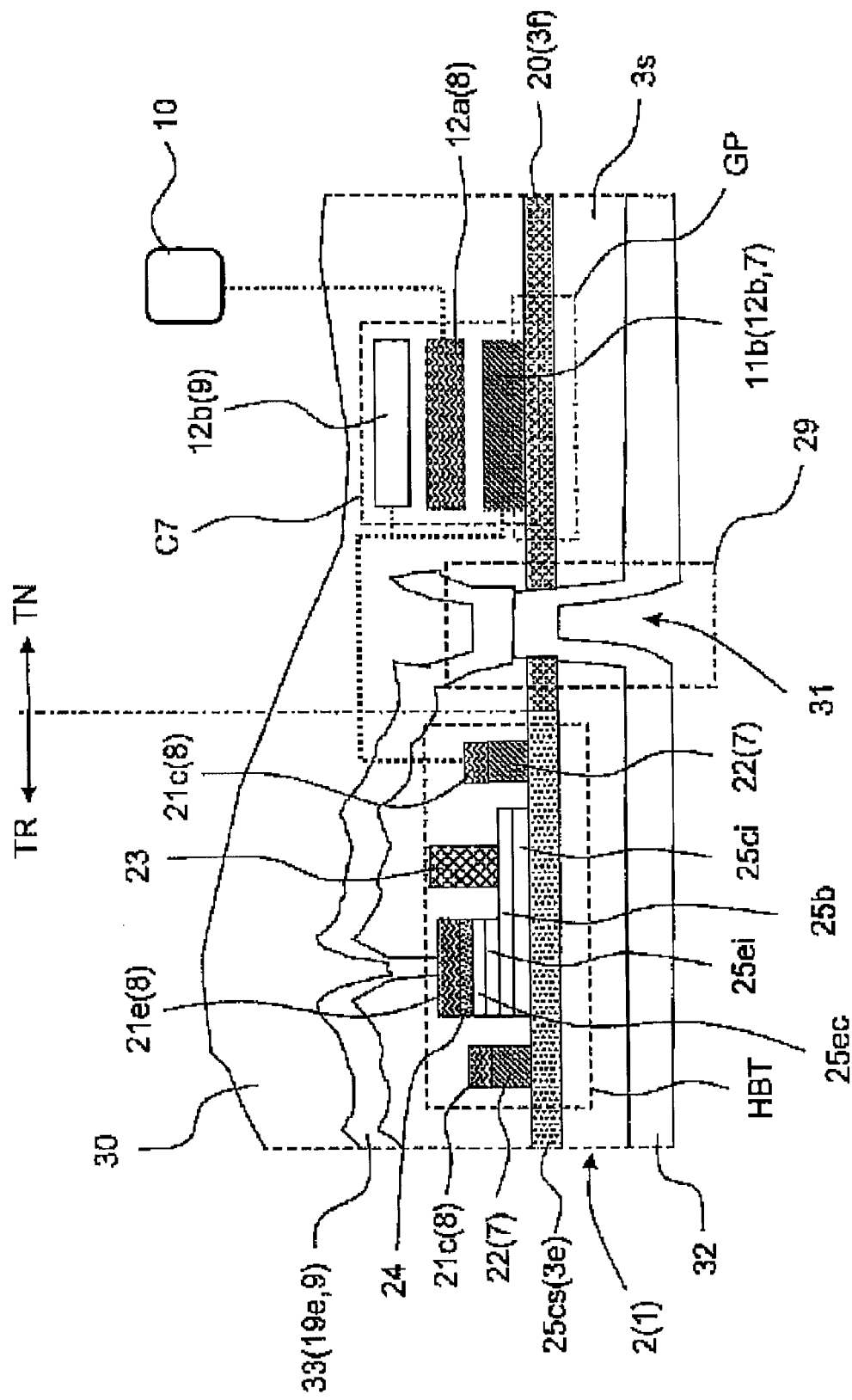
FIG. 38 is a schematic partial cross-sectional view for explaining a mutual relationship among a rear surface coupling portion, a real ground portion, a pseudo ground portion, and the like in a semiconductor chip corresponding to FIG. 10.

FIG. 10 is a device cross-sectional view (D-F cross section in FIG. 5) for explaining a structure (surface epitaxial layer conversion isolation method) of the transistor region (example using an HBT) and the non-transistor region (example using a three-layer MIM capacitor) in the semiconductor integrated circuit device of an embodiment in the present application. Here, the plural HBTs are disposed in parallel in the region of HBT2 in FIG. 5 and support the high power operation. The transistor region TR of FIG. 10 shows a cross section in one of the HBTs. FIG. 38 is a schematic partial cross-sectional view for explaining a mutual relationship among a rear surface coupling portion, a real ground portion, a pseudo ground portion, and the like in a semiconductor chip corresponding to FIG. 10. According to these drawings, a structure (surface epitaxial layer conversion isolation method) will be explained for the transistor region (example using an HBT) and the non-transistor region (example using a three-layer MIM capacitor) in the semiconductor integrated circuit device of an embodiment in the present application.

While the example of FIG. 10 is similar to that of FIG. 6 in the non-transistor region TN, a different point is that the whole portion below the external pad 10 is formed by the first metal substrate contact portion 11a configured with the lower-layer metal wiring film 7. On the other side, the structure of the transistor region TR is similar to that in FIG. 7 except that the HEMT element (HEMT) is changed to an HBT element (HBT).

Next, according to FIG. 10, the transistor region TR will be explained. As shown in FIG. 10, an $n^+$-type GaAs sub-collector layer 25cs of the HBT element (HBT) is formed to be configured with the conductive epitaxial compound semiconductor film 3e (first conductive epitaxial compound semiconductor film) or the like, for example, over the surface of the semi-insulating compound semiconductor substrate 3s on the device surface 1a side. An n-type GaAs collector layer 25ci and a collector electrode configured with the lower-layer metal wiring layer film 7, for example, are provided over this n$^+$-type GaAs sub-collector layer 25cs, and a p-type GaAs base layer 25b is provided over the n-type GaAS collector layer 25ci. An n-type InGaP emitter layer 25ei is provided over this p-type GaAs base layer 25b and a base electrode 23 is provided over the p-type GaAs base layer 25b passing through this n-type InGaP emitter layer 25ei. This base electrode 23 (thickness is approximately 500 nm, for example) is configured with each layer of Pt, Ti, Pt, Au and the like, for example, from the lower layer.

An n$^+$-type InGaAs emitter cap layer 25ec is provided over the n-type InGaP emitter layer 25ei, and further an emitter electrode 24 is provided thereover. This emitter electrode (thickness is approximately 300 nm, for example) is configured with a WSi film, for example.

An emitter link wiring 21e and a collector link wiring 21c are provided to be configured with the intermediate metal wiring film 8, for example, over the emitter electrode 24 and the collector electrode 22, respectively. Further, an emitter lead wiring 19e and a collector lead wiring 19c are provided to be configured with the upper-layer metal wiring film 9, for example, over the emitter link wiring 21e and the collector link wiring 21c, respectively, and the collector electrode 22 (collector link wiring 21c) is coupled to the second capacitor electrode 12b (upper electrode or lower electrode, that is, electrode except the intermediate electrode 12a) of the MIM capacitor (C7) with this collector lead wiring 19c. Here, the upper electrode and the lower electrode are coupled to each other with an in-capacitor link wiring 26 configured with the intermediate metal wiring film 8. Similarly, the external pad 10 and the first metal substrate contact portion 11a are also coupled to each other with the intermediate metal wiring film 8 which is integrated with the intermediate electrode 12a of the MIM capacitor (C7).

Next, according to FIG. 38 (refer to FIG. 4), a mutual relationship will be explained for the rear surface coupling portion 29, the real ground portions (GR1, GR2, and GR3), the pseudo ground portions (GP, GP7, GP8, GP9, GP10, GP11, and GP12), and the like in the semiconductor chip 2 mounting the HBT element. As shown in FIG. 38, in this case, the emitter electrode 24 of the HBT element (HBT) is coupled to a ground wiring 33 (real ground wiring) via the link wiring 21e, and this ground wiring 33 is coupled to a rear surface electrode 32 via a through via 31 in the rear surface coupling portion 29. On the other side, since the rear surface electrode 32, the semi-insulating semiconductor substrate 3s, and the semi-insulating surface layer 3f contact each other directly, the pseudo ground portion GP and the real ground portion (GR1, GR2, and GR3) can be also considered to be coupled to each other in DC and in a low frequency (pseudo coupling). However, since each portion of the semi-insulating compound semiconductor substrate 3s and the semi-insulating surface layer 3f has a comparatively high resistivity, current therein is limited to an extremely small value and does not affect circuit operation. Accordingly, there is an effect of releasing undesirable charges caused by the surge voltage or the like from the device portion (transistor or capacitor) into the substrate. Note that, in a further longer time scale, the undesirable charges dispersed within the substrate is taken off to outside slowly through the real ground portion (GR1, GR2, or GR3), and thereby the existence of such pseudo ground coupling has an effect of avoiding a problem caused by excess charge accumulation into the substrate.

7. Explanation of various kinds of variation example for a configuration of the non-transistor region in the semiconductor integrated circuit device of an embodiment in the present application (mainly FIG. 11 to FIG. 20) This section will explain variation examples of FIG. 6 to FIG. 10 for variations such as the structure, the coupling relationship, and the like of the non-transistor region TN which are explained in sections 4 and 5, by classification into schematic patterns. Accordingly, the pattern itself in each of FIG. 6 to FIG. 10 will not be explained in principle.

Figure 11:
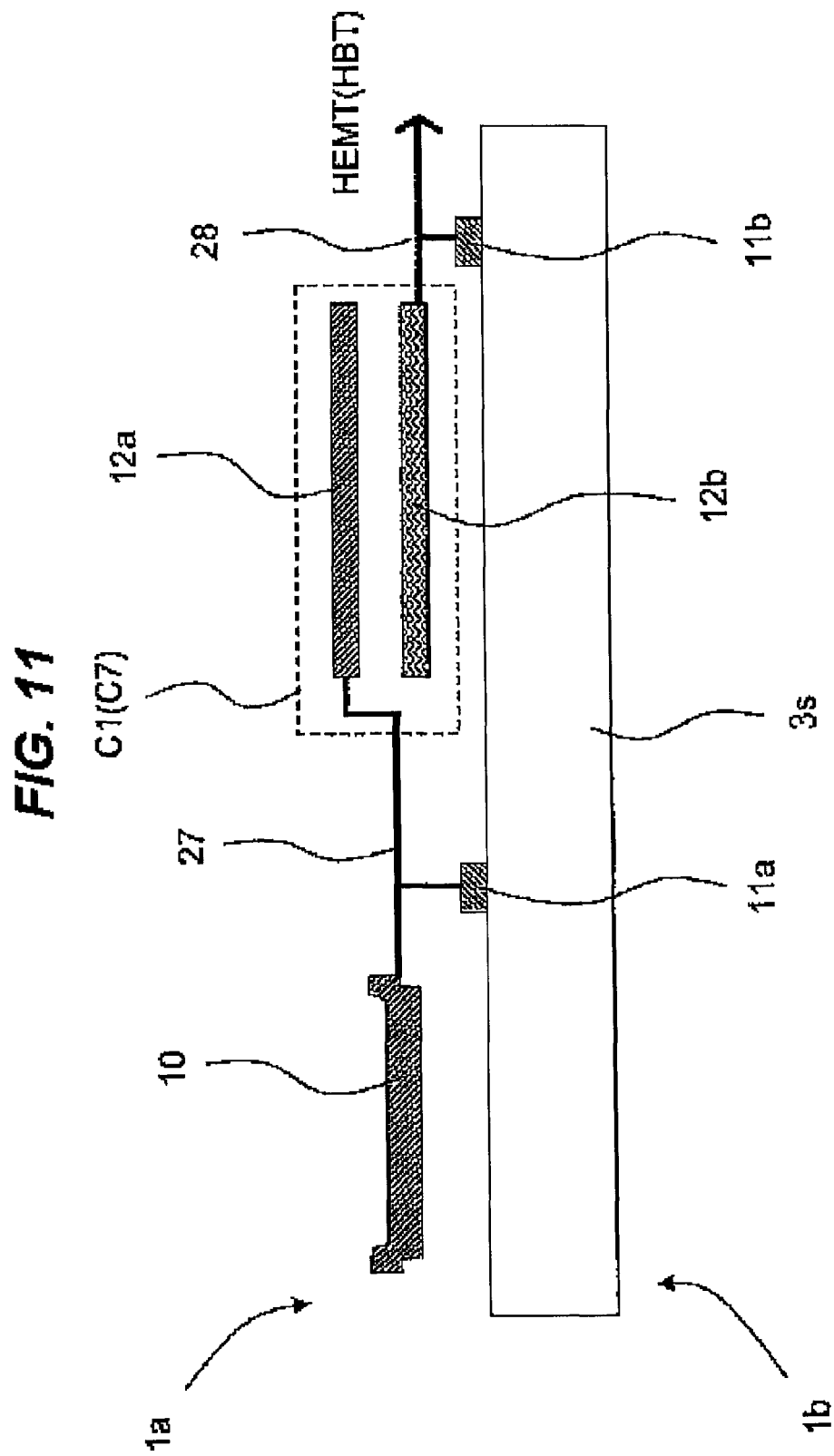
FIG. 11 is a schematic device cross-sectional view (pad and capacitor-upper-electrode coupling & independent contact form in a substrate-direct method) for explaining various variation examples for a configuration of a non-transistor region in a semiconductor integrated circuit device of an embodiment in the present application.
Figure 12:
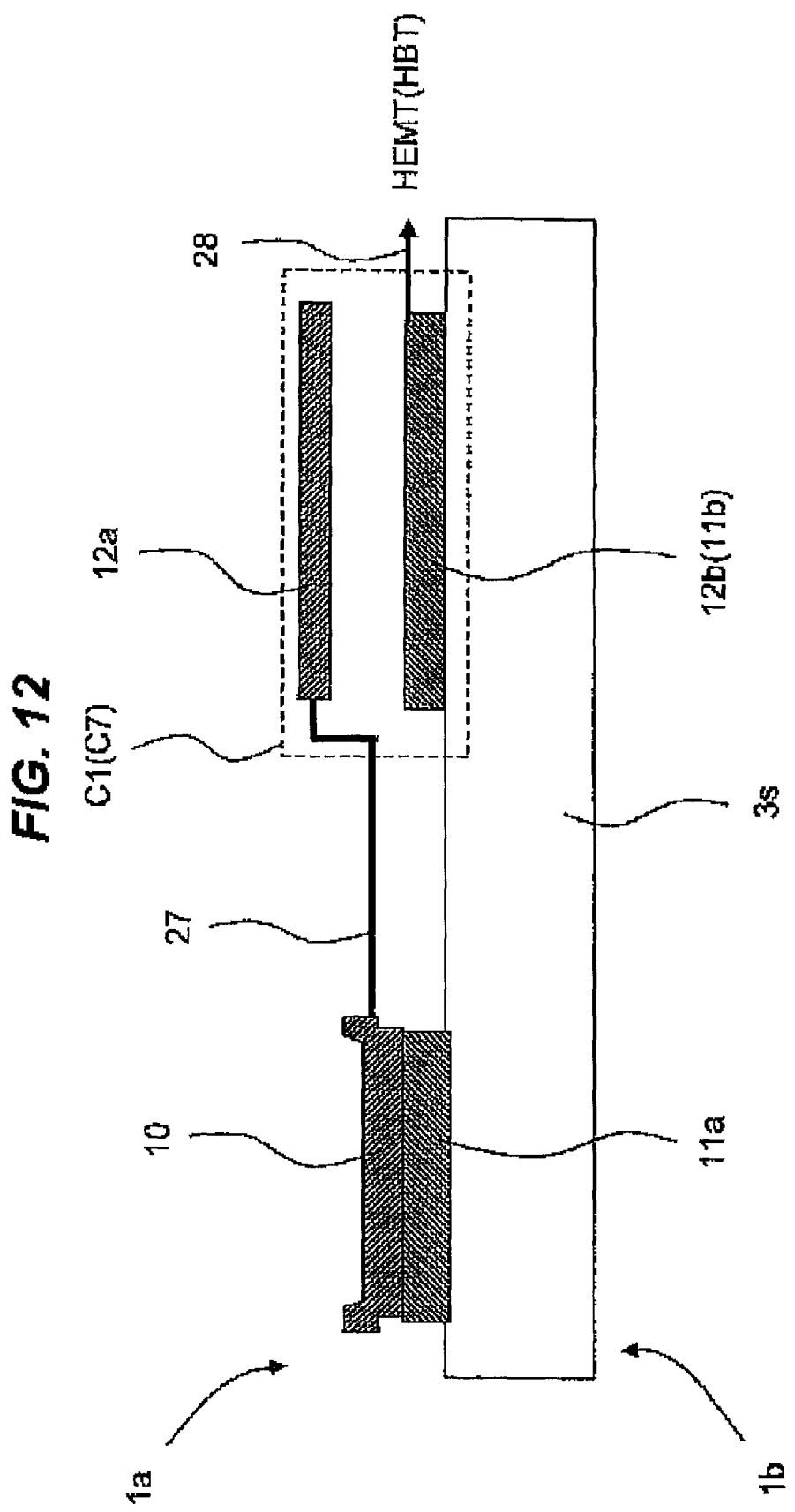
FIG. 12 is a schematic device cross-sectional view (pad and capacitor-upper-electrode coupling & directly-lower contact form in a substrate-direct method) for explaining various variation examples for a configuration of a non-transistor region in a semiconductor integrated circuit device of an embodiment in the present application.
Figure 13:
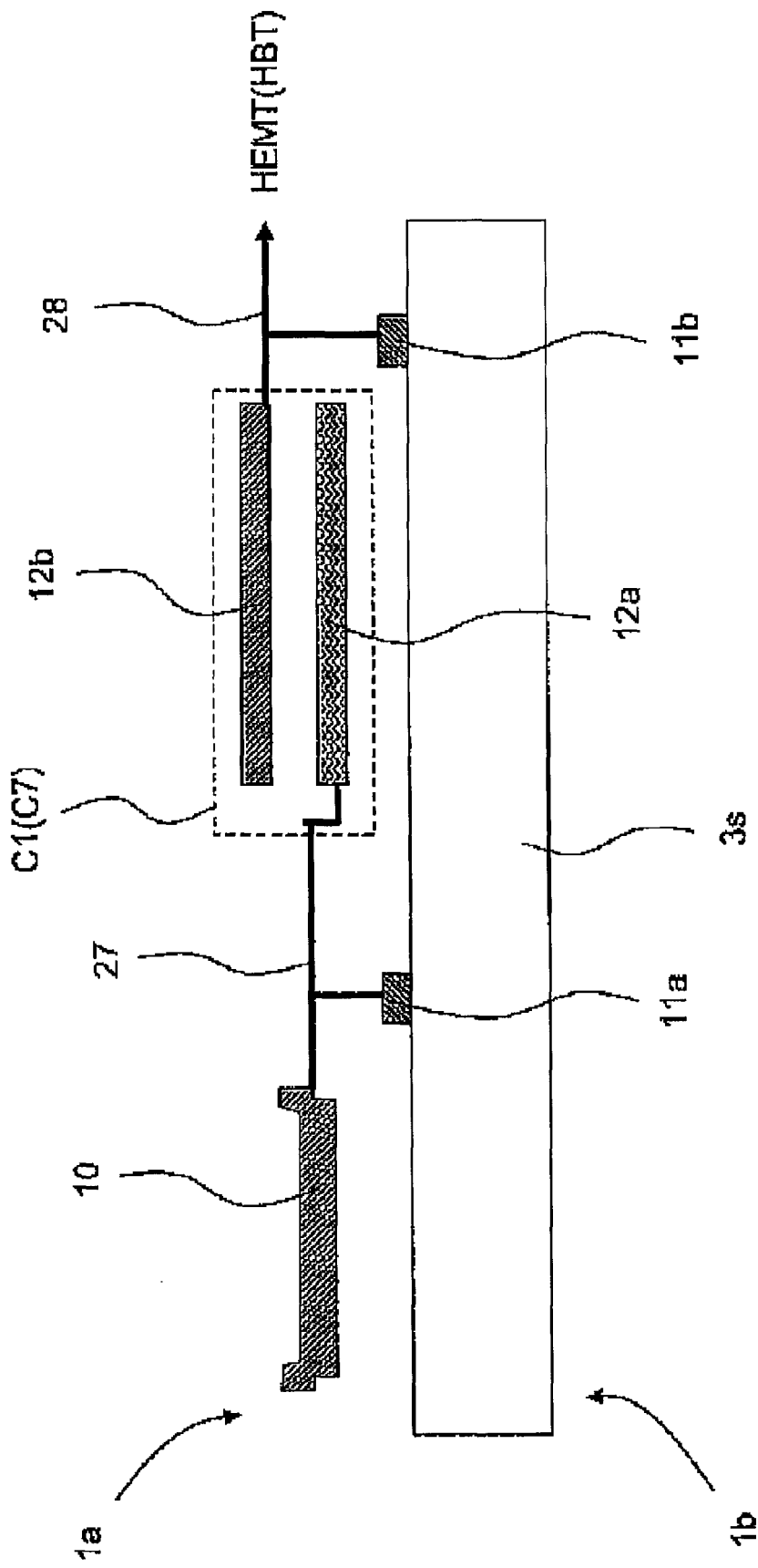
FIG. 13 is a schematic device cross-sectional view (pad and capacitor-lower-electrode coupling & independent contact form in a substrate-direct method) for explaining various variation examples for a configuration of a non-transistor region in a semiconductor integrated circuit device of an embodiment in the present application.
Figure 14:
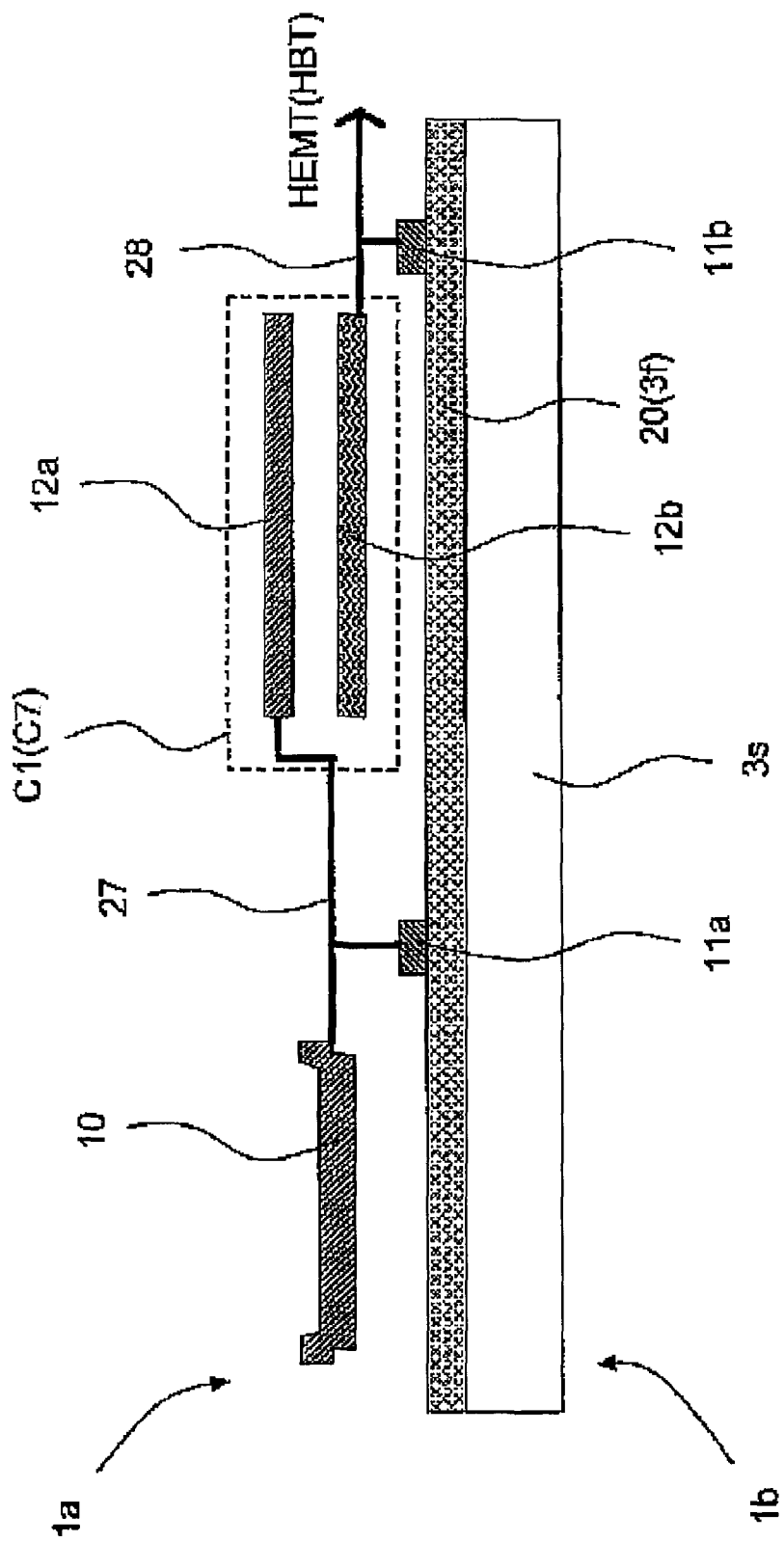
FIG. 14 is a schematic device cross-sectional view (pad and capacitor-upper-electrode coupling & independent semi-insulating surface layer contact form in a surface epitaxial layer conversion isolation method) for explaining various variation examples for a configuration of a non-transistor region in a semiconductor integrated circuit device of an embodiment in the present application.
Figure 15:
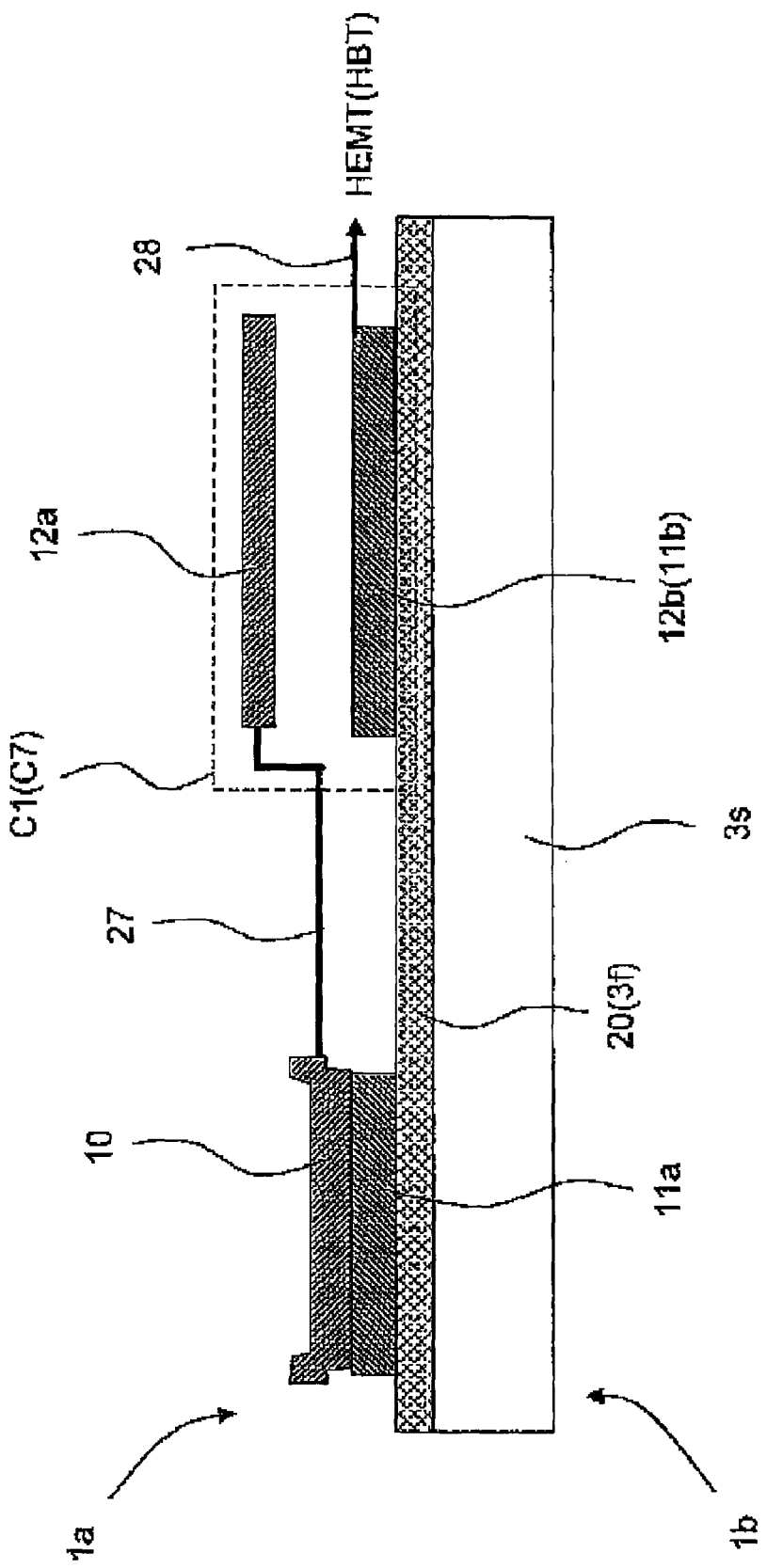
FIG. 15 is a schematic device cross-sectional view (pad and capacitor-upper-electrode coupling & directly-lower semi-insulating surface layer contact form in a surface epitaxial layer conversion isolation method) for explaining various variation examples for a configuration of a non-transistor region in a semiconductor integrated circuit device of an embodiment in the present application.
Figure 16:
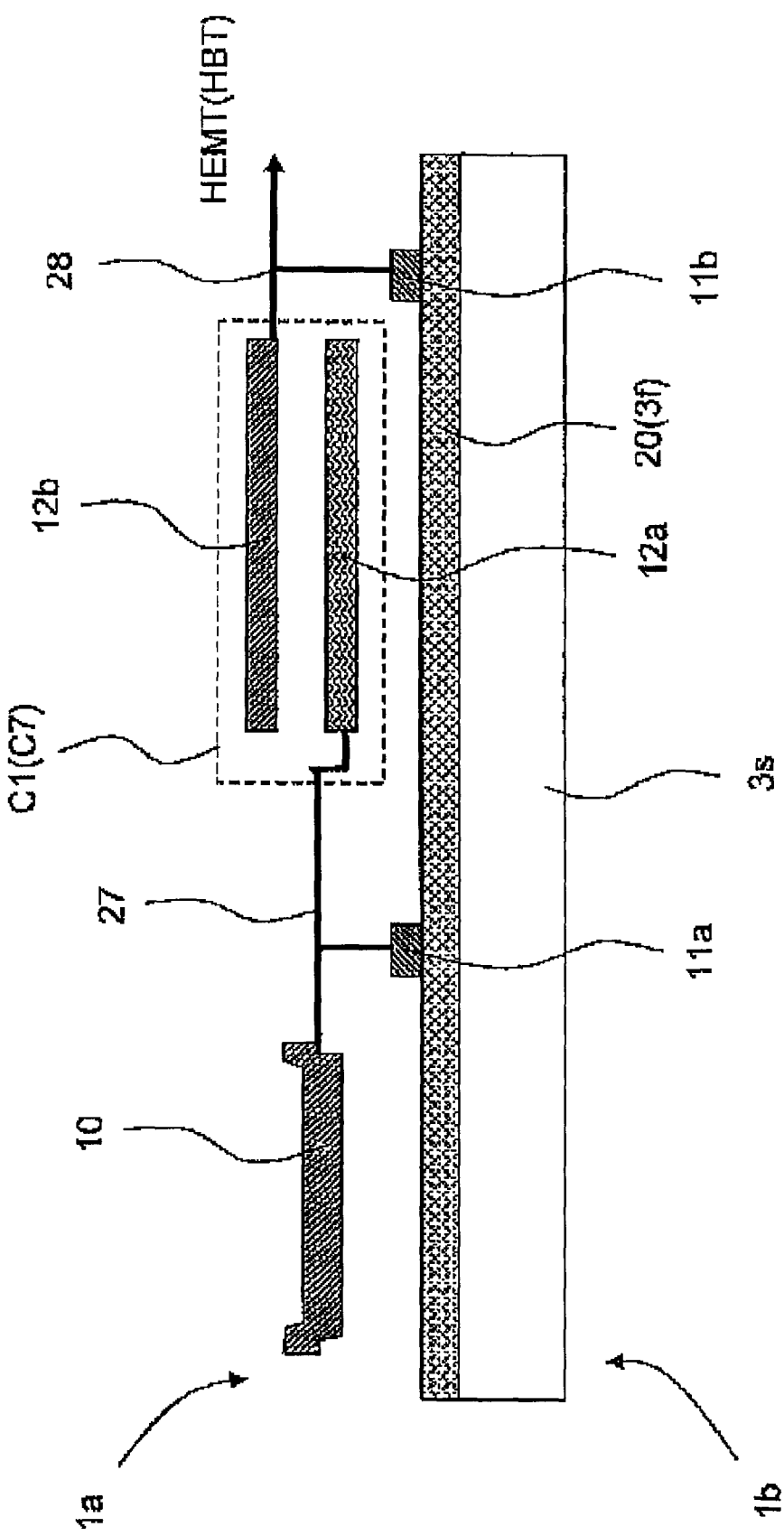
FIG. 16 is a schematic device cross-sectional view (pad and capacitor-lower-electrode coupling & independent semi-insulating surface layer contact form in a surface epitaxial layer conversion isolation method) for explaining various variation examples for a configuration of a non-transistor region in a semiconductor integrated circuit device of an embodiment in the present application.
Figure 17:
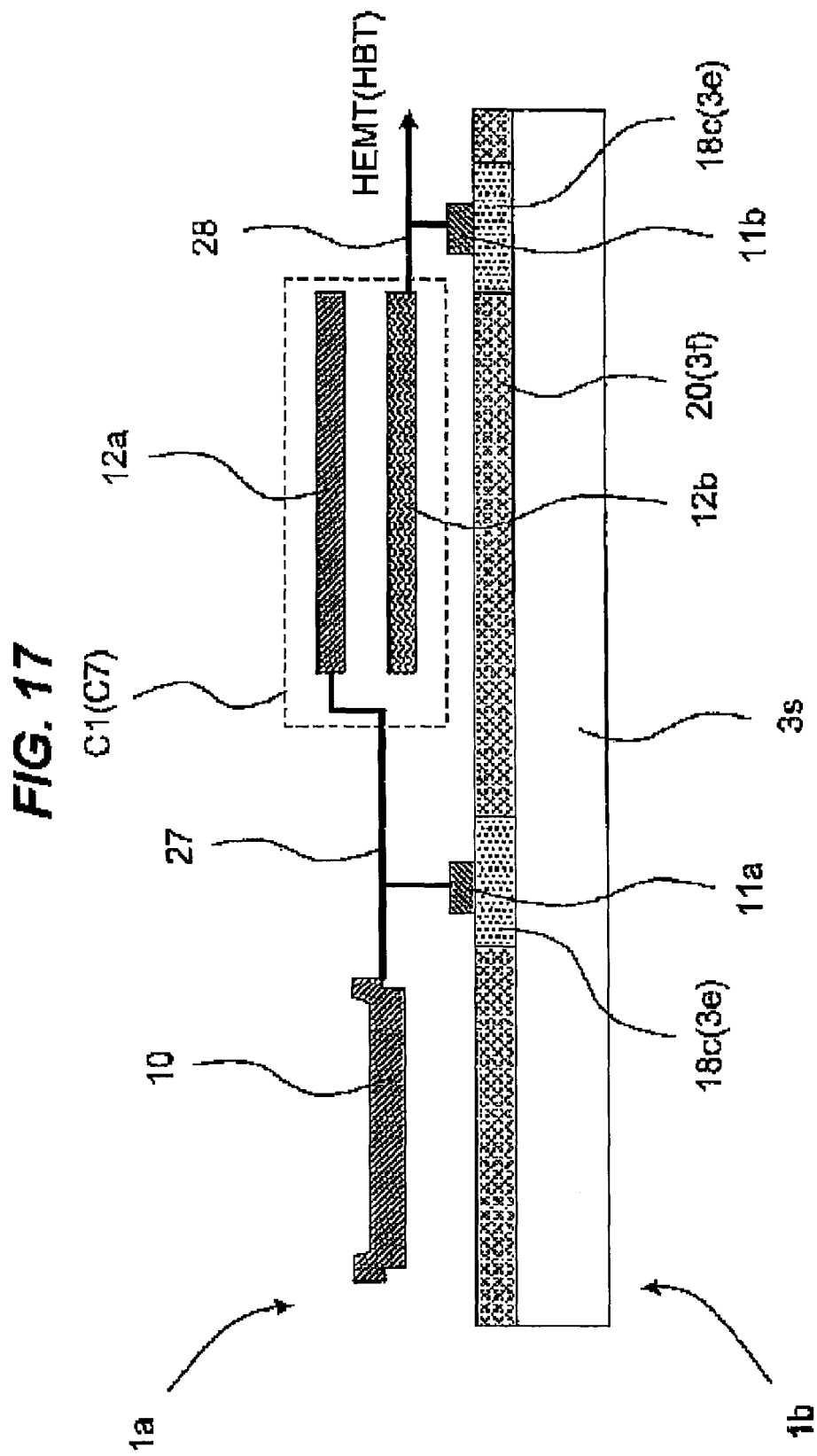
FIG. 17 is a schematic device cross-sectional view (pad and capacitor-upper-electrode coupling & independent conductive epitaxial compound semiconductor film contact form in a surface epitaxial layer conversion isolation method) for explaining various variation examples for a configuration of a non-transistor region in a semiconductor integrated circuit device of an embodiment in the present application.
Figure 18:
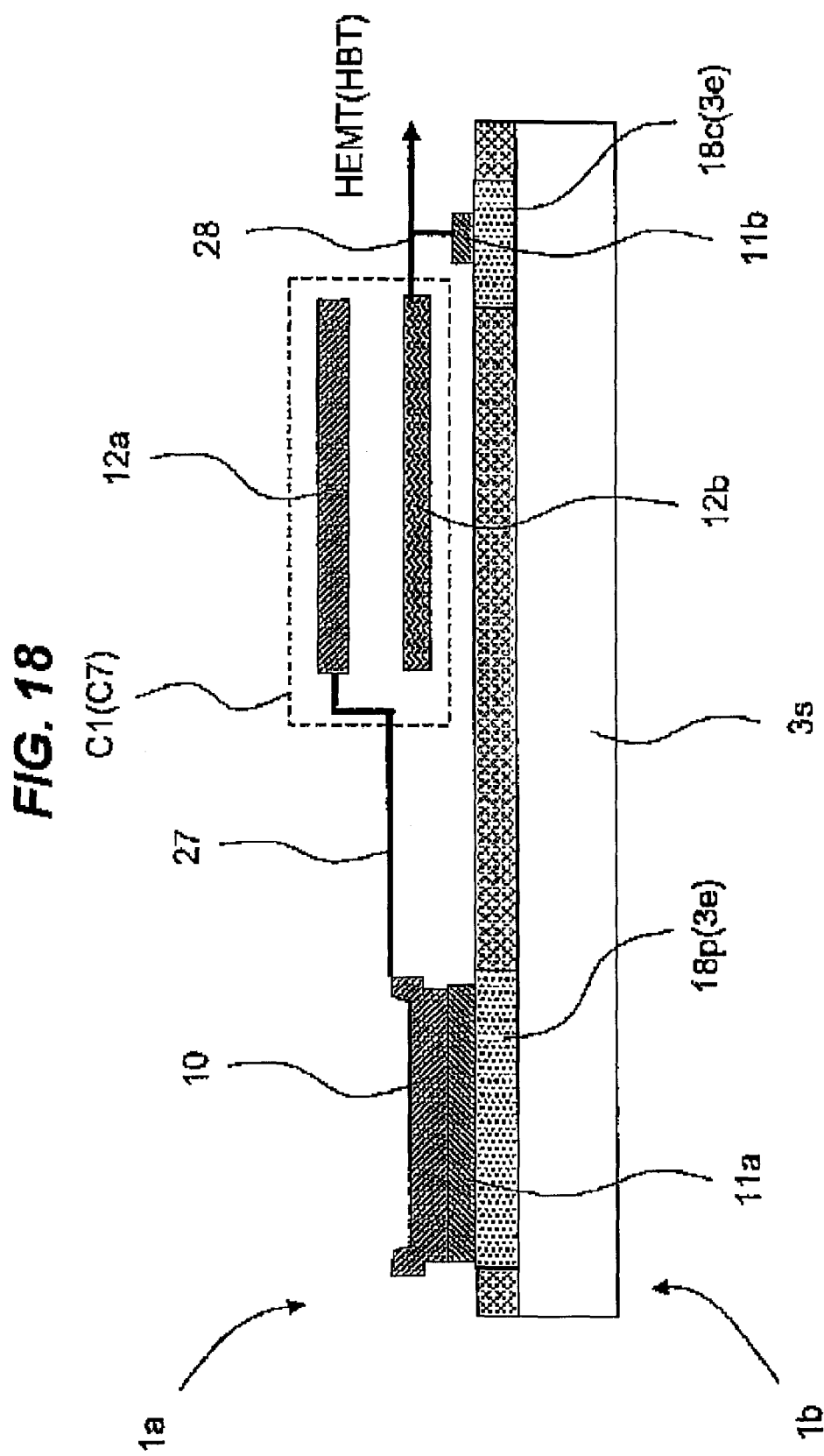
FIG. 18 is a schematic device cross-sectional view (pad and capacitor-upper-electrode coupling & mixed contact form in a surface epitaxial layer conversion isolation method) for explaining various variation examples for a configuration of a non-transistor region in a semiconductor integrated circuit device of an embodiment in the present application.

FIG. 11 is a schematic device cross-sectional view (pad and capacitor-upper-electrode coupling & independent contact form in the substrate-direct method) for explaining the various kinds of variation example for a configuration of the non-transistor region in the semiconductor integrated circuit device of an embodiment in the present application. FIG. 12 is a schematic device cross-sectional view (pad and capacitor-upper-electrode coupling & directly-lower contact form in the substrate-direct method) for explaining the various kinds of variation example for a configuration of the non-transistor region in the semiconductor integrated circuit device of an embodiment in the present application. FIG. 13 is a schematic device cross-sectional view (pad and capacitor-lower-electrode coupling & independent contact form in the substrate-direct method) for explaining the various kinds of variation example for a configuration of the non-transistor region in the semiconductor integrated circuit device of an embodiment in the present application. FIG. 14 is a schematic device cross-sectional view (pad and capacitor-upper-electrode coupling & independent semi-insulating surface layer contact form in the surface epitaxial layer conversion isolation method) for explaining the various kinds of variation example for a configuration of the non-transistor region in the semiconductor integrated circuit device of an embodiment in the present application. FIG. 15 is a schematic device cross-sectional view (pad and capacitor-upper-electrode coupling & directly-lower semi-insulating surface layer contact form in the surface epitaxial layer conversion isolation method) for explaining the various kinds of variation example for a configuration of the non-transistor region in the semiconductor integrated circuit device of an embodiment in the present application. FIG. 16 is a schematic device cross-sectional view (pad and capacitor-lower-electrode coupling & independent semi-insulating surface layer contact form in the surface epitaxial layer conversion isolation method) for explaining the various kinds of variation example for a configuration of the non-transistor region in the semiconductor integrated circuit device of an embodiment in the present application. FIG. 17 is a schematic device cross-sectional view (pad and capacitor-upper-electrode coupling & independent conductive epitaxial compound semiconductor film contact form in the surface epitaxial layer conversion isolation method) for explaining the various kinds of variation example for a configuration of the non-transistor region in the semiconductor integrated circuit device of an embodiment in the present application. FIG. 18 is a schematic device cross-sectional view (pad and capacitor-upper-electrode coupling & mixed contact form in the surface epitaxial layer conversion isolation method) for explaining the various kinds of variation example for a configuration of the non-transistor region in the semiconductor integrated circuit device of an embodiment in the present application. FIG. 19 is a schematic device cross-sectional view (pad and capacitor-upper-electrode coupling & independent mesa-type active region contact form in a substrate-direct & mesa-type active region formation method) for explaining the various kinds of variation example for a configuration of the non-transistor region in the semiconductor integrated circuit device of an embodiment in the present application. FIG. 20 is a schematic device cross-sectional view (pad and capacitor-upper-electrode coupling & over-a-mesa-type-active-region mixed contact form in the substrate-direct & mesa-type active region formation method) for explaining the various kinds of variation example for a configuration of the non-transistor region in the semiconductor integrated circuit device of an embodiment in the present application. According to these drawings, the various kinds of variation example will be explained for a configuration of the non-transistor region in the semiconductor integrated circuit device of an embodiment in the present application.

(1) Substrate-direct method (mainly FIG. 11 to FIG. 13): The various examples to be explained in this subsection are examples without using the semi-insulating surface layer 3f as described in FIG. 8.

(1-1) Pad and capacitor-upper-electrode coupling & independent contact form (mainly FIG. 11): The example of FIG. 11 is a variation example of FIG. 8, and a different point is that the first metal substrate contact portion 11a directly under the external pad 10 is moved to a position independent from the external pad 10.

(1-2) Pad and capacitor-upper-electrode coupling & directly-lower contact form (mainly FIG. 12): The example of FIG. 12 is also a variation example of FIG. 8, and a different point is that the lower electrode 12b itself in the MIM capacitor C1 (C7) becomes the second metal substrate contact portion 11b.

(1-3) Pad and capacitor-lower-electrode coupling & independent contact form (mainly FIG. 13): The example of FIG. 13 is also a variation example of FIG. 8, and a different point is that, in FIG. 11, the lower electrode 12b and the upper electrode are switched to each other in the MIM capacitor C1 (C7).

(2) Variation examples of each component in the surface epitaxial layer conversion isolation method (mainly FIG. 14 to FIG. 18): The various examples to be explained in this subsection are examples of using the semi-insulating surface layer 3f as explained in FIG. 7 and FIG. 9. In the last two examples among these examples, the active region configured with the conductive epitaxial compound semiconductor film 3e (second conductive epitaxial compound semiconductor film) is disposed under each of the first metal substrate contact portion 11a, the second metal substrate contact portion 11b and the peripheries thereof.

(2-1) Pad and capacitor-upper-electrode coupling & independent semi-insulating surface layer contact form (mainly FIG. 14): The example of FIG. 14 is a variation example of FIG. 7, and a different point is that the first metal substrate contact portion 11a directly under the external pad 10 is moved to a position independent from the external pad 10.

(2-2) Pad and capacitor-upper-electrode coupling & directly-lower semi-insulating surface layer contact form (mainly FIG. 15): The example of FIG. 15 is also a variation example of FIG. 7, and a different point is that the lower electrode 12b itself of the MIM capacitor C1-C7) becomes the second metal substrate contact portion 11b.

(2-3) Pad and capacitor-lower-electrode coupling & independent semi-insulating surface layer contact form (mainly FIG. 16): The example of FIG. 16 is also a variation example of FIG. 7, and a different point is that, in FIG. 14, the lower electrode 12b and the upper electrode are switched to each other in the MIM capacitor C1 (C7).

(2-4) Pad and capacitor-upper-electrode coupling & independent conductive epitaxial compound semiconductor film contact form (mainly FIG. 17): The example of FIG. 17 is a variation example of FIG. 9, and a different point is that the first metal substrate contact portion 11a directly under the external pad 10 is moved to a position independent from the external pad 10.

(2-5) Pad and capacitor-upper-electrode coupling & mixed contact form (mainly FIG. 18): The example of FIG. 18 shows approximately the same structure pattern as the example of FIG. 9.

(3) Substrate-direct & mesa-type active region formation method (mainly FIG. 19 and FIG. 20): The various examples to be explained in this subsection are eclectic structure patterns of FIG. 8 and FIG. 9, and are examples in which a mesa-shaped active region 18c is disposed to be configured with the conductive epitaxial compound semiconductor film 3e (second conductive epitaxial compound semiconductor film) under each of the first metal substrate contact portion 11a and the second metal substrate contact portion 11b and the peripheries thereof in the non-transistor region TN as in the transistor region TR without the use of the semi-insulating surface layer 3f.

(3-1) Pad and capacitor-upper-electrode coupling & independent mesa-type active region contact form (mainly FIG. 19): The example of FIG. 19 is a variation example of FIG. 8, and a feature point in the example of FIG. 19 is that the first metal substrate contact portion 11a and the second metal substrate contact portion 11b are formed over the device surface 1a of the semi-insulating compound semiconductor substrate 3s via the mesa-shaped active regions 18c each configured with the conductive epitaxial compound semiconductor film 3e (second conductive epitaxial compound semiconductor film), for example.

(3-2) Pad and capacitor-upper-electrode coupling & over-a-mesa-type-active-region mixed contact form (mainly FIG. 20): The example of FIG. 20 is a variation example of FIG. 8, and a feature point of the example of FIG. 20 is that the first metal substrate contact portion 11a and the second metal substrate contact portion 11b are formed over the device surface 1a of the semi-insulating compound semiconductor substrate 3s via the mesa-shaped active regions 18c each configured with the conductive epitaxial compound semiconductor film 3e (second conductive epitaxial compound semiconductor film), for example.

8. Explanation of a manufacturing process corresponding to FIG. 7 (HEMT surface epitaxial layer conversion isolation process) (mainly FIG. 21 to FIG. 28) The manufacturing process of this section is an example of various kinds of process to realize the structure of FIG. 7.

Figure 21:
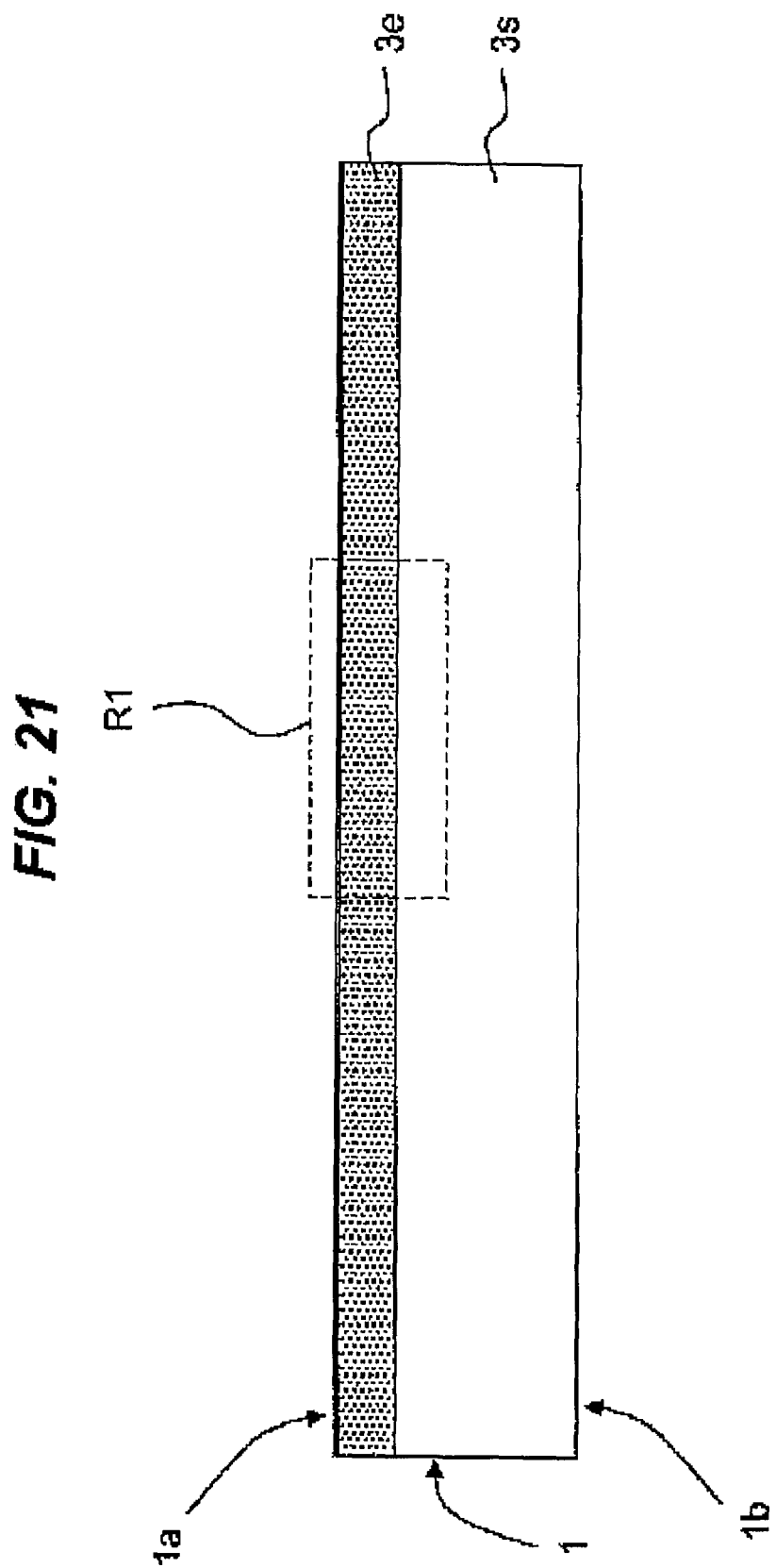
FIG. 21 is a device cross-sectional view in a manufacturing step (conductive epitaxial compound semiconductor film formation step) for explaining a major part of a manufacturing process (HEMT surface epitaxial layer conversion isolation process) corresponding to FIG. 7.
Figure 22:
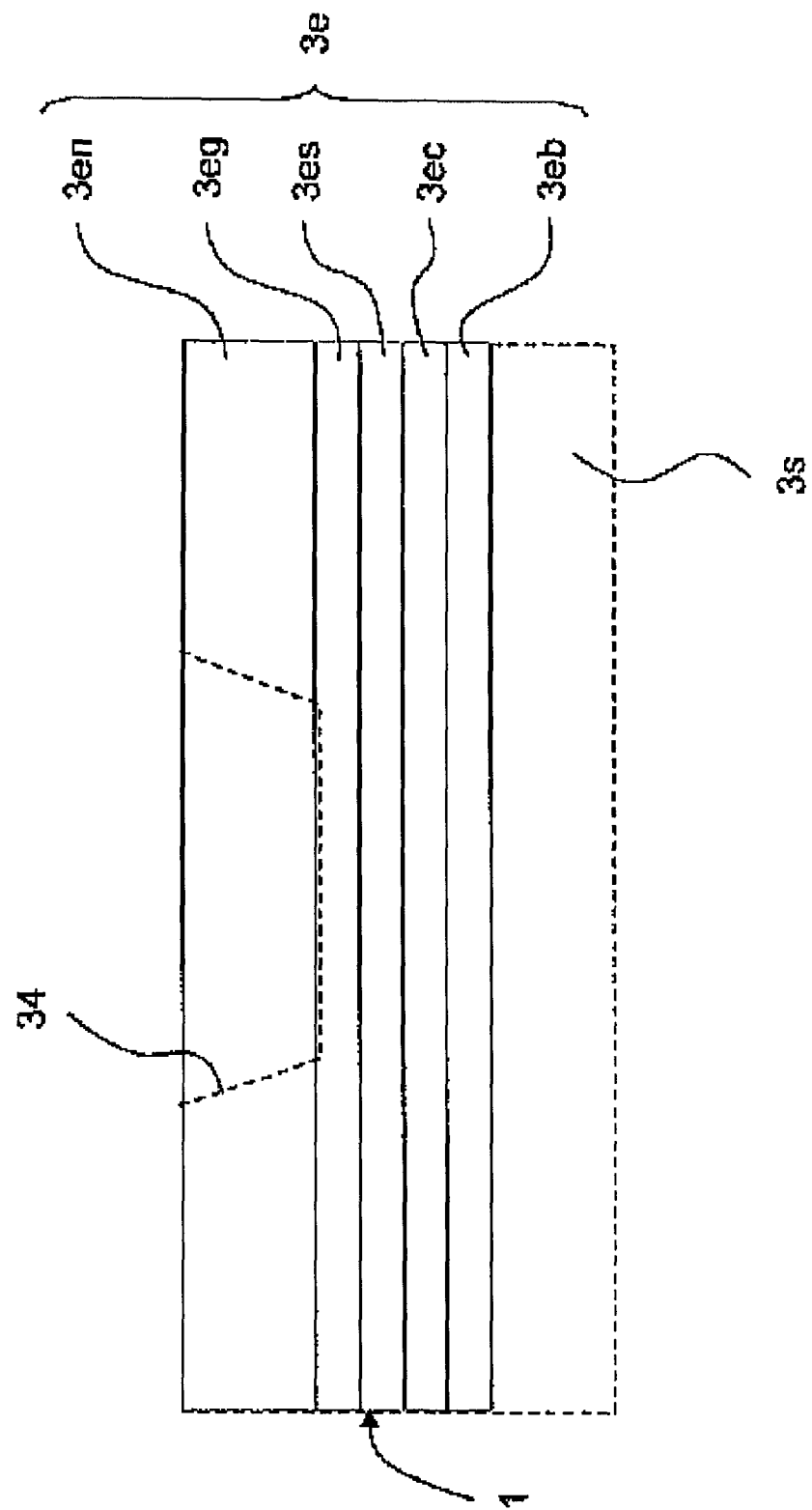
FIG. 22 is an enlarged cross-sectional view of a conductive epitaxial compound semiconductor film periphery cut-out region R1 of FIG. 21.
Figure 23:
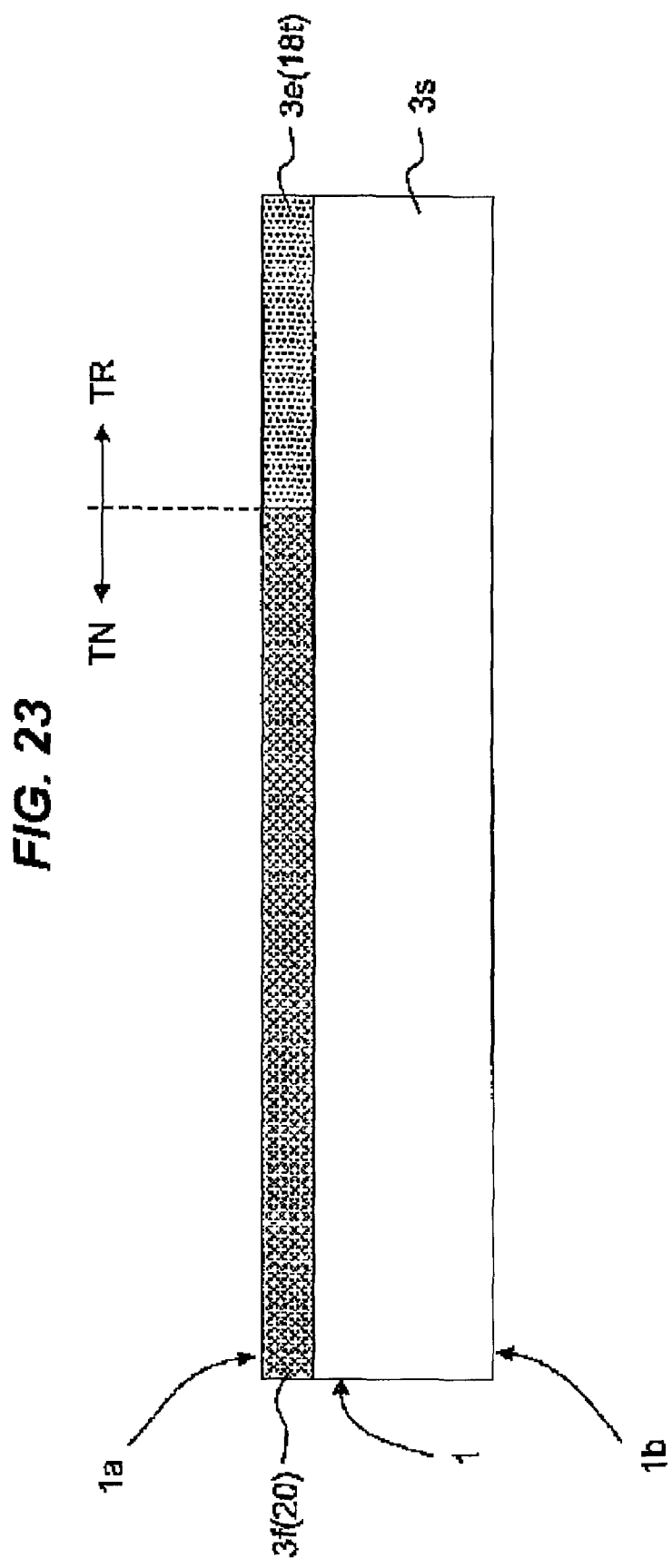
FIG. 23 is a device cross-sectional view in a manufacturing step (semi-insulating surface layer formation step) for explaining a major part of a manufacturing process (HEMT surface epitaxial layer conversion isolation process) corresponding to FIG. 7.
Figure 24:
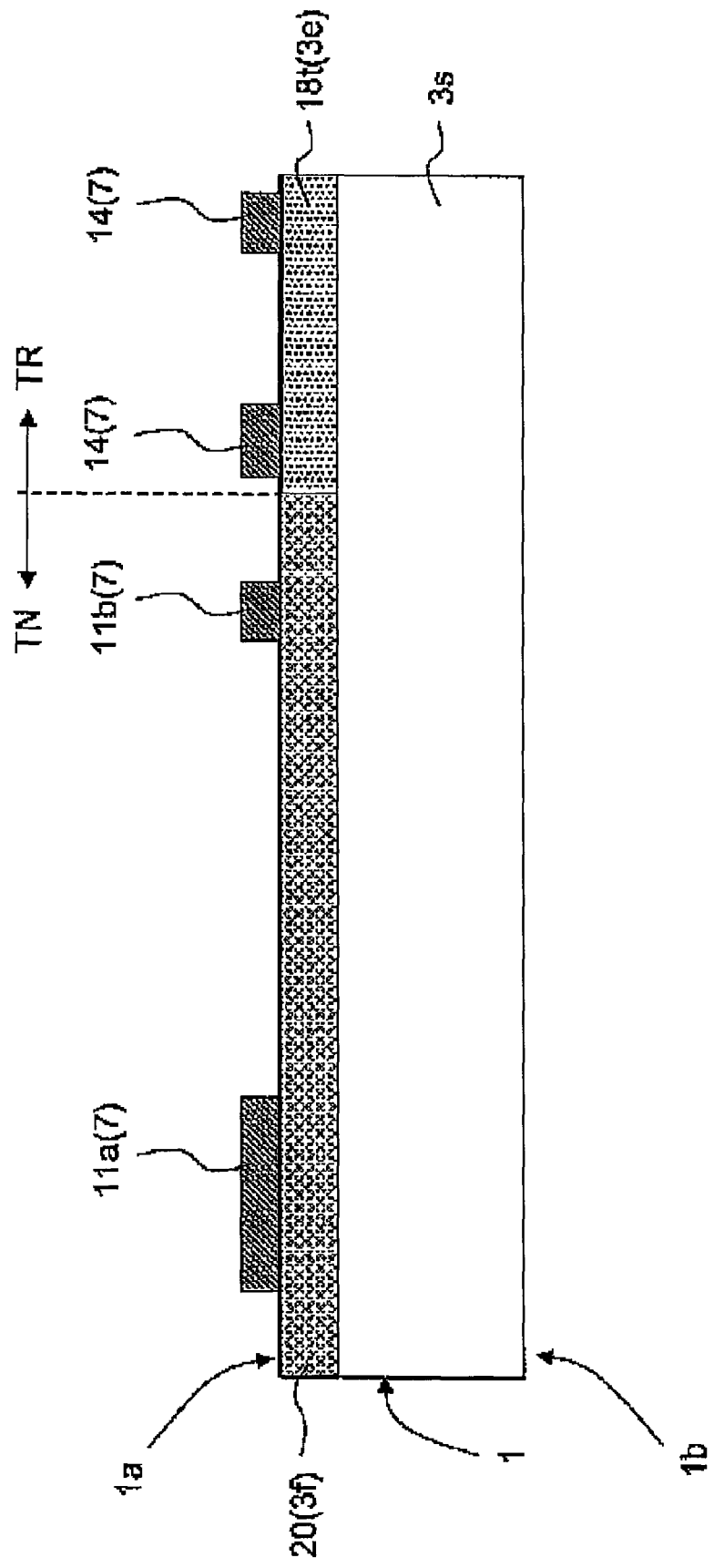
FIG. 24 is a device cross-sectional view in a manufacturing step (lower layer metal wiring film formation step) for explaining a major part of a manufacturing process (HEMT surface epitaxial layer conversion isolation process) corresponding to FIG. 7.
Figure 25:
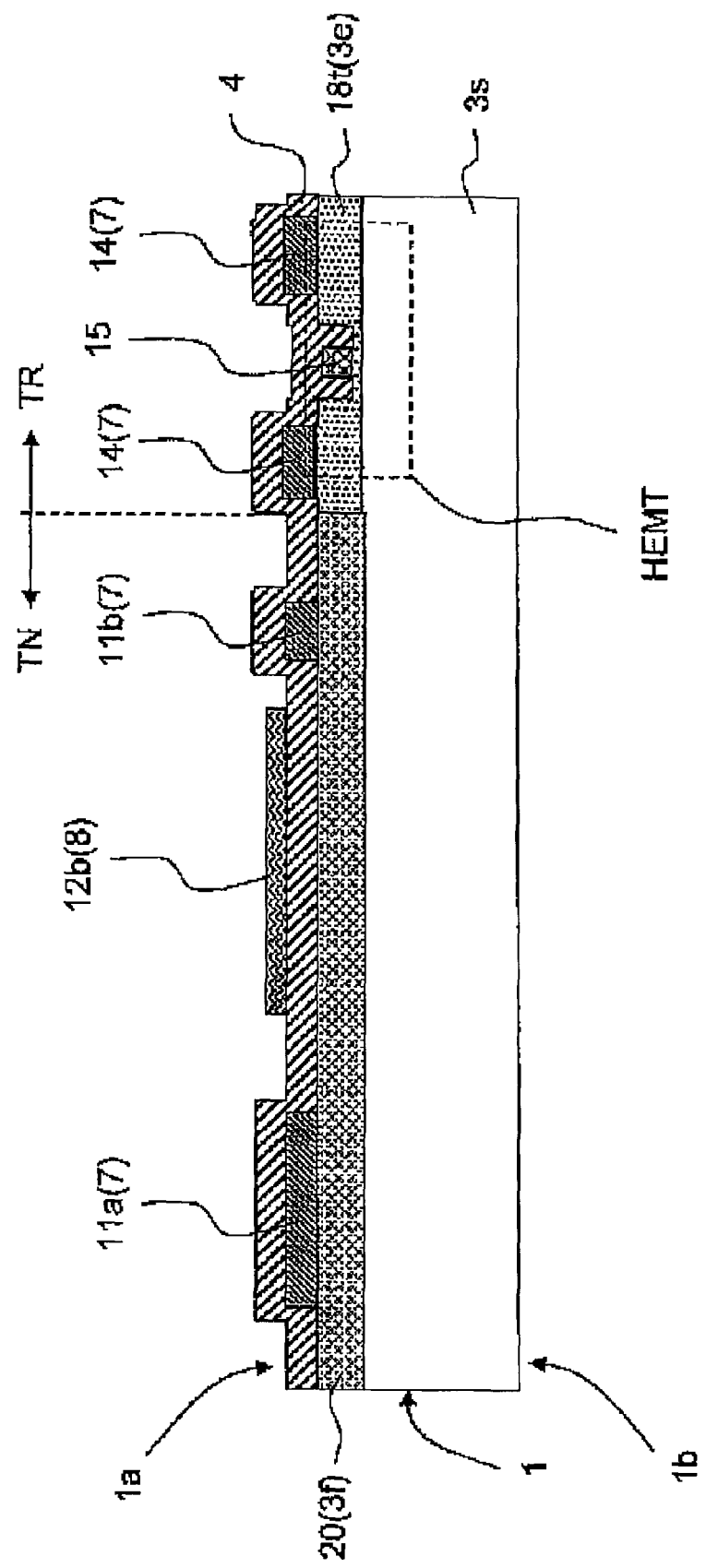
FIG. 25 is a device cross-sectional view in a manufacturing step (gate periphery etching and gate electrode, substrate surface insulating film, and intermediate metal wiring film formation step) for explaining a major part of a manufacturing process (HEMT surface epitaxial layer conversion isolation process) corresponding to FIG. 7.
Figure 26:
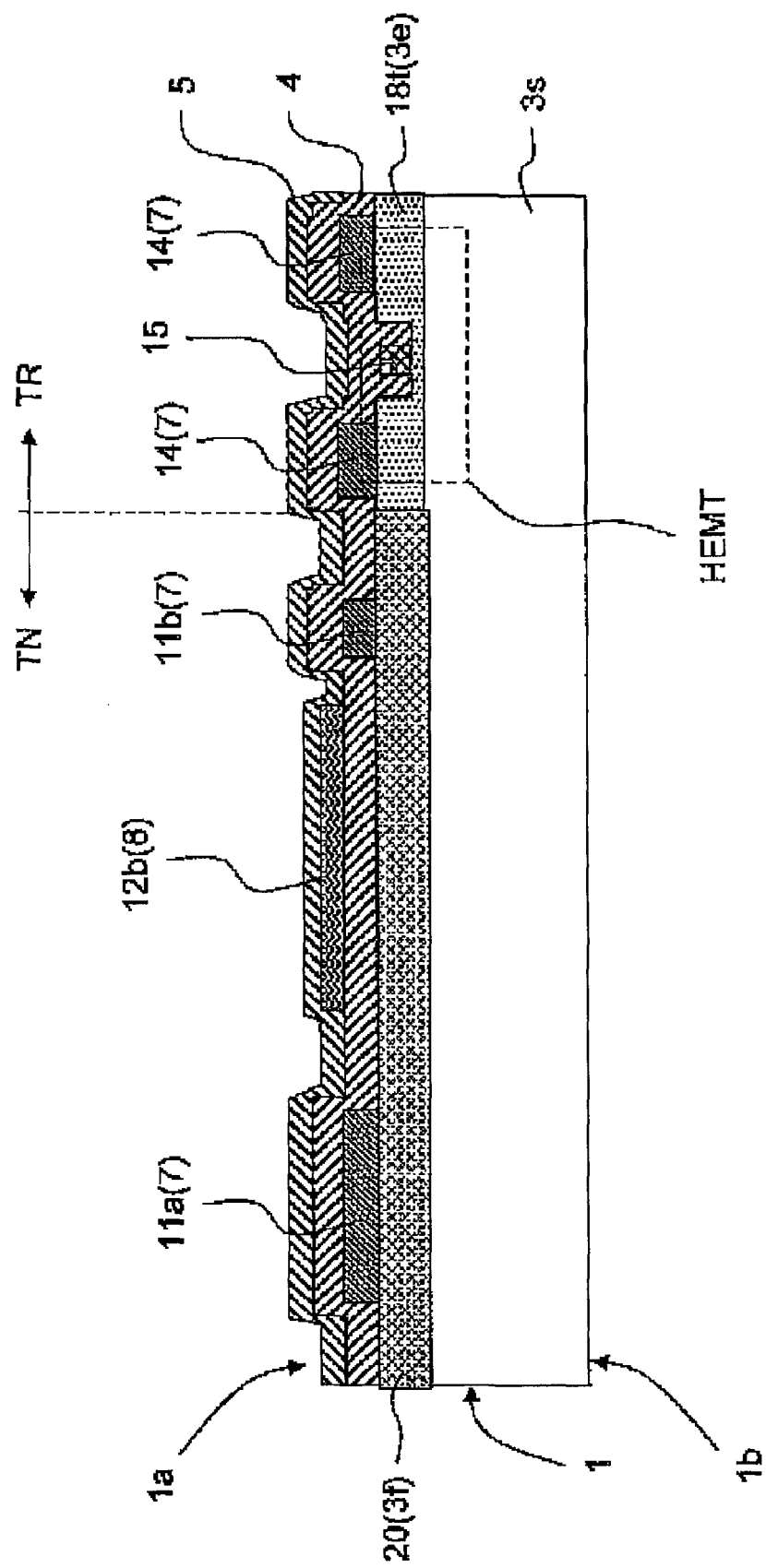
FIG. 26 is a device cross-sectional view in a manufacturing step (interlayer insulating film formation step) for explaining a major part of a manufacturing process (HEMT surface epitaxial layer conversion isolation process) corresponding to FIG. 7.
Figure 27:
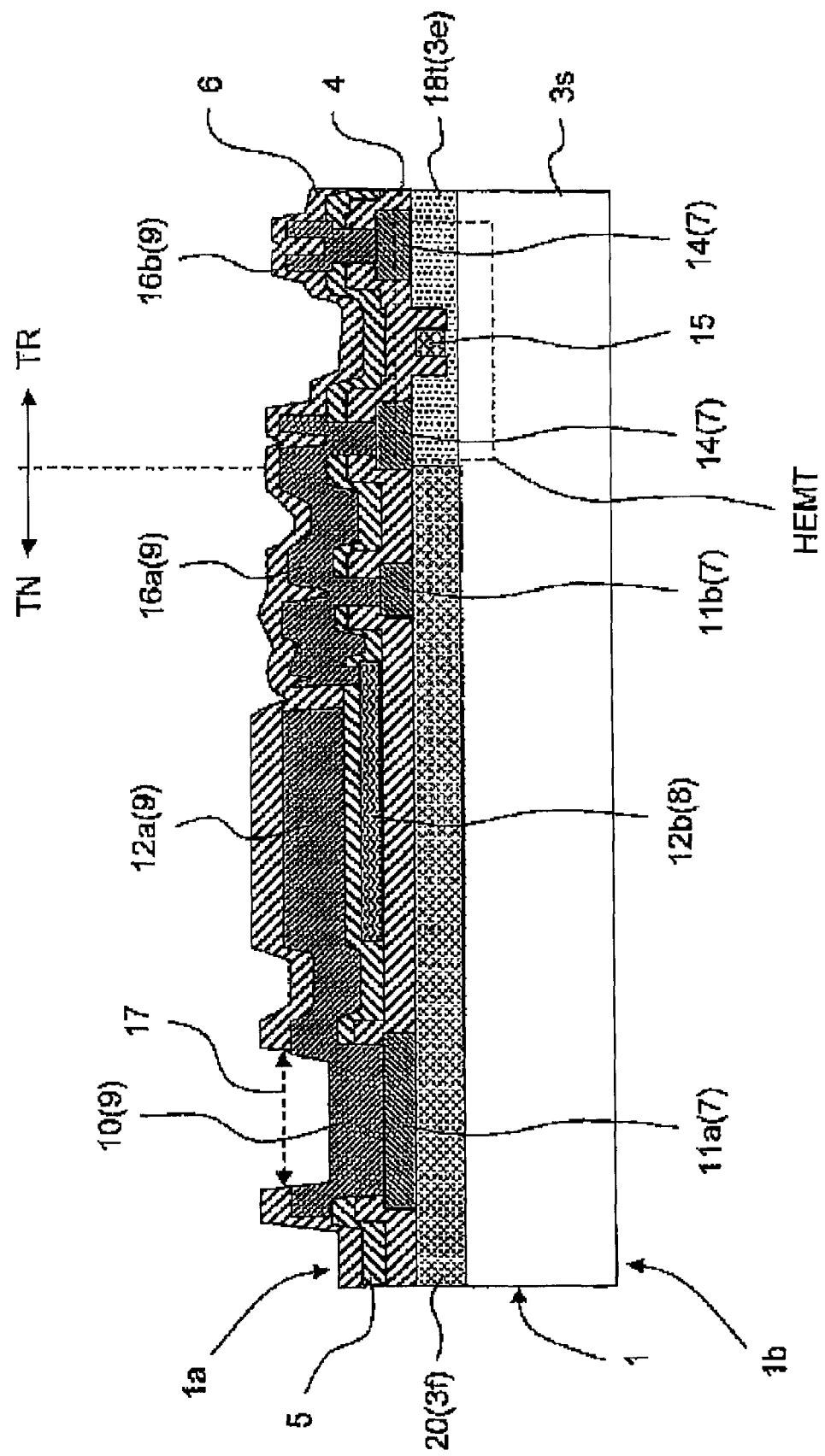
FIG. 27 is a device cross-sectional view in a manufacturing step (upper layer metal wiring film, final passivation insulating film, and pad opening formation step) for explaining a major part of a manufacturing process (HEMT surface epitaxial layer conversion isolation process) corresponding to FIG. 7.
Figure 28:
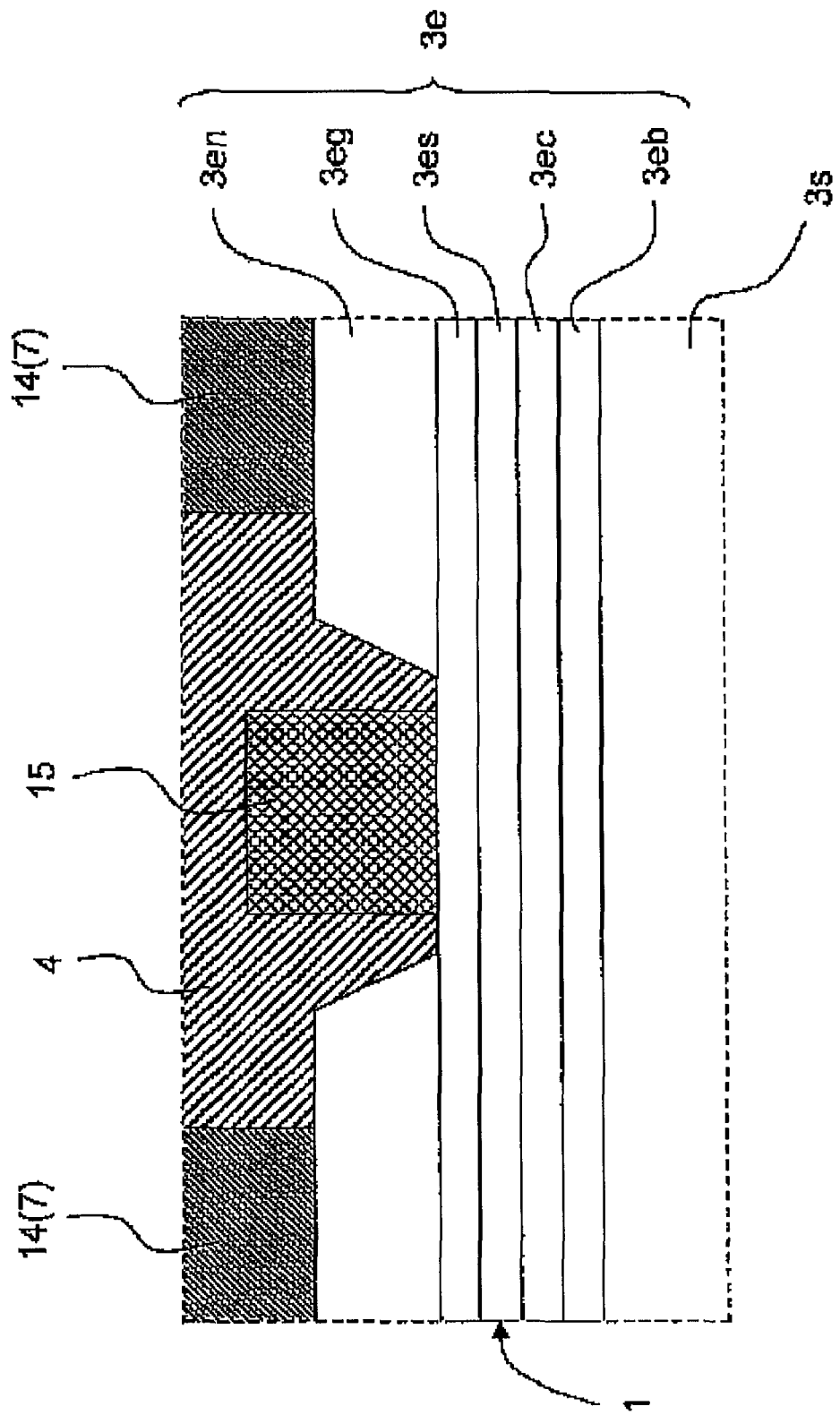
FIG. 28 is an enlarged cross-sectional view of a HEMT element (HEMT) portion of FIG. 27.

FIG. 21 is a device cross-sectional view in a manufacturing step (conductive epitaxial compound semiconductor film formation step) for explaining a major part of the manufacturing process corresponding to FIG. 7 (HEMT surface epitaxial layer conversion isolation process). FIG. 22 is an enlarged cross-sectional view of a conductive epitaxial compound semiconductor film periphery cut-out region R1 of FIG. 21. FIG. 23 is a device cross-sectional view in a manufacturing step (semi-insulating surface layer formation step) for explaining a major part of the manufacturing process corresponding to FIG. 7 (HEMT surface epitaxial layer conversion isolation process). FIG. 24 is a device cross-sectional view in a manufacturing step (lower layer metal wiring film formation step) for explaining a major part of the manufacturing process corresponding to FIG. 7 (HEMT surface epitaxial layer conversion isolation process). FIG. 25 is a device cross-sectional view in a manufacturing step (gate periphery etching, and gate electrode, substrate surface insulating film, and intermediate metal wiring film formation step) for explaining a major part of the manufacturing process corresponding to FIG. 7 (HEMT surface epitaxial layer conversion isolation process). FIG. 26 is a device cross-sectional view in a manufacturing step (interlayer insulating film formation step) for explaining a major part of the manufacturing process corresponding to FIG. 7 (HEMT surface epitaxial layer conversion isolation process). FIG. 27 is a device cross-sectional view in a manufacturing step (upper layer metal wiring film, final passivation insulating film, and pad opening formation step) for explaining a major part of the manufacturing process corresponding to FIG. 7 (HEMT surface epitaxial layer conversion isolation process). FIG. 28 is an enlarged cross-sectional view of the portion of the HEMT element (HEMT) in FIG. 27. According to these drawings, the manufacturing process corresponding to FIG. 7 (HEMT surface epitaxial layer conversion isolation process) will be explained.

First, a semi-insulating GaAs wafer having a resistivity of approximately $1 \times 10^7$ Ωcm to $1 \times 10^8$ Ωcm, for example, (diameter is approximately 100 millimeters, for example, and thickness is approximately 600 to 700 micrometers, for example) is provided. Note that the wafer diameter may be approximately 50 millimeters, approximately 76 millimeters, approximately 150 millimeters, or larger if applicable. This point is the same as in the case of using a semi-insulating InP wafer. Here, a semi-insulating GaAs wafer 1 will be explained specifically as an example.

As shown in FIG. 21, a multilayered GaAs-based epitaxial film, that is, the conductive epitaxial compound semiconductor film 3e (thickness is approximately 345 nm, for example) is epitaxially grown over approximately the whole device surface 1a, that is, the whole first major surface (opposite surface to the second major surface 1b) in the semi-insulating GaAs wafer is (1). For the epitaxial growth, an MO (Metal Organic) epitaxial growth method, an MB (Molecular Beam) epitaxial growth method, an AL (Atomic Layer) epitaxial growth method, or the like is used as needed.

An enlarged cross-sectional view of the conductive epitaxial compound semiconductor film periphery cut-out region R1 of FIG. 21 is shown in FIG. 22. As shown in FIG. 22, in the layer configuration of the conductive epitaxial compound semiconductor film 3e, the lower two layers are an un-doped AlGaAs buffer layer 3eb (thickness is approximately 200 nm, for example) and an un-doped InGaAs channel layer 3ec (thickness is approximately 10 nm, for example, and In composition is approximately 22%, for example). The upper three layers are an $n^+$-type AlGaAs spacer layer 3eg (thickness is approximately 3 nm, for example, and Al composition is approximately 25%, for example), an n-type AlGaAs barrier layer 3en (thickness is approximately 30 nm, for example, and Al composition is approximately 25%, for example), and an $n^+$-type GaAs cap layer 3es (having a thickness of approximately 100 nm, for example, and doped with silicon). Here, the doping of the $n^+$-type AlGaAs spacer layer 3eg and the n-type AlGaAs barrier layer 3en is performed by silicon planar doping at these boundary surfaces, for example. As a preferable dose amount therein, it is possible to illustrate approximately $5 \times 10^{12}/cm^2$, for example.

Next, as shown in FIG. 23, the conductive epitaxial compound semiconductor film 3e is converted into the semi-insulating surface layer 3f by ion implantation of fluorine (alternatively, helium, boron, hydrogen, or the like), for example, into approximately the whole surface of the non-transistor region TN from the device surface 1a side of the wafer 1 in a state in which the transistor region TR over the conductive epitaxial compound semiconductor film 3e is covered by a resist film or the like. Thereby, the surface of the transistor region TR becomes the active region 18t and the surface of the non-transistor region TN becomes the element isolation region 20. Here, as a preferable fluorine (F+) ion implantation condition, it is possible to illustrate the following. That is, the first time dose amount is approximately $4.0 \times 10^{13}/cm^2$ (implantation energy is approximately 250 KeV, for example). Further, the second time dose amount is approximately $3.0 \times 10^{13}/cm^2$ (implantation energy is approximately 100 KeV, for example), and the third time dose amount is approximately $2.0 \times 10^3/cm^2$ (implantation energy is approximately 40 KeV, for example).

Next, as shown in FIG. 24, the source-drain electrode 14, the first metal substrate contact portion 11a, and the second metal substrate contact portion 11b are formed to be configured with the lower-layer metal wiring film 7 by a lift-off method, over the device surface 1a of the wafer 1, in a predetermined portions of the active region 18t in the transistor region TR and the element isolation region 20 in the non-transistor region TN. This processing by the lift-off method is performed as follows, for example. That is, multilayer metal films configuring the lower-layer metal wiring film 7 are deposited sequentially over the whole surface by an evaporation method, sputtering film deposition, or the like, in a state in which a resist film having an opening at a position where the electrode or the like is to be formed is formed over the device surface 1a of the wafer 1. After that, when the resist film is removed together with the multilayer metal films thereover, the multilayer metal films remain only at the resist opening. Here, this evaporation method or sputtering film deposition process is performed in the following procedure, for example. That is, first, an AuGe film is deposited in approximately 50 nm, for example, by the sputtering film deposition, for example. Next, a nickel film is deposited thereover in approximately 10 nm, for example, by the sputtering film deposition, for example. Further, a gold film is deposited thereover in approximately 240 nm, for example. Successively, the resist film is removed together with the multilayer metal films thereover and then the source-drain electrode 14, the first metal substrate contact portion 11a and the second metal substrate contact portion 11b remain over the surface of the wafer 1 on the device surface 1a side. Note that, here, the contact between the source-drain electrode 14 and the $n^+$-type GaAs cap layer 3en as the foundation (FIG. 22) is an ohmic contact.

Next, as shown in FIG. 25, FIG. 28 and FIG. 22, a trench 34 is formed by wet etching, for example, over the device surface 1a of the wafer 1 in the active region 18t of the transistor region TR. Here, as preferable wet etching solution, it is possible to illustrate APM (Ammonia-Hydrogen Peroxide Mixture) or the like, for example. Note that this trench 34 formation can be performed also by dry etching (using etching gas such as $SiCl_4$, for example).

Next, the gate electrode 15 is formed by a lift-off method, for example, so as to traverse this trench 34 longitudinally. This lift-off process is performed in a procedure as follows, for example. That is, first, a titanium film is deposited in approximately 50 nm, for example, by sputtering film deposition, for example, in a state in which a resist film having an opening at a portion where the gate electrode 15 is to be formed is formed over the surface of the wafer 1 on the device surface 1a side. Next, a platinum film of approximately 50 nm, for example, is deposited thereover by sputtering film deposition, for example. Further, a gold film is deposited thereover in approximately 300 nm, for example. Successively, the resist film is removed together with the multilayer metal films thereover, and then the gate electrode 15 remains. The above sputtering film deposition may be replaced by an evaporation method.

Next, a silicon nitride film is deposited to have a thickness of approximately 100 nm, for example, as the substrate surface insulating film 4 (first insulating film) by plasma CVD (Chemical Vapor Deposition), for example, over approximately the whole surface of the wafer 1 on the device surface 1a side.

Next, the second capacitor electrode 12b (lower electrode) of the MIM capacitor C1 (FIG. 7) is formed to be configured with the intermediate metal wiring film 8 over the silicon nitride film 4 by a lift-off method, for example. This lift-off process is performed in a procedure as follows, for example. That is, first, a titanium film is deposited in approximately 50 nm, for example, by sputtering film deposition, for example, in a state in which a resist film having an opening at a position where the lower electrode 12 is to be formed is formed over the surface of the wafer 1 on the device surface 1a side. Next, a gold film is deposited thereover in approximately 400 nm, for example, by sputtering film deposition, for example. Further, a titanium film is deposited thereover in approximately 50 nm, for example. Successively, the resist film is removed together with the multilayer metal films thereover, and then the second capacitor electrode 12b (lower electrode) remains.

Next, as shown in FIG. 26, a silicon nitride film having a thickness of approximately 100 nm, for example, is deposited as the interlayer insulating film 5 over approximately the whole surface of the wafer 1 on the device surface 1a side by plasma CVD, for example.

Next, as shown in FIG. 27, a necessary via is formed in the interlayer insulating film 5 by normal lithography, or the like. Next, the external pad 10, the first capacitor electrode 12a (upper electrode) of the MIM capacitor C1 (FIG. 7), the source-drain lead wirings 16a and 16b, and the like are formed to be configured with the upper-layer metal wiring film 9 by a lift-off method, for example, over the surface of the wafer 1 on the device surface 1a side. This lift-off process is performed in a procedure as follows, for example. That is, a resist film having openings at positions where the external pad 10, the first capacitor electrode 12a (upper electrode) of the MIM capacitor C1 (FIG. 7), the source-drain lead wirings 16a and 16b, and the like are to be formed to be configured with the upper-layer metal wiring film 9, is formed over the surface of the wafer 1 on the device surface 1a side. In this state, first, a titanium film is deposited in approximately 50 nm, for example, by sputtering film deposition, for example. Next, a gold film is deposited thereover in approximately 900 nm, for example, by sputtering film deposition, for example. Further, a titanium film is deposited thereover in approximately 50 nm, for example. Successively, the resist film is removed together with the multilayer metal films, and then the external pad 10, the first capacitor electrode 12a (upper electrode) of the MIM capacitor C1 (FIG. 7), the source-drain lead wirings 16a and 16b, and the like remain.

Next, a silicon nitride film having a thickness of approximately 300 nm, for example, is deposited as the final passivation insulating film 6 over approximately the whole surface of the wafer 1 on the device surface 1a side by plasma CVD, for example. Next, the pad opening 17 is formed in the final passivation insulating film 6 over the external pad 10 by normal lithography, for example.

After that, the wafer 1 is caused to have a thickness of approximately 150 micrometers, for example, (preferable range is approximately 80 micrometers to 300 micrometers, for example) by back grinding processing. Next, the wafer 1 is divided into individual chips 2 by dicing or the like, and packaging processing is performed as needed to complete a final device.

9. Explanation of a manufacturing process corresponding to FIG. 8 (HEMT substrate-direct process) (mainly FIG. 29) The manufacturing process of this section is an example of various kinds of process to realize the structure of FIG. 8. Note that FIG. 29 corresponds to FIG. 23 in section 8, and the process except the part shown in FIG. 23 is approximately the same as the process shown in FIG. 21 to FIG. 22 and FIG. 24 to FIG. 28 and explanation thereof will not be repeated.

Figure 29:
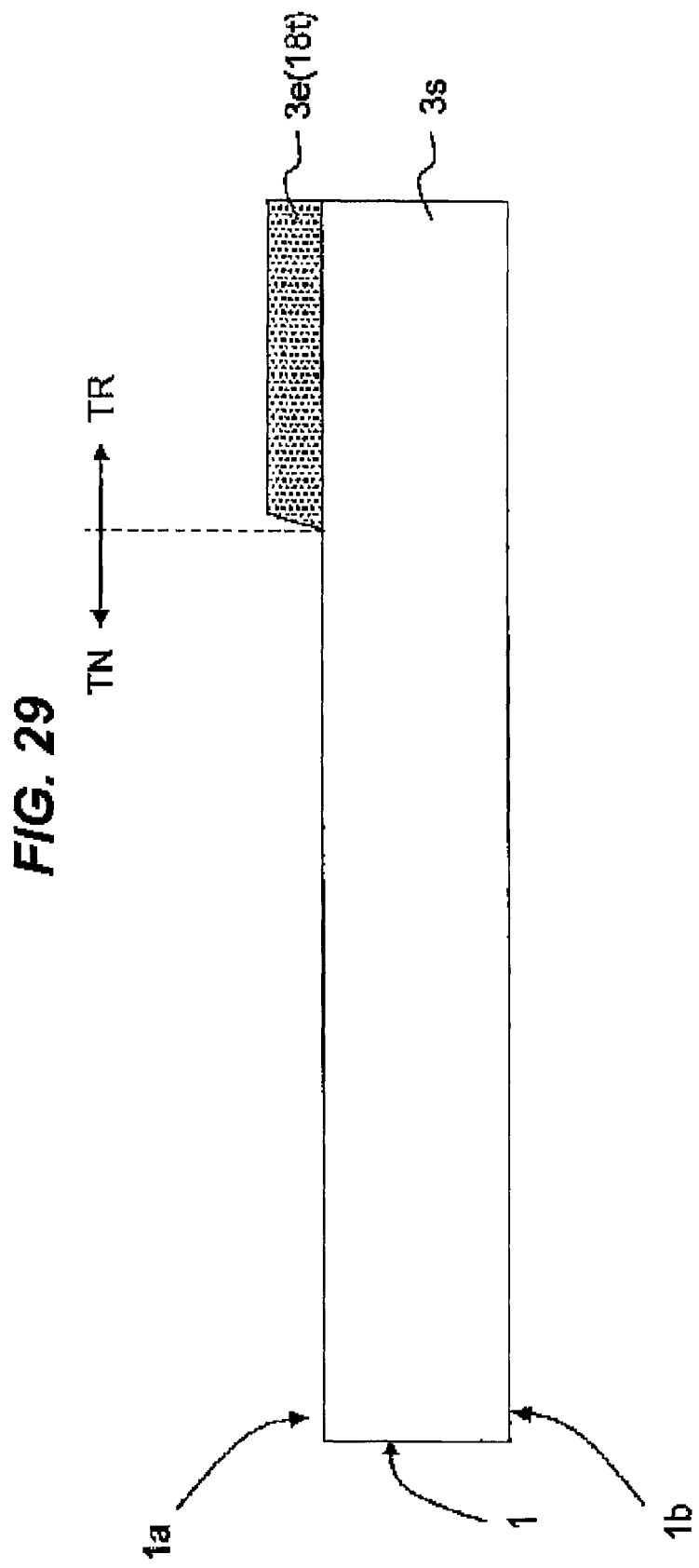
FIG. 29 is a device cross-sectional view in a manufacturing step (active region formation step in a transistor region corresponding to FIG. 23 in section 8) for explaining a major part of a manufacturing process (HEMT substrate-direct process) corresponding to FIG. 8.

FIG. 29 is a device cross-sectional view in a manufacturing step (active region formation step in the transistor region corresponding to FIG. 23 in section 8) for explaining a major part of the manufacturing process (HEMT substrate-direct process) corresponding to FIG. 8. According to this drawing, the manufacturing process (HEMT substrate-direct process) corresponding to FIG. 8 will be explained.

In the state of FIG. 21, the active region 18t is formed in the transistor region TR by means of removing the conductive epitaxial compound semiconductor film 3e at a portion where the non-transistor region TN is formed, by wet etching, for example, as shown in FIG. 29, while the region where the transistor region TR is to be formed in the surface of the wafer 1 on the device surface 1a side is covered by a resist film. Here, as preferable wet etching solution, it is possible to illustrate APM (Ammonia-Hydrogen Peroxide Mixture) and the like. Note that the formation of the active region 18t can be performed by dry etching (using etching gas such as $SiCl_4$ or the like).

After that, the process moves to the step of FIG. 24 and the following steps.

10. Explanation of a manufacturing process corresponding to FIG. 9 (HEMT surface epitaxial layer conversion isolation & $N^+$-foundation process) (mainly FIG. 30 and FIG. 31) The manufacturing process of this section is an example of various kinds of process to realize the structure of FIG. 9. Note that FIG. 30 corresponds to FIG. 23 in section 8 and FIG. 31 corresponds to FIG. 27, and the process except the part shown in FIG. 23 and FIG. 27 is approximately the same as the process shown in FIG. 21 to FIG. 22, FIG. 24 to FIG. 26, and FIG. 28 and explanation thereof will not be repeated.

Figure 30:
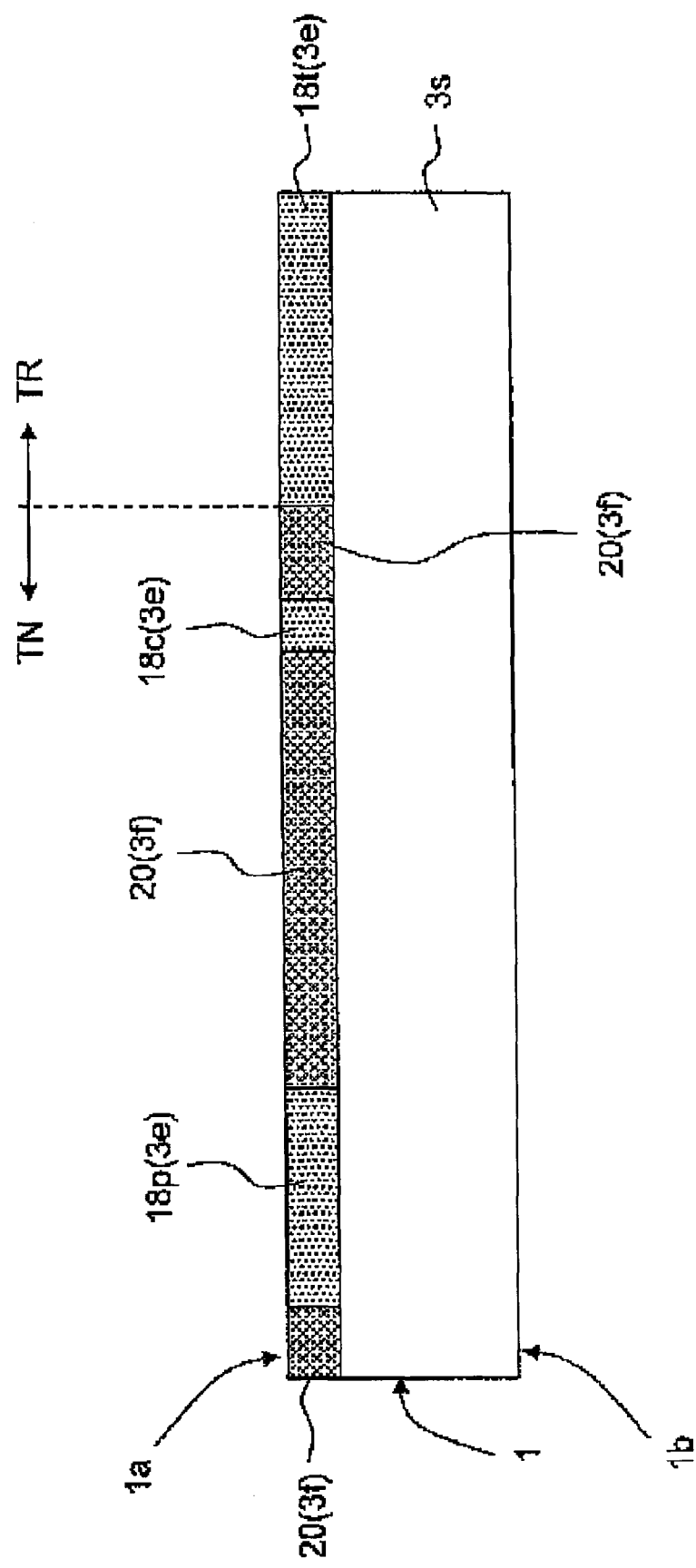
FIG. 30 is a device cross-sectional view in a manufacturing step (semi-insulating surface layer formation step corresponding to FIG. 23 in section 8) for explaining a major part of a manufacturing process (HEMT surface epitaxial layer conversion isolation & $N^+$-foundation process) corresponding to FIG. 9.
Figure 31:
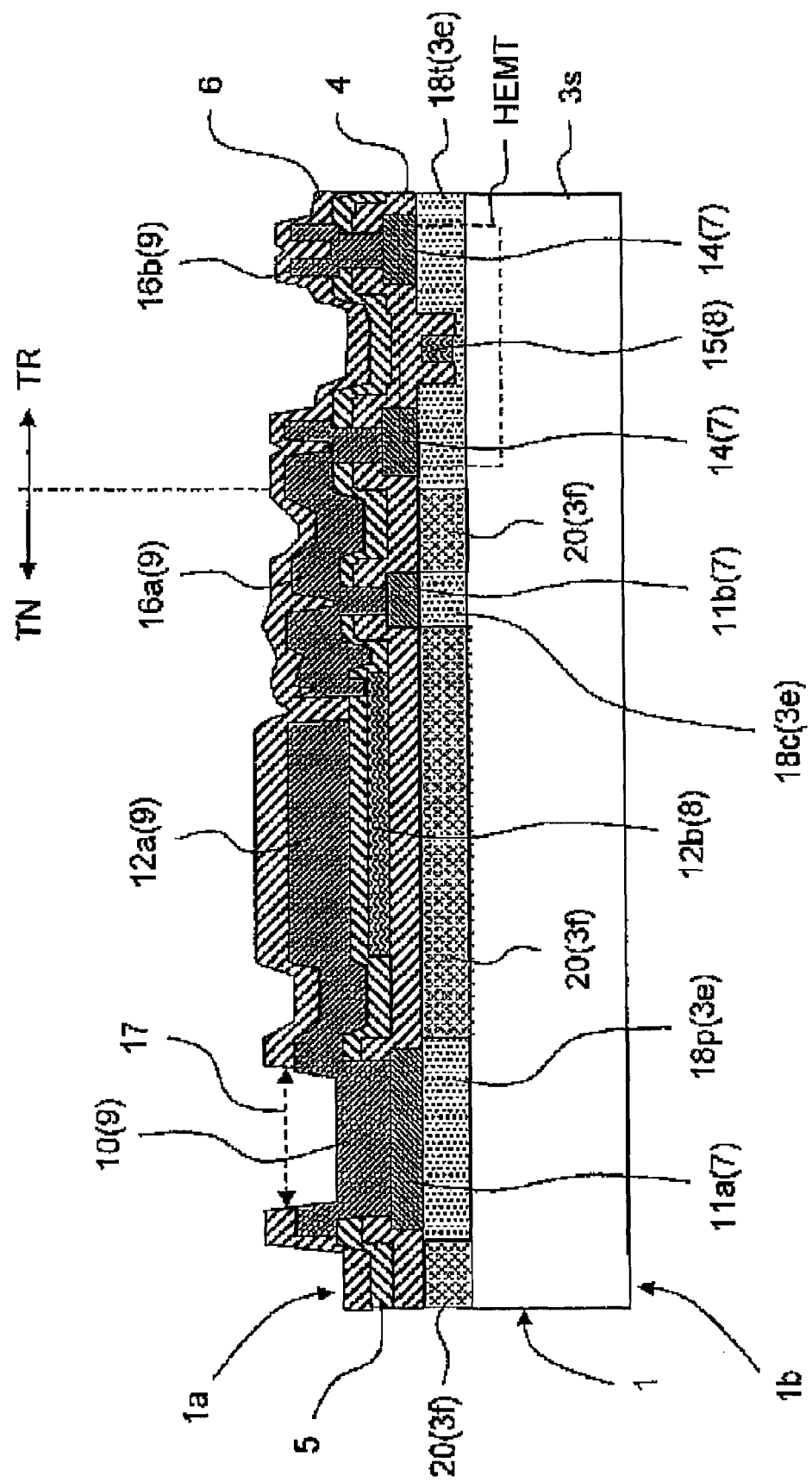
FIG. 31 is a device cross-sectional view in a manufacturing step (upper layer metal wiring film, final passivation insulating film, and pad opening formation step corresponding to FIG. 27 in section 8) for explaining a major part of a manufacturing process (HEMT surface epitaxial layer conversion isolation & $N^+$-foundation process) corresponding to FIG. 9.

FIG. 30 is a device cross-sectional view in a manufacturing step (semi-insulating surface layer formation step corresponding to FIG. 23 in section 8) for explaining a major part of the manufacturing process (HEMT surface epitaxial layer conversion isolation & $N^+$-foundation process) corresponding to FIG. 9. FIG. 31 is a device cross-sectional view in a manufacturing step (upper-layer metal wiring film, final passivation insulating film, and pad opening formation step corresponding to FIG. 27 in section 8) for explaining a major part of the manufacturing process (HEMT surface epitaxial layer conversion isolation & $N^+$-foundation process) corresponding to FIG. 9. According to these drawings, the manufacturing process (HEMT surface epitaxial layer conversion isolation & $N^+$-foundation process) corresponding to FIG. 9 will be explained.

In the state of FIG. 21, the conductive epitaxial compound semiconductor film 3e is converted into the semi-insulating surface layer 3f by ion implantation of fluorine, for example, (alternatively, helium, boron, hydrogen, or the like) from the device surface 1a side of the wafer 1 as shown in FIG. 30, while a resist film covers a region to become the transistor region TR, a region to become an active region under the pad 18p, and a region to become an active region under the independent metal contact portion 18c, in the surface of the wafer 1 on the device surface side 1a. Thereby, the surface of the transistor region TR which is covered by the resist film becomes the active region 18t. On the other side, the surface of the non-transistor region TN in a portion which is not covered by the resist film becomes the element isolation region 20 (semi-insulating surface layer 3f), and portions which are covered by the resist film become an active region under the independent metal contact portion 18c and an active region under the pad 18p. Here, as a preferable ion implantation condition of fluorine ($F^+$), it is possible to illustrate the following. That is, the first time dose amount is approximately $4.0\times10^{13}/cm^2$ (implantation energy is approximately 400 KeV, for example), and the second time dose amount is approximately $4.0\times10^{13}/cm^2$ (implantation energy is approximately 250 KeV, for example). Further, the third time dose amount is approximately $3.0\times10^{13}/cm^2$ (implantation energy is approximately 100 KeV, for example), and the fourth time dose amount is approximately $2.0\times10^{13}/cm^2$ (implantation energy is approximately 40 KeV, for example).

After that, the structure shown in FIG. 31 is obtained through a process similar to that of FIG. 24 to FIG. 28. The structure of FIG. 31 is the same as that of FIG. 9 except that the substrate portion is the wafer 1.

11. Explanation of a manufacturing process (HBT surface epitaxial layer conversion isolation process) corresponding to FIG. 10 (refer to mainly FIG. 32 to FIG. 37 and FIG. 38) The manufacturing process of this section is an example of various kinds of process realizing the structure of FIG. 10.

Figure 32:
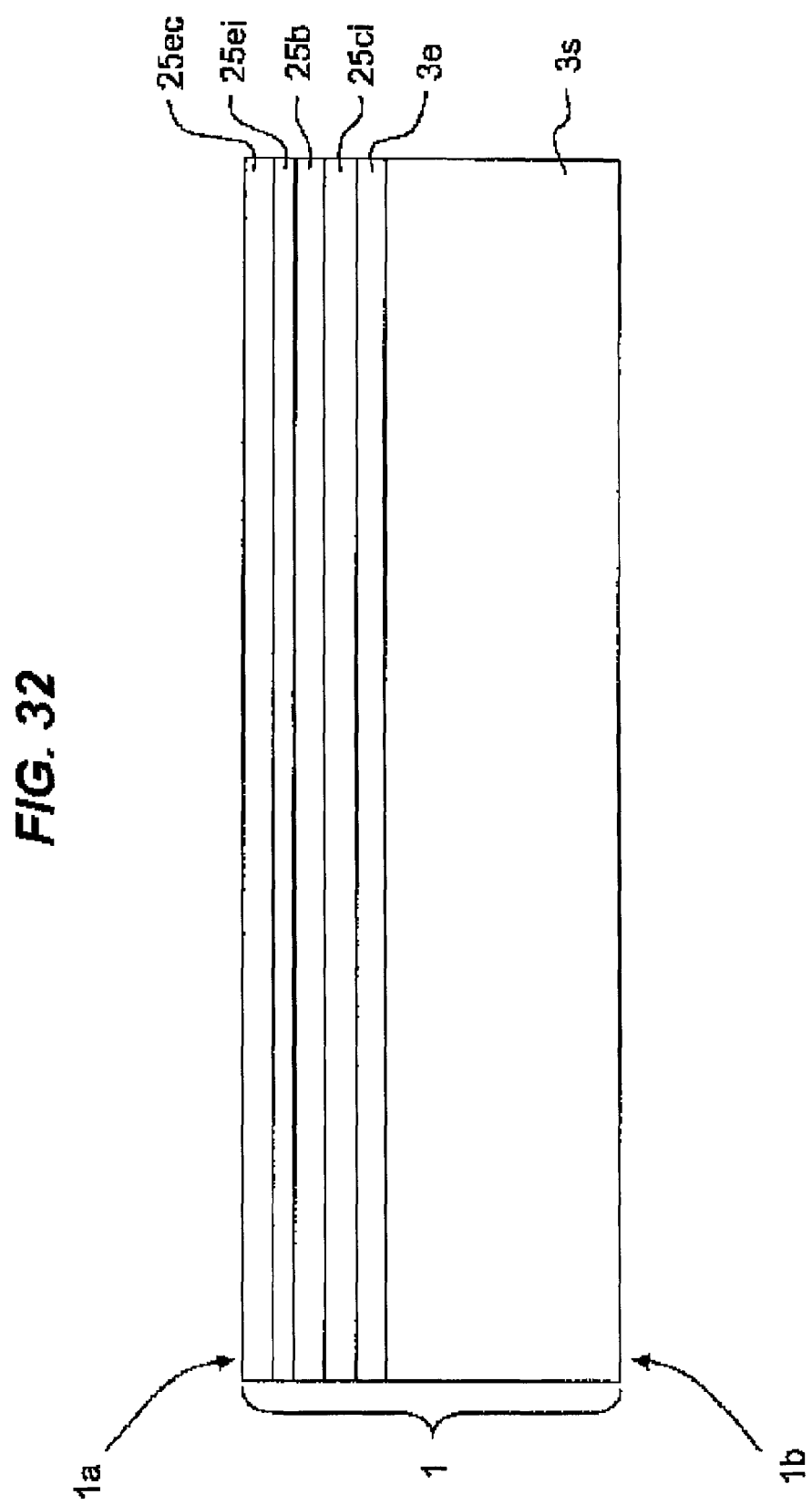
FIG. 32 is a device cross-sectional view in a manufacturing step (multilayered conductive epitaxial compound semiconductor film formation step) for explaining a major part of a manufacturing process (HBT surface epitaxial layer conversion isolation process) corresponding to FIG. 10.
Figure 33:
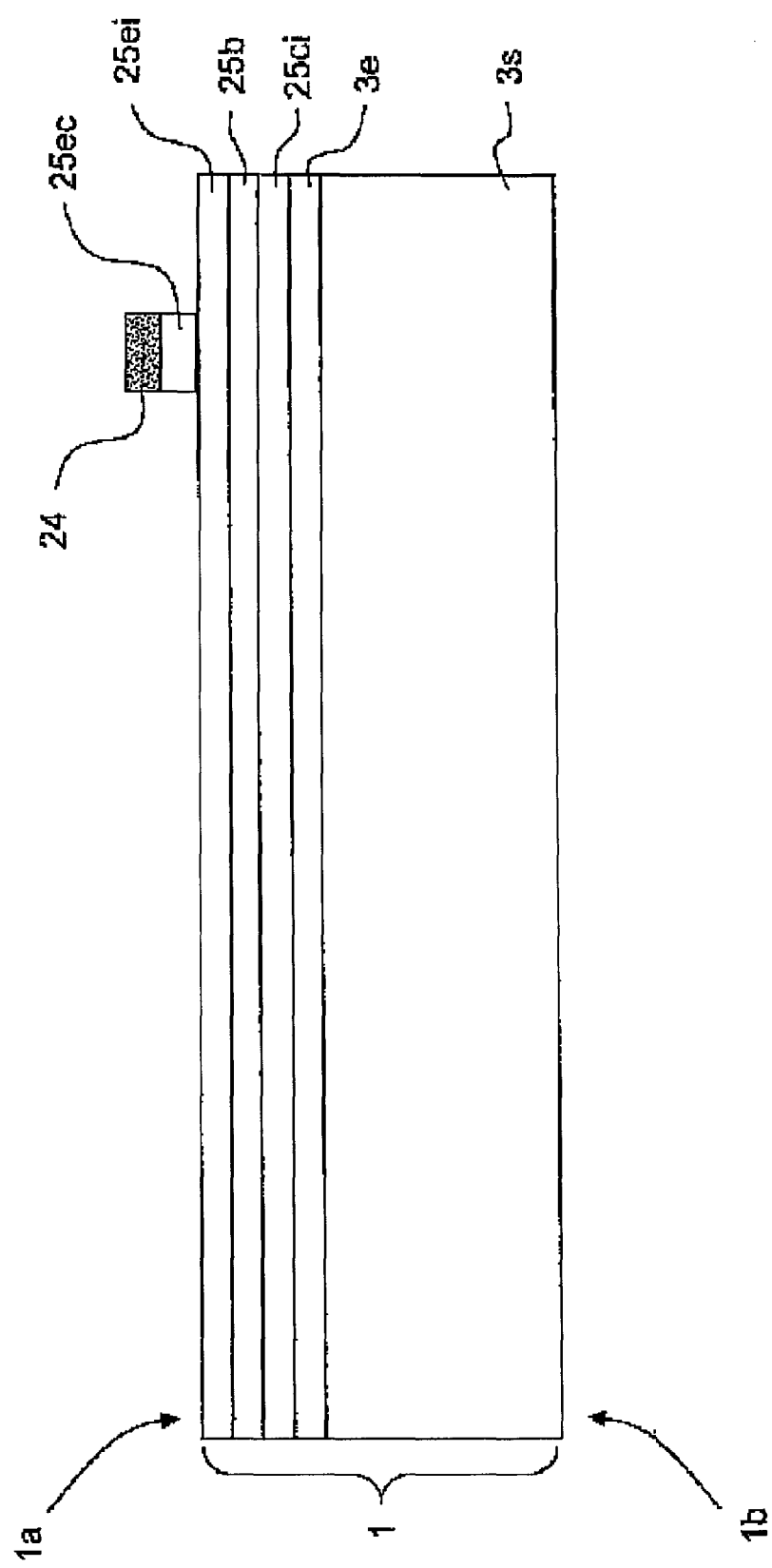
FIG. 33 is a device cross-sectional view in a manufacturing step (emitter region formation step) for explaining a major part of a manufacturing process (HBT surface epitaxial layer conversion isolation process) corresponding to FIG. 10.
Figure 34:
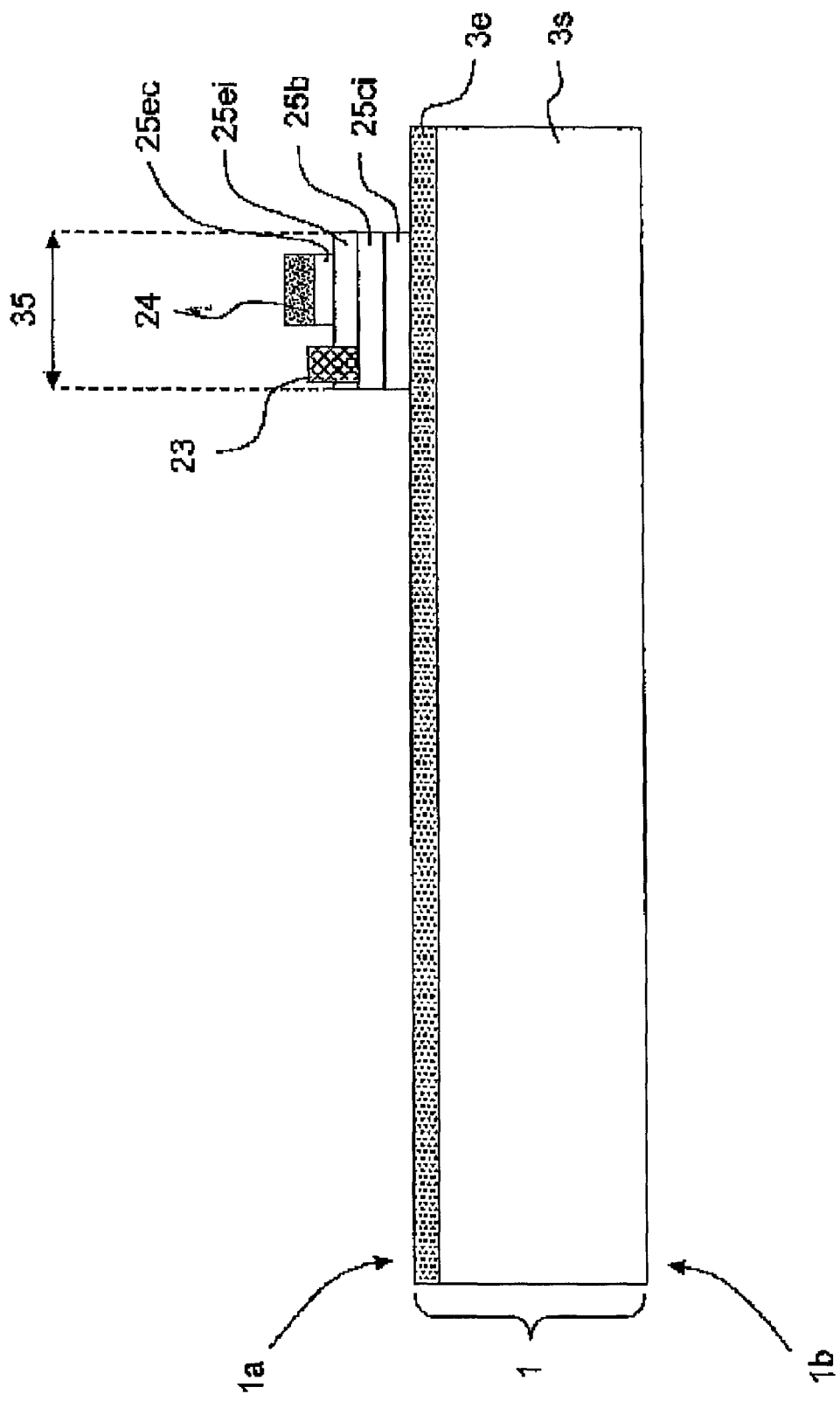
FIG. 34 is a device cross-sectional view in a manufacturing step (emitter and base electrodes and the like formation step) for explaining a major part of a manufacturing process (HBT surface epitaxial layer conversion isolation process) corresponding to FIG. 10.
Figure 35:
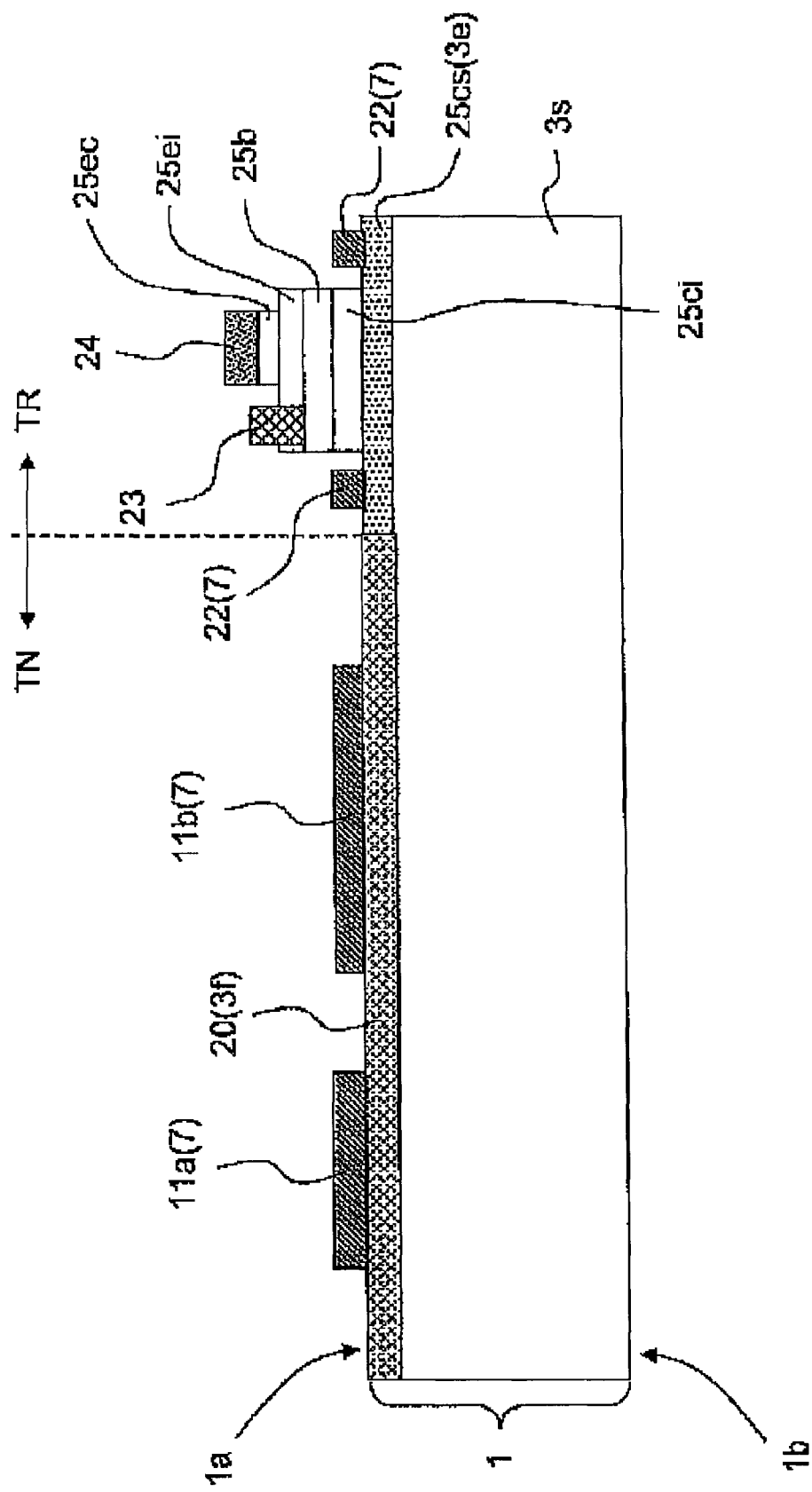
FIG. 35 is a device cross-sectional view in a manufacturing step (semi-insulating surface layer and the like formation step) for explaining a major part of a manufacturing process (HBT surface epitaxial layer conversion isolation process) corresponding to FIG. 10.
Figure 36:
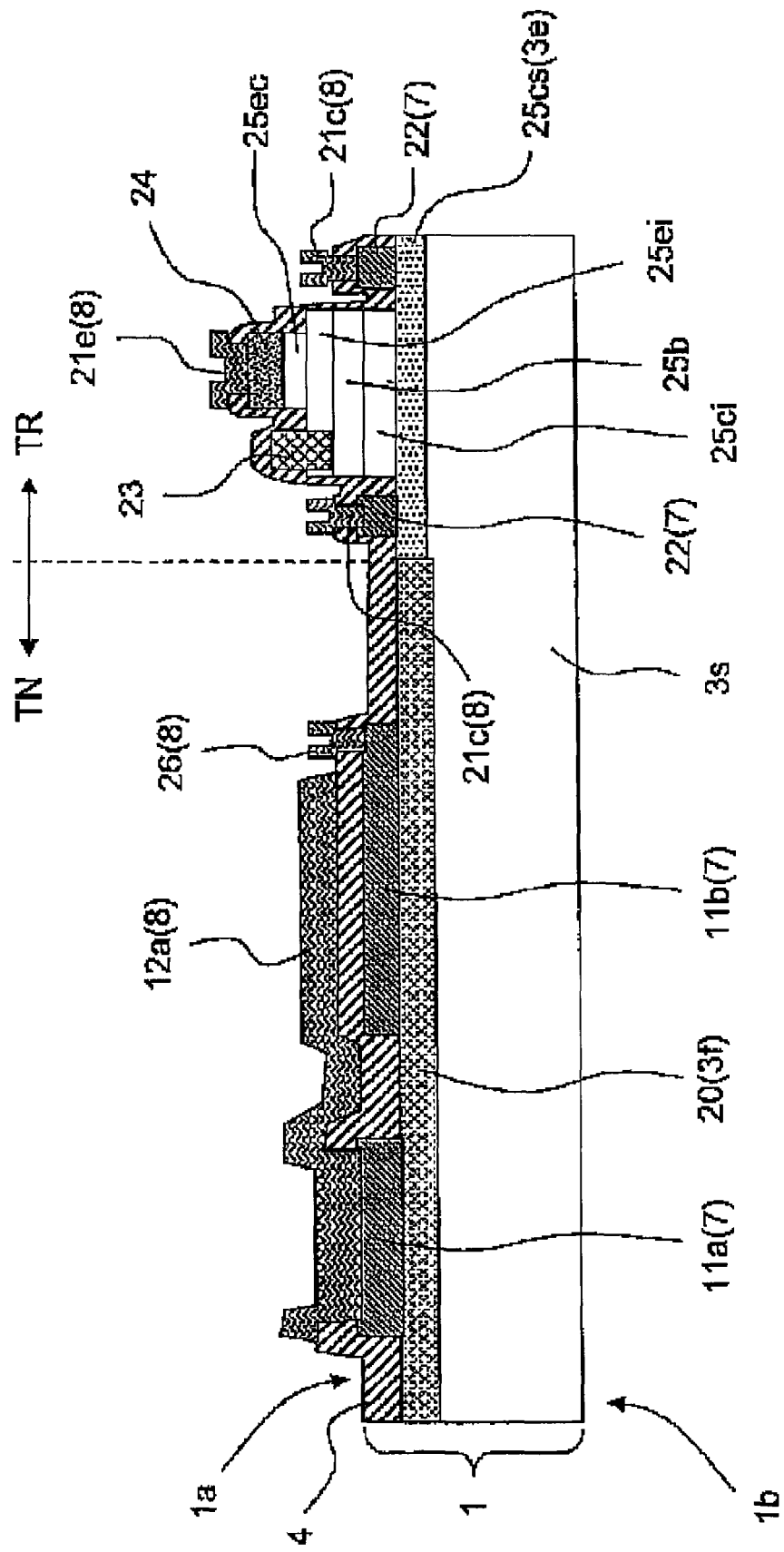
FIG. 36 is a device cross-sectional view in a manufacturing step (substrate surface insulating film, intermediate metal wiring film, and the like formation step) for explaining a major part of a manufacturing process (HBT surface epitaxial layer conversion isolation process) corresponding to FIG. 10.
Figure 37:
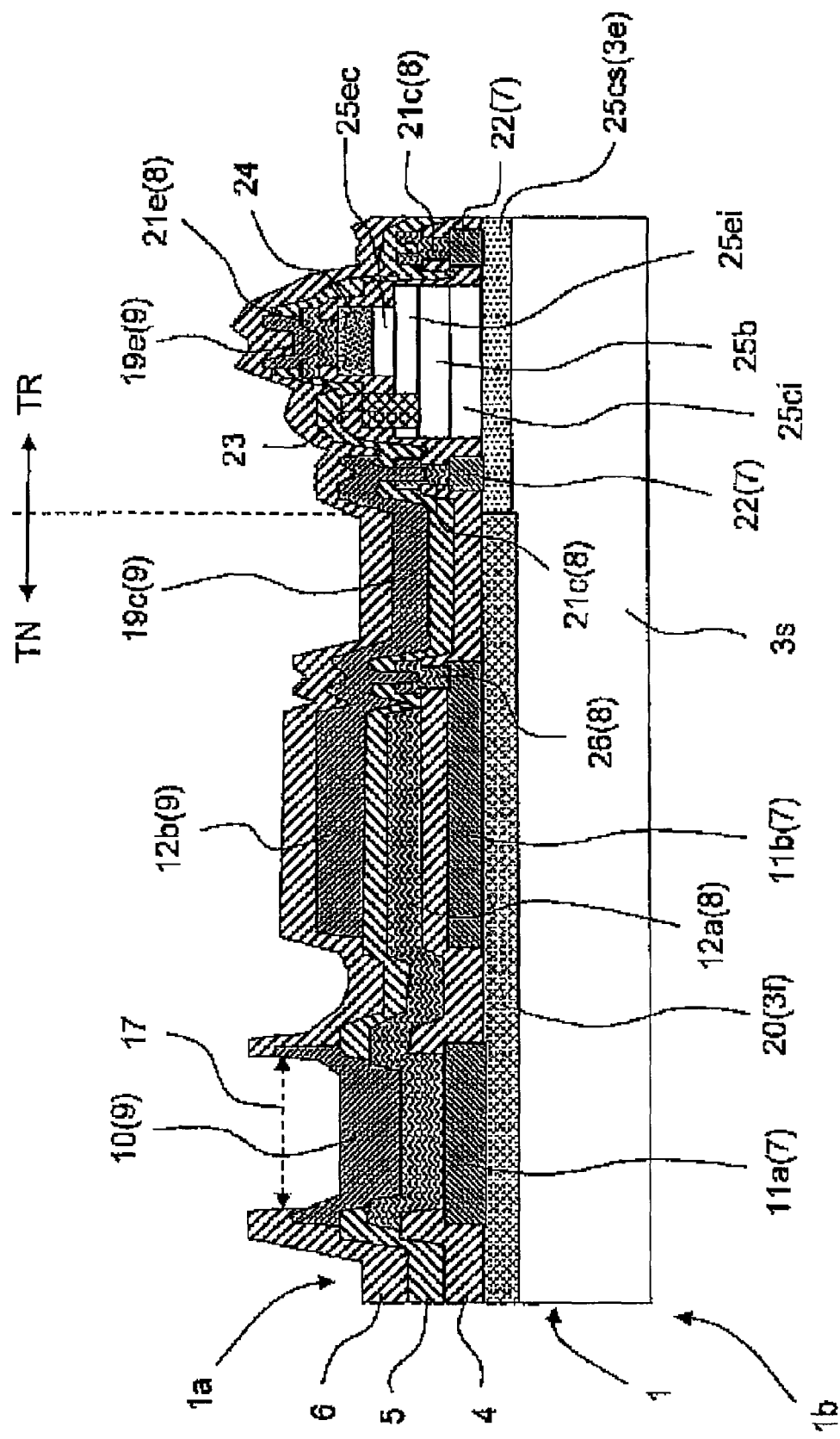
FIG. 37 is a device cross-sectional view in a manufacturing step (upper layer metal wiring film, final passivation insulating film, pad opening, and the like formation step) for explaining a major part of a manufacturing process (HBT surface epitaxial layer conversion isolation process) corresponding to FIG. 10.

FIG. 32 is a device cross-sectional view in a manufacturing step (multilayered conductive epitaxial compound semiconductor film formation step) for explaining a major part of the manufacturing process corresponding to FIG. 10 (HBT surface epitaxial layer conversion isolation process). FIG. 33 is a device cross-sectional view in a manufacturing step (emitter region formation step) for explaining a major part of the manufacturing process corresponding to FIG. 10 (HBT surface epitaxial layer conversion isolation process). FIG. 34 is a device cross-sectional view in a manufacturing step (emitter and base electrode and the like formation step) for explaining a major part of the manufacturing process corresponding to FIG. 10 (HBT surface epitaxial layer conversion isolation process). FIG. 35 is a device cross-sectional view in a manufacturing step (semi-insulating surface layer and the like formation step) for explaining a major part of the manufacturing process corresponding to FIG. 10 (HBT surface epitaxial layer conversion isolation process). FIG. 36 is a device cross-sectional view in a manufacturing step (substrate surface insulating film, intermediate metal wiring film, and the like formation step) for explaining a major part of the manufacturing process corresponding to FIG. 10 (HBT surface epitaxial layer conversion isolation process). FIG. 37 is a device cross-sectional view in a manufacturing step (upper layer metal wiring film, final passivation insulating film, pad opening, and the like formation step) for explaining a major part of the manufacturing process corresponding to FIG. 10 (HBT surface epitaxial layer conversion isolation process). According to these drawings, the manufacturing process corresponding to FIG. 10 (HBT surface epitaxial layer conversion isolation process) will be explained.

First, a semi-insulating GaAs wafer (diameter is approximately 100 millimeters, for example, and thickness is approximately 600 to 700 micrometers, for example) having a resistivity of approximately $1\times10^7$ Ωcm to $1\times10^8$ Ωcm, for example, is provided. Note that the wafer diameter may be approximately 50 millimeters, approximately 100 millimeters, approximately 150 millimeters, or larger if applicable.

As shown in FIG. 32, a film to become the $n^+$-type GaAs sub-collector layer 25cs (FIG. 10) and the semi-insulating surface layer 3f, for example, an $n^+$-GaAS film (GaAs-based epitaxial film), that is, the conductive epitaxial compound semiconductor film 3e (thickness is approximately 500 nm, for example) is epitaxially grown over approximately the whole device surface 1a, that is, the whole first major surface (opposite to the second major surface 1b) of the semi-insulating GaAs wafer is (1). The epitaxial growth is performed by an MO (Metal Organic) epitaxial growth method, an MB (Molecular Beam) epitaxial growth method, an AL (Atomic Layer) epitaxial growth method, or the like as needed (same for the following). Here, for the $n^+$-type GaAs sub-collector layer 25cs, that is, the conductive epitaxial compound semiconductor film 3e (first conductive epitaxial compound semiconductor film), additive impurity is silicon, for example, and a dose amount is approximately $2\times10^{18}/cm^3$, for example.

Next, the n-type GaAS collector layer 25ci (thickness is approximately 1,000 nm, for example) is epitaxially grown over approximately the whole surface of the $n^+$-type GaAs film (conductive epitaxial compound semiconductor film 3e). Here, for the n-type GaAs collector layer 25ci, additive impurity is silicon, for example, and a dose amount is approximately $2\times10^{16}/cm^3$, for example.

Next, the p-type GaAs base layer 25b (thickness is approximately 100 nm, for example) is epitaxially grown over approximately the whole surface of the n-type GaAs collector layer 25ci. Here, for the p-type GaAs base layer 25b, additive impurity is carbon, for example, and a dose amount is approximately $3\times10^{19}/cm^3$, for example.

Next, the n-type InGaP emitter layer 25ei (thickness is approximately 30 nm, for example, and In composition is approximately 49%, for example) is epitaxially grown over approximately the whole surface of the p-type GaAs base layer 25b. Here, for the n-type InGaP emitter layer 25ei, additive impurity is silicon, for example, and a dose amount is approximately $5\times10^{17}/cm^3$, for example.

Next, the $n^+$-InGaAs emitter cap layer 25ec (thickness is approximately 200 nm, for example) is epitaxially grown over approximately the whole surface of the n-type InGaP emitter layer 25ei. Here, for the $n^+$-InGaAs emitter cap layer 25ec, additive impurity is silicon, for example, and a dose amount is approximately $2\times10^{19}/cm^3$, for example.

Next, as shown in FIG. 33, a WSi film 24 (film to become the emitter electrode) having a thickness of approximately 300 nm, for example, is deposited by sputtering film deposition, for example, over approximately the whole surface of the $n^+$-type InGaAs emitter cap layer 25ec. Next, the emitter electrode 24 is formed by patterning of this WSi film 24 using normal lithography and dry etching (etching gas is $SF_6$ or the like, for example), and the like, for example.

Next, patterning of the $n^+$-type InGaAs emitter cap layer 25ec is performed by wet etching, for example, of the $n^+$-type InGaAS emitter cap layer 25ec using this emitter electrode 24 as a mask. As preferable etching solution of this wet etching, it is possible to illustrate a mixed solution of $H_3PO_4$, $H_2O_2$, $H_2O$, and the like (orthophosphoric acid hydrogen peroxide mixed solution), for example.

Next, as shown in FIG. 34, a base opening is formed at a portion where the base electrode is to be formed in the n-type InGaP emitter layer 25ei by normal lithography and dry etching (etching gas is $SF_6$, for example) and the like, for example. Next, the base electrode 23 is formed over this base opening by a lift-off method, for example. This lift-off process is performed in a procedure as follows, for example. That is, first, a platinum film is deposited in approximately 20 nm, for example, by sputtering film deposition, for example, in a state in which a resist film having an opening at a portion where the base electrode 23 is to be formed is formed over the surface of the wafer 1 on the device surface 1a side. Next, a titanium film is deposited thereover in approximately 50 nm, for example, by sputtering film deposition, for example. Next, a platinum film is deposited thereover in approximately 30 nm, for example, by sputtering film deposition, for example. Further, a gold film is deposited thereover in approximately 400 nm, for example. Successively, the resist film is removed together with the multilayer metal films thereover, and then the base electrode 23 remains. The above sputtering method may be replaced by an evaporation method.

Next, the n-type InGaP emitter layer 25ei, p-type GaAs base layer 25b, and the n-type GaAs collector layer 25ci are removed in a portion except a base mesa 35 by wet etching, for example, in a state in which a portion to become the base mesa 35 is covered by a resist film (while the wet etching is stopped normally at the surface of the $n^+$-type GaAs sub-collector layer 25cs, the wet etching may be stopped at a portion in the n-type GaAS collector layer 25ci, as needed). As a preferable etching solution for this wet etching, it is possible to illustrate a mixed solution of $H_3PO_4$, $H_2O_2$. $H_2O$, and the like (orthophosphoric acid hydrogen peroxide mixed solution), for example.

Next, as shown in FIG. 35, the conductive epitaxial compound semiconductor film 3e of the non-transistor region TN is converted into the semi-insulating surface layer 3f by means of performing ion implantation (fluorine ion, for example, and alternatively helium, boron, or the like) for the conductive epitaxial compound semiconductor film 3e in a portion except the $n^+$-type GaAs sub-collector layer 25cs in the transistor region TR, that is, for approximately the whole surface of the non-transistor region TN. Thereby, the element isolation region 20 is formed in the non-transistor region TN.

Next, the collector electrode 22, the first metal substrate contact portion 11a, and the second metal substrate contact portion 11b are formed to be configured with the lower-layer metal wiring film 7 by a lift-off method over the device surface 1a of the wafer 1 in the portion of the $n^+$-type GaAs sub-collector 25cs in the transistor region TR and in a predetermined portion of the element isolation region 20 in the non-transistor region TN. This processing by the lift-off method is performed as follows, for example. That is, multilayer metal films are deposited to configure the lower-layer metal wiring film 7 sequentially over the whole surface by an evaporation method, sputtering film deposition, or the like, in a state in which a resist film having an opening at a portion where an electrode or the like is to be formed is formed over the device surface 1a of the wafer 1. After that, the resist film is removed together with the multilayer metal films thereover, and then the multilayer metal films remain only in a portion corresponding to the resist opening. Here, this evaporation method or the sputtering film deposition process is performed in a procedure as follows, for example. That is, first, an AuGe film is deposited in approximately 50 nm, for example, by sputtering film deposition, for example. Next, a nickel film is deposited thereover in approximately 10 nm, for example, by sputtering film deposition, for example. Further, a gold film is deposited thereover in approximately 440 nm, for example. Successively, the resist film is removed together with the multilayer metal films thereover, and then collector electrode 22, the first metal substrate contact portion 11a, and the second metal substrate contact portion 11b remain over the surface of the wafer 1 on the device surface 1a side. Here, the second metal substrate contact portion 11b becomes also the second capacitor electrode 12b (lower electrode) of the MIM capacitor C7 (FIG. 10).

Next, as shown in FIG. 36, a silicon nitride film having a thickness of approximately 100 nm, for example, is deposited as the substrate surface insulating film 4 (first insulating film) over approximately the whole surface of the wafer 1 on the device surface 1a side by plasma CVD, for example.

Next, the first capacitor electrode 12a (intermediate electrode) and the in-capacitor link wiring 26 of the MIM capacitor C7 (FIG. 10), the collector link wiring 21c, and the emitter link wiring 21e are formed to be configured with the intermediate metal wiring film 8 over the silicon nitride film 4 by a lift-off method, for example. This lift-off process is performed in a procedure as follows, for example. That is, first, a titanium film is deposited in approximately 50 nm, for example, by sputtering film deposition, for example, in a state in which a resist film having an opening at a portion where the upper electrode 12a is to be formed is formed over the surface of the wafer 1 on the device surface 1a side. Next, a gold film is deposited thereover in approximately 900 nm, for example, by sputtering film deposition, for example. Further, a titanium film is deposited thereover in approximately 50 nm, for example. Successively, the resist film is removed together with the multilayer metal films thereover, and then the first capacitor electrode 12a (intermediate electrode), the in-capacitor link wiring 26, the collector link wiring 21c, and the emitter link wiring 21e remain.

Next, as shown in FIG. 37, a silicon nitride film is deposited to have a thickness of approximately 100 nm, for example, as the interlayer insulating film 5 by plasma CVD, for example, over approximately the whole surface of the wafer 1 on the device surface 1a side.

Next, a necessary via is formed in the interlayer insulating film 5 by normal lithography or the like. Next, the external pad 10, the second capacitor electrode 12b (upper electrode) of the MIM capacitor C7 (FIG. 10), the collector lead wiring 19c, the emitter lead wiring 19e, and the like are formed to be configured with the upper-layer metal wiring film 9, over the surface of the wafer 1 on the device surface 1a side by a lift-off method, for example. This lift-off process is performed in a procedure as follows, for example. That is, a resist film having openings at portions where the external pad 10, the second capacitor electrode 12b (upper electrode) of the MIM capacitor C7 (FIG. 10), the collector lead wiring 19c, the emitter lead wiring 19e, and the like are to be formed to be configured with the upper-layer metal wiring film 9, is formed over the surface of the wafer 1 on the device surface 1a side. In this state, first, a titanium film is deposited in approximately 50 nm, for example, by sputtering film deposition, for example. Next, a gold film is deposited thereover in approximately 1,900 nm, for example, by sputtering film deposition, for example. Further, a titanium film is deposited thereover in approximately 50 nm, for example. Successively, the resist film is removed together with the multilayer metal films thereover, and then the external pad 10, the second capacitor electrode 12b (upper electrode) of the MIM capacitor C7 (FIG. 10), the collector lead wiring 19c, the emitter lead wiring 19e, and the like remain to be configured with the upper-layer metal wiring film 9.

Next, a silicon nitride film having a thickness of approximately 300 nm, for example, is deposited as the final passivation insulating film 6 over approximately the whole surface of the wafer 1 on the device surface 1a side by plasma CVD, for example. Next, the pad opening 17 is formed in the final passivation insulating film 6 over the external pad 10 by normal lithography, for example.

After that, the wafer 1 is caused to have a thickness of approximately 100 micrometers, for example (preferable range is approximately 50 micrometers to 200 micrometers, for example) by back grinding processing.

Next, as shown in FIG. 38, a through via 31 is formed from the rear surface 1b of the wafer 1, and the rear surface electrode 32 is formed in this through via 31 and over approximately the whole rear surface 1b of the wafer 1 by gold plating, for example.

Next, the wafer 1 is divided into individual chips 2 by dicing or the like, and packaging is performed as needed to complete a final device.

12. Summary While, hereinabove, the invention achieved by the inventors has been explained specifically according to the embodiment, the present invention is not limited thereto and obviously can be changed variously within a range without departing from the gist thereof.

While, in the above embodiment, for example, the semiconductor integrated circuit device formed over the GaAs-based semi-insulating compound semiconductor substrate is specifically explained as an example, the present invention is not limited thereto and obviously can be applied also to a semiconductor integrated circuit device formed over an InP-based semi-insulating compound semiconductor substrate.

Further, while in the above embodiment, the P-HEMT (Pseudomorphic High-Electron-Mobility Transistor) is mainly explained as an example for the HEMT (High-Electron-mobility Transistor) or MODFET (Modulation-Doped Field Effect Transistor), the present invention is not limited thereto and may be applied also to a typical FET such as a MOSFET and a MESFET. Further, obviously the present invention can be applied also to an M-HEMT (Metamorphic High-Electron-Mobility Transistor), a DH-HEMT (Double-Heterojunction High-Electron-Mobility Transistor), an I-HEMT (Inverted High-Electron-Mobility Transistor), an SL-HEMT (Superlattice High-Electron-Mobility Transistor), and a semiconductor integrated circuit device including a HEMT having these composite structures or a HEMT having a more basic structure. Note that, while, in the above embodiment, the N-channel type device is explained specifically as an example of the HEMT, the present invention is not limited thereto and obviously can be applied also to a semiconductor integrated circuit device using a P-channel type device. Similarly, while the NPN-type HBT is explained specifically as an example of the HBT, the present invention is not limited thereto and obviously can be applied also to a semiconductor integrated circuit device using a PNP-type HBT or an HBT including both of the NPN-type and the PNP type. Further, the present invention is not limited to the hetero-junction HBT and can be applied also to a typical bipolar transistor having a homo-junction.

Further, while an example is explained for the case of forming the conductive semiconductor layer film of the transistor or the like by the epitaxial growth, the present invention can be applied also to a conductive semiconductor film (that is, conductive compound semiconductor layer) except the epitaxial growth film. For example, the present invention can be applied also to an FET and the like having a channel configured with a conductive semiconductor layer (that is, conductive compound semiconductor layer) which is activated by ion-implanting Si into GaAs.

Further, while, in the above embodiment, the MIM capacitor is explained specifically as an example of the capacitor, the present invention is not limited thereto and obviously can be applied also to a semiconductor integrated circuit device using a capacitor of a junction-type or a composite capacitor of this junction-type and the MIM type.

Further, while, in the above embodiment, the example of coupling one terminal of the MIM capacitor to the collector or base of the HBT is mainly explained specifically for the circuit using the HBT, the present invention is not limited thereto and obviously one terminal of the MIM capacitor may be coupled to the emitter of the HBT. Similarly, while the example of coupling one terminal of the MIM capacitor to the source or drain of the HEMT is mainly explained specifically for the circuit using the HEMT, the present invention is not limited thereto and obviously one terminal of the MIM capacitor may be coupled to the gate of the HEMT.

What is claimed is:

1. A semiconductor integrated circuit device, comprising:
   (a) a semi-insulating compound semiconductor substrate having a first major surface;
   (b) a transistor region and a non-transistor region disposed over the first major surface of the semi-insulating compound semiconductor substrate;
   (c) a first conductive epitaxial compound semiconductor film disposed over and on the first major surface of the semi-insulating compound semiconductor substrate only within the transistor region;
   (d) a first insulating film disposed over the semi-insulating compound semiconductor substrate within the non-transistor region;
   (e) an external electrode pad disposed in an upper layer of the first insulating film within the non-transistor region;
   (f) a first metal substrate contact portion electrically coupled to the external electrode pad within the non-transistor region;
   (g) a Metal-Insulator-Metal (MIM) capacitor disposed within the non-transistor region and having a first capacitor electrode and a second capacitor electrode disposed within the non-transistor region; and
   (h) a semi-insulating surface layer, having a different material composition than the first conductive epitaxial compound semiconductor film, disposed only within the non-transistor region over and on the first major surface of the semi-insulating compound semiconductor substrate in a layer lower than the first insulating film, and having a resistivity lower than the semi-insulating compound semiconductor substrate,
   wherein the first capacitor electrode is electrically coupled to the external electrode pad and the first metal substrate contact portion within the non-transistor region,
   the first insulating film is disposed between the second capacitor electrode and the semi-insulating surface layer,
   the second capacitor electrode is electrically coupled to a second metal substrate contact portion within the non-transistor region,
   the first metal substrate contact portion and the second metal substrate contact portion are disposed in a layer below the second capacitor electrode within the non-transistor region, and
   the first metal substrate contact portion and the second metal substrate contact portion are both disposed directly on the semi-insulating surface layer and electrically coupled to the semi-insulating compound semiconductor substrate via the semi-insulating surface layer.

2. The semiconductor integrated circuit device according to claim 1,
   wherein the first metal substrate contact portion is provided directly under the external electrode pad.

3. The semiconductor integrated circuit device according to claim 1,
   wherein the second capacitor electrode is a lower electrode of the MIM capacitor.

4. The semiconductor integrated circuit device according to claim 1,
   wherein the second capacitor electrode is electrically coupled to a source or drain terminal of a high electron mobility transistor (HEMT).

5. The semiconductor integrated circuit device according to claim 1, wherein each of the semi-insulating compound semiconductor substrate and the semi-insulating surface layer mainly includes a GaAs-based member.

6. The semiconductor integrated circuit device according to claim 1, further comprising:
a high electron mobility transistor (HEMT) disposed within the transistor region and electrically coupled to the MIM capacitor.

7. The semiconductor integrated circuit device according to claim 1, wherein the first metal substrate contact portion and the second metal substrate contact portion are disposed in a same layer as the first insulating film.

8. The semiconductor integrated circuit device according to claim 1, wherein the MIM capacitor is disposed over the first insulating film.

9. The semiconductor integrated circuit device according to claim 1, wherein the first capacitor electrode is electrically coupled to the external electrode pad, the first metal substrate contact portion and the semi-insulating compound semiconductor substrate within the non-transistor region.

10. The semiconductor integrated circuit device according to claim 1, wherein the semi-insulating surface layer is only within the non-transistor region over the first major surface of the semi-insulating compound semiconductor substrate in a layer lower than the first insulating film and is laterally in contact with the first conductive epitaxial compound semiconductor film.

11. The semiconductor integrated circuit device according to claim 1, wherein the composition of the semi-insulating surface layer includes implanted fluorine, helium, boron, or hydrogen ions.

* * * * *